United States Patent
Tinnakornsrisuphap et al.

(10) Patent No.: US 8,699,401 B2
(45) Date of Patent: Apr. 15, 2014

(54) HIGH RATE PACKET DATA (HRPD) IDLE STATE HANDOUT FROM FEMTO ACCESS POINT TO MACRO ACCESS NETWORK

(75) Inventors: Peerapol Tinnakornsrisuphap, San Diego, CA (US); Jen Mei Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 559 days.

(21) Appl. No.: 12/703,595

(22) Filed: Feb. 10, 2010

(65) Prior Publication Data

US 2010/0208703 A1 Aug. 19, 2010

Related U.S. Application Data

(60) Provisional application No. 61/152,589, filed on Feb. 13, 2009.

(51) Int. Cl.
*H04B 7/14* (2006.01)
*H04W 4/00* (2009.01)
*H04J 3/24* (2006.01)
*H04L 12/56* (2006.01)

(52) U.S. Cl.
USPC ........... 370/315; 370/331; 370/349; 370/400; 455/432.1

(58) Field of Classification Search
USPC ................ 370/310–350, 400–411, 463–475; 455/431–466; 709/223–225, 230–235, 709/238–245
See application file for complete search history.

(56) References Cited

U.S. PATENT DOCUMENTS

| | | | |
|---|---|---|---|
| 6,760,746 B1 | 7/2004 | Schneider | |
| 6,938,080 B1 * | 8/2005 | Kahveci et al. | 709/223 |
| 6,983,319 B1 * | 1/2006 | Lu et al. | 709/223 |
| 7,027,400 B2 * | 4/2006 | O'Neill | 370/235 |
| 7,130,626 B2 | 10/2006 | Bender et al. | |
| 7,212,527 B2 * | 5/2007 | Shah et al | 370/389 |
| 7,317,709 B2 * | 1/2008 | Jang et al. | 370/331 |

(Continued)

FOREIGN PATENT DOCUMENTS

| | | |
|---|---|---|
| CN | 101223760 A | 7/2008 |
| CN | 101467399 A | 6/2009 |

(Continued)

OTHER PUBLICATIONS

International Search Report and Written Opinion—PCT/US2010/024170—International Search Authority, European Patent Office,Jan. 11, 2011.
Partial International Search Report—PCT/US2010/024170—International Search Authority, European Patent Office, Oct. 3, 2010.
Peerapol Tinnakornsrisuphap, David Ott: "A13 Proxy for supporting HRPD Handout from femto AP to macro AN", 3GPP2 TSG-A Feb. 18, 2009, pp. 1-10, XP002614618, Retrieved from the Internet: URL:ftp://ftp.3gpp2.org/TSGA/Worki ng/2009/ 0216-Shanghai/ TSG-A.2/ [retrieved on Dec. 16, 2010].

(Continued)

*Primary Examiner* — Tri H Phan

(57) ABSTRACT

Systems and methods for identifying an address of a femto node during handoff of an access terminal from a femto node to a macro node. In one embodiment, the femto node assigns a unique identifier to the access terminal. The access terminal passes the unique identifier to the macro node. The macro node partitions the unique identifier to determine the address of the femto node. In another embodiment, the femto node registers its address with a domain name system. The macro node queries the domain name system to obtain the address of the femto node. In another embodiment, the macro node sends the unique identifier to a proxy. The proxy partitions the unique identifier to determine the address of the femto node.

56 Claims, 30 Drawing Sheets

(56) References Cited

U.S. PATENT DOCUMENTS

| | | | |
|---|---|---|---|
| 7,940,706 | B2 | 5/2011 | Elko et al. |
| 8,000,241 | B2* | 8/2011 | O'Neill .................. 370/235 |
| 8,023,410 | B2* | 9/2011 | O'Neill .................. 370/235 |
| 8,098,597 | B2* | 1/2012 | Semper .................. 370/255 |
| 8,331,384 | B2* | 12/2012 | Ghai .................. 370/401 |
| 2002/0069283 | A1* | 6/2002 | Lee .................. 709/227 |
| 2003/0135626 | A1 | 7/2003 | Ray et al. |
| 2004/0071126 | A1 | 4/2004 | Ramos-Escano et al. |
| 2006/0184680 | A1 | 8/2006 | Ruutu et al. |
| 2007/0097983 | A1 | 5/2007 | Nylander et al. |
| 2007/0153769 | A1 | 7/2007 | Comstock et al. |
| 2008/0037500 | A1 | 2/2008 | Andrus et al. |
| 2008/0059607 | A1 | 3/2008 | Schneider |
| 2008/0267153 | A1 | 10/2008 | Mukherjee et al. |
| 2009/0172169 | A1 | 7/2009 | Ramaswamy et al. |
| 2009/0176489 | A1 | 7/2009 | Ulupinar et al. |
| 2010/0111035 | A1* | 5/2010 | Eskicioglu et al. .......... 370/331 |
| 2010/0124228 | A1 | 5/2010 | Tinnakornsrisuphap et al. |
| 2010/0130209 | A1* | 5/2010 | Florkey et al. ............. 455/437 |
| 2010/0208701 | A1* | 8/2010 | Tinnakornsrisuphap et al. .................. 370/331 |
| 2010/0208702 | A1* | 8/2010 | Tinnakornsrisuphap et al. .................. 370/331 |
| 2010/0260174 | A1* | 10/2010 | Preiss et al. ............. 370/389 |

FOREIGN PATENT DOCUMENTS

| | | |
|---|---|---|
| EP | 1718033 | 11/2006 |
| EP | 1993266 | 11/2008 |
| GB | 2444756 A | 6/2008 |
| TW | 200723814 A | 6/2007 |
| TW | 200803556 A | 1/2008 |
| TW | 200820687 A | 5/2008 |
| TW | 200849896 A | 12/2008 |
| WO | WO2007024521 | 3/2007 |
| WO | WO2007025158 | 3/2007 |
| WO | WO2007148252 | 12/2007 |
| WO | WO-2008131581 A1 | 11/2008 |

OTHER PUBLICATIONS

Peerapol Tinnakornsrisuphap, David Ott: "Femto IOS HRPD Idle Hand-out Call Flow", 3GPP2 TSG-A Feb. 18, 2009, pp. 1-5, XP002614619, Retrieved from the Internet: URL:ftp://ftp.3gpp2.org/TSGA/worki ng/2009/ 0216-Shanghai/TSG-A.2/ [retrieved on Dec. 16, 2010].

Qualcomm Europe, Nortel: "Discovery of neighbor eNB IP address" 3GPP Draft; R3-082456, 3rd Generation Partnership Project (3GPP), Mobile Competence Centre ; 650, Route Des Lucioles ; F-06921 Sophia-Antipolis Cedex ; France vol. RAN WGS, Sep. 23, 2008, pp. 1-3, XP002594476 Retrieved from the Internet: URL:http://www.3gpp.org/ftp/Specs/html-i nf o/TDocExMtg-R3-61b-27164. htm [retrieved on Jul. 29, 2010] p. 1-3.

Qualcomm Europe: "Discovery of neighbour cells in E-UTRAN" 3GPP Draft; R2-062303, SRD Generation Partnership Project (3GPP), Mobile Competence Centre ; 650, Route Des Lucioles ; F-06921 Sophia-Antipolis Cedex ; France, vol. RAN WG2, no. Tallinn; Aug. 23, 2006, XP050131905 [retrieved on Aug. 23, 2006] p. 1-2.

Rezaiifar R., et al., "Macro-Mobility Management in EVDO," IEEE Communications Magazine, 2006, vol. 44 (2), 103-110.

TSG CT4: "3GPP TS 29.303 V8.0.0—3rcl Generation Partnership Project; Technical Specification Group Core Network and Terminals; Domain Name System Procedures; Stage 3 (Release 8)" Technical Specification, 3rd Generation Partnership Project (3GPP), 650, Route Des Lucioles ; F-06921 Sophia-Antipolis ; FRANCEno. V8.0. 0, Dec. 18, 2008, pp. 1-25, XP002594475 Retrieved from the Internet: URL:http://www.3gpp.org/ftp/Specs/html-1nfo/29303.htm [retrieved on Jul. 29, 2010].

European Search Report—EP12180051—Search Authority—The Munich—Sep. 18, 2012.

QUALCOMM: "UATI-IP address mapping", 3GPP2 A20-20081027-009r0, Oct. 28, 2008.

Taiwan Search Report—TW099104842—TIPO—May 6, 2013.

* cited by examiner

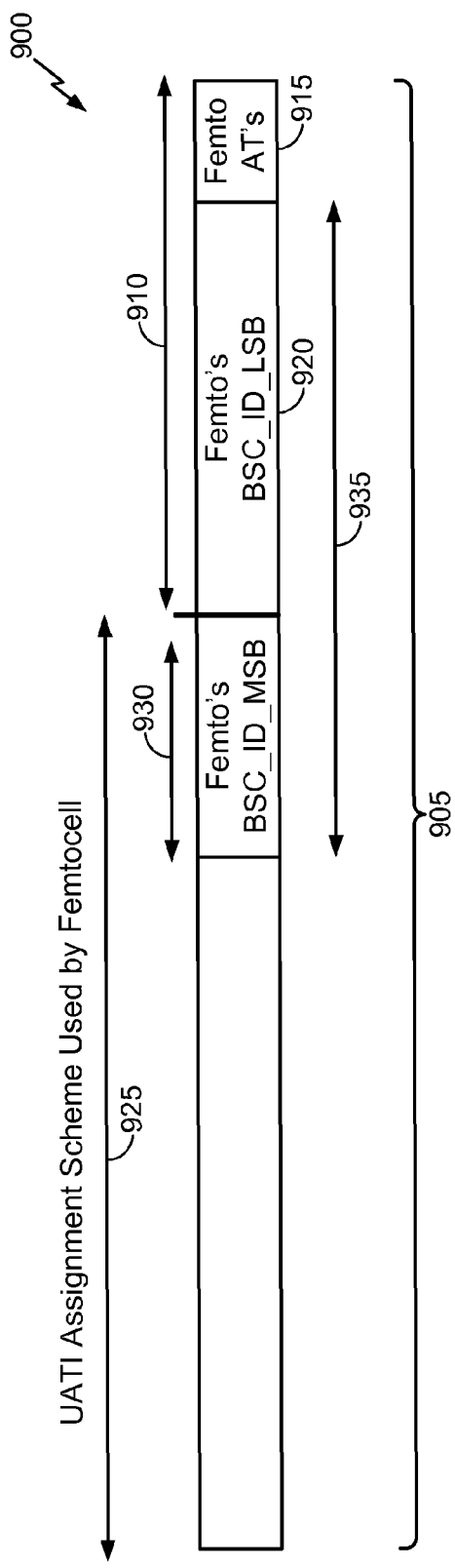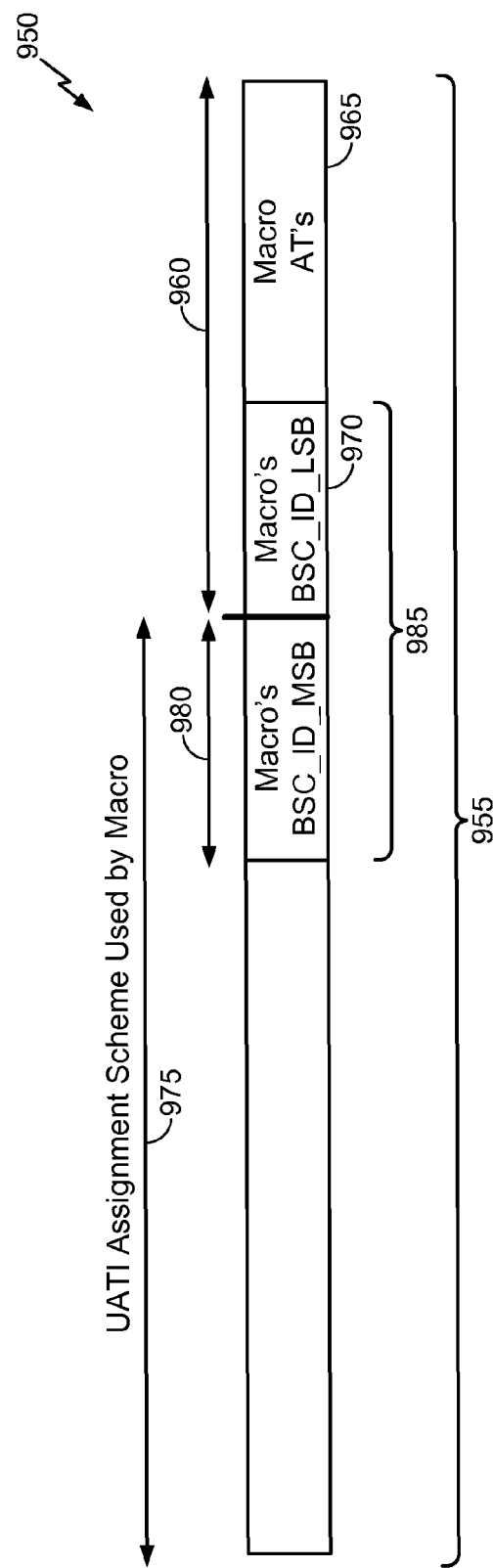
FIG. 9A
FIG. 9B

HIGH RATE PACKET DATA (HRPD) IDLE STATE HANDOUT FROM FEMTO ACCESS POINT TO MACRO ACCESS NETWORK

CLAIM OF PRIORITY UNDER 35 U.S.C. §119

The present application for patent claims priority to Provisional Application No. 61/152,589 entitled "High Rate Packet Data (HRPD) Idle State Handout From Femto to Macro Access Network" filed Feb. 13, 2009, and assigned to the assignee hereof and hereby expressly incorporated by reference herein.

REFERENCE TO CO-PENDING APPLICATIONS FOR PATENT

The present application for patent is related to the following co-pending U.S. patent applications:

"High Rate Packet Data (HRPD) Idle State Handout From Femto Access Point to Macro Access Network" having Ser. No. 12/703,585, filed concurrently herewith, assigned to the assignee hereof, and expressly incorporated by reference herein.

"High Rate Packet Data (HRPD) Idle State Handout From Femto Access Point to Macro Access Network" having Ser. No. 12/703,593, filed concurrently herewith, assigned to the assignee hereof, and expressly incorporated by reference herein.

I. BACKGROUND

A. Field

The present application relates generally to wireless communication, and more specifically to systems and methods to enable handoffs of idle data sessions from femto nodes to macro nodes.

B. Background

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP Long Term Evolution (LTE) systems, and orthogonal frequency division multiple access (OFDMA) systems.

Generally, a wireless multiple-access communication system can simultaneously support communication for multiple wireless terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-in-single-out, multiple-in-signal-out or a multiple-in-multiple-out (MIMO) system.

In addition to mobile phone networks currently in place, a new class of small base stations has emerged, which may be installed in a user's home and provide indoor wireless coverage to mobile units using existing broadband Internet connections. Such personal miniature base stations are generally known as access point base stations, or, alternatively, Home Node B (HNB) or femto cells. Typically, such miniature base stations are connected to the Internet and the mobile operator's network via DSL router or cable modem.

II. SUMMARY

In an embodiment, a method of relaying session information is provided. The method comprises receiving session information. The method further comprises obtaining an address of a source based upon the session information and a type of a source access node. The method further comprises transmitting the session information to the obtained address.

In another embodiment, a method of identifying an address is presented. The method comprises receiving a first and second identifier from an access terminal. The method further comprises determining a proxy address based upon one or more of the first and second identifier. The method further comprises transmitting an information message to the proxy address. The method further comprises receiving a response from a source access node. The method further comprises obtaining an address of the source access node based upon the response.

In another embodiment, an apparatus capable of relaying session information is provided. The apparatus comprises a processor configured to receive session information. The processor is further configured to obtain an address of a source based upon the session information and a type of a source access node. The processor is further configured to transmit the session information to the obtained address.

In another embodiment, an apparatus capable of identifying an address is provided. The apparatus comprises a processor configured to receive a first and second identifier from an access terminal. The processor is further configured to determine a proxy address based upon one or more of the first and second identifier. The processor is further configured to transmit an information message to the proxy address. The processor is further configured to receive a response from a source access node. The processor is further configured to obtain an address of the source access node based upon the response.

In another embodiment, an apparatus capable of relaying session information is provided. The apparatus comprises means for receiving session information. The apparatus further comprises means for obtaining an address of a source based upon the session information and a type of a source access node. The apparatus further comprises means for transmitting the session information to the obtained address.

In another embodiment, an apparatus capable of identifying an address is provided. The apparatus comprises means for receiving a first and second identifier from an access terminal. The apparatus further comprises means for determining a proxy address based upon one or more of the first and second identifier. The apparatus further comprises means for transmitting an information message to the proxy address. The apparatus further comprises means for receiving a response from a source access node. The apparatus further comprises means for obtaining an address of the source access node based upon the response.

In another embodiment, a computer program product is provided. The computer product comprises a computer readable medium. The computer readable medium comprises code capable of causing at least one computer to receive session information. The computer readable medium further comprises code capable of causing at least one computer to obtain an address of a source based upon the session information and a type of a source access node. The computer readable medium further comprises code capable of causing at least one computer to transmit the session information to the obtained address.

In another embodiment, a computer program product is provided. The computer program product comprises a computer readable medium. The computer readable medium comprises code capable of causing at least one computer to receive a first and second identifier from an access terminal. The computer readable medium further comprises code capable of causing at least one computer to determine a proxy address based upon one or more of the first and second identifier. The computer readable medium further comprises code capable of causing at least one computer to transmit an information message to the proxy address. The computer readable medium further comprises code capable of causing at least one computer to receive a response from a source access node. The computer readable medium further comprises code capable of causing at least one computer to obtain an address of the source access node based upon the response.

III. BRIEF DESCRIPTION OF THE DRAWINGS

FIG. 9A illustrates an exemplary identifier assignment scheme used by a femto node shown in FIG. 8.

FIG. 9B illustrates an exemplary identifier assignment scheme used by a macro node shown in FIG. 8.

IV. DETAILED DESCRIPTION

Figure 1:
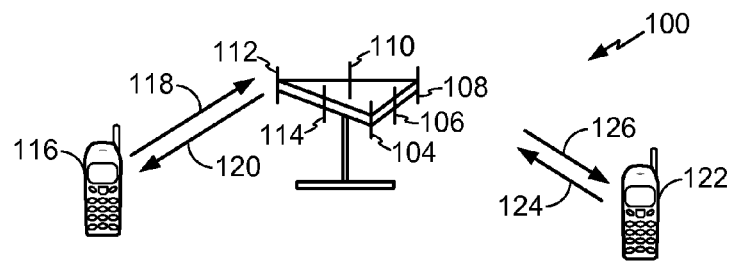
FIG. 1 illustrates an exemplary multiple access wireless communication system.

The word "exemplary" is used herein to mean "serving as an example, instance, or illustration." Any embodiment described herein as "exemplary" is not necessarily to be construed as preferred or advantageous over other embodiments. The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named "3rd Generation Partnership Project" (3GPP). cdma2000 is described in documents from an organization named "3rd Generation Partnership Project 2" (3GPP2). These various radio technologies and standards are known in the art. For clarity, certain aspects of the techniques are described below for LTE, and LTE terminology is used in much of the description below.

Single carrier frequency division multiple access (SC-FDMA), which utilizes single carrier modulation and frequency domain equalization is a technique. SC-FDMA has similar performance and essentially the same overall complexity as those of OFDMA system. SC-FDMA signal has lower peak-to-average power ratio (PAPR) because of its inherent single carrier structure. SC-FDMA has drawn great attention, especially in the uplink communications where lower PAPR greatly benefits the mobile terminal in terms of transmit power efficiency. It is currently a working assumption for uplink multiple access scheme in 3GPP Long Term Evolution (LTE), or Evolved UTRA.

In some aspects the teachings herein may be employed in a network that includes macro scale coverage (e.g., a large area cellular network such as a 3G network, typically referred to as a macro cell network) and smaller scale coverage (e.g., a residence-based or building-based network environment). As an access terminal (AT) moves through such a network, the access terminal may be served in certain locations by access nodes (ANs) that provide macro coverage while the access terminal may be served at other locations by access nodes that provide smaller scale coverage. In some aspects, the smaller coverage nodes may be used to provide incremental capacity growth, in-building coverage, and different services (e.g., for a more robust user experience). In the discussion herein, a node that provides coverage over a relatively large area may be referred to as a macro node. A node that provides coverage over a relatively small area (e.g., a residence) may be referred to as a femto node. A node that provides coverage over an area that is smaller than a macro area and larger than a femto area may be referred to as a pico node (e.g., providing coverage within a commercial building).

A cell associated with a macro node, a femto node, or a pico node may be referred to as a macro cell, a femto cell, or a pico cell, respectively. In some implementations, each cell may be further associated with (e.g., divided into) one or more sectors.

In various applications, other terminology may be used to reference a macro node, a femto node, or a pico node. For example, a macro node may be configured or referred to as an access node, macro AN, macro, base station, access point (AP), eNodeB (eNB), macro cell, and so on. Also, a femto node may be configured or referred to as a femto AN, femto, Home NodeB (HNB), Home eNodeB (HeNB), access point (AP), femto access point (FAP), base transceiver station (BTS), femto cell, and so on. An access terminal may also be called user equipment (UE), a wireless communication device, terminal, or some other terminology.

Referring to FIG. 1, a multiple access wireless communication system according to one embodiment is illustrated. An access point 100 includes multiple antenna groups, one antenna group including antennas 104 and 106, another antenna group including antennas 108 and 110, and an additional antenna group including antennas 112 and 114. In FIG. 1, only two antennas are shown for each antenna group, however, more or fewer antennas may be utilized for each antenna group. Access terminal 116 is in communication with antennas 112 and 114, where antennas 112 and 114 transmit information to access terminal 116 over forward link 120 and receive information from access terminal 116 over reverse link 118. Access terminal 122 is in communication with antennas 106 and 108, where antennas 106 and 108 transmit information to access terminal 122 over forward link 126 and receive information from access terminal 122 over reverse link 124. In a frequency division duplex (FDD) system, communication links 118, 120, 124 and 126 may use different frequency for communication. For example, forward link 120 may use a different frequency then that used by reverse link 118.

Each group of antennas and/or the area in which they are designed to communicate is often referred to as a sector of the access point. In the illustrated embodiment, antenna groups each are designed to communicate to access terminals in a sector, of the areas covered by access point 100.

In communication over forward links 120 and 126, the transmitting antennas of access point 100 utilize beamforming in order to improve the signal-to-noise ratio of forward links for the different access terminals 116 and 124. Also, an access point using beamforming to transmit to access terminals scattered randomly through its coverage causes less interference to access terminals in neighboring cells than an access point transmitting through a single antenna to all its access terminals.

Figure 2:
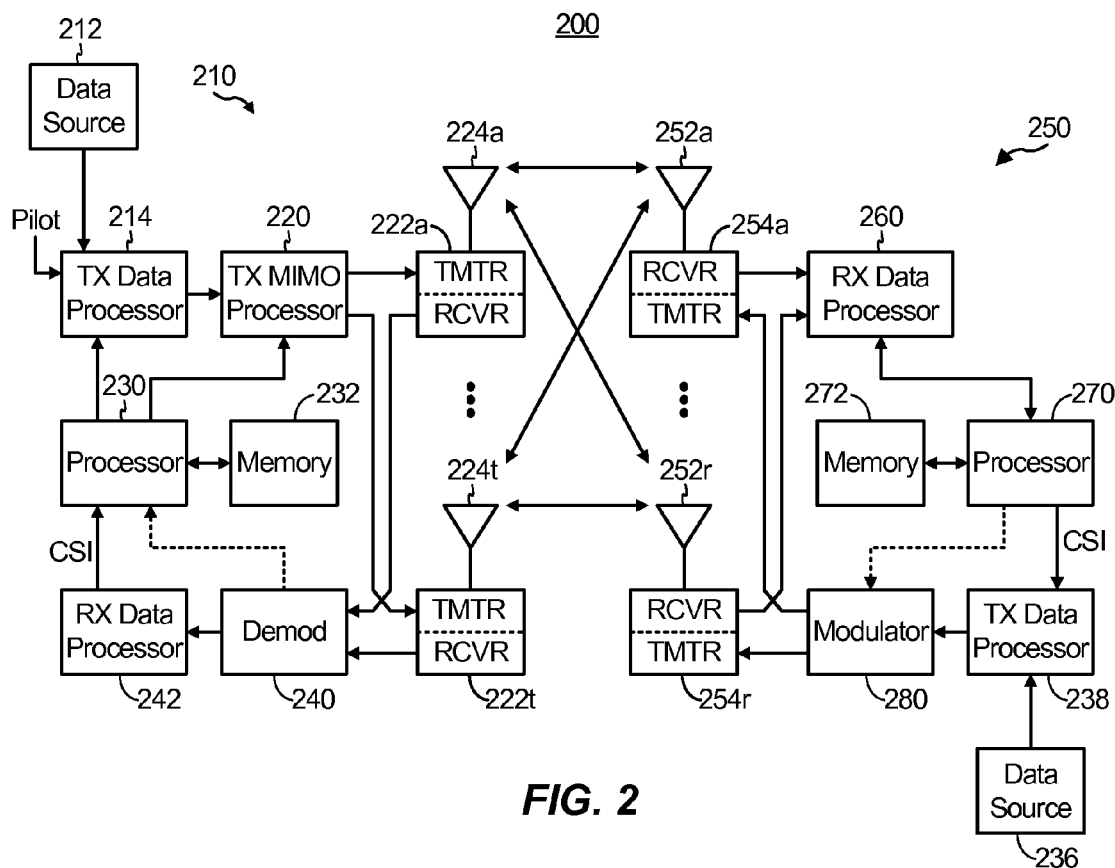
FIG. 2 illustrates a block diagram of an exemplary communication system.

FIG. 2 is a block diagram of an embodiment of a transmitter system 210 (also known as the access point) and a receiver system 250 (also known as access terminal) in a MIMO system 200. At the transmitter system 210, traffic data for a number of data streams is provided from a data source 212 to a transmit (TX) data processor 214.

In an embodiment, each data stream is transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides NT modulation symbol streams to NT transmitters (TMTR) 222a through 222t. In certain embodiments, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. NT modulated signals from transmitters 222a through 222t are then transmitted from NT antennas 224a through 224t, respectively.

At receiver system 250, the transmitted modulated signals are received by NR antennas 252a through 252r and the received signal from each antenna 252 is provided to a respective receiver (RCVR) 254a through 254r. Each receiver 254 conditions (e.g., filters, amplifies, and downconverts) a respective received signal, digitizes the conditioned signal to provide samples, and further processes the samples to provide a corresponding "received" symbol stream.

An RX data processor 260 then receives and processes the NR received symbol streams from NR receivers 254 based on a particular receiver processing technique to provide NT "detected" symbol streams. The RX data processor 260 then demodulates, de-interleaves, and decodes each detected symbol stream to recover the traffic data for the data stream. The processing by RX data processor 260 is complementary to that performed by TX MIMO processor 220 and TX data processor 214 at transmitter system 210.

A processor 270 periodically determines which pre-coding matrix to use (discussed below). Processor 270 formulates a reverse link message comprising a matrix index portion and a rank value portion.

The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights then processes the extracted message.

In an aspect, logical channels are classified into Control Channels and Traffic Channels. Logical Control Channels comprise Broadcast Control Channel (BCCH) which is a DL channel for broadcasting system control information. Paging Control Channel (PCCH) is a DL channel that transfers paging information. Multicast Control Channel (MCCH) is a Point-to-multipoint DL channel used for transmitting Multimedia Also, a Multicast Traffic Channel (MTCH) is a Point-to-multipoint DL channel for used for transmitting traffic data. Broadcast and Multicast Service (MBMS) scheduling and control information for one or several MTCHs. Generally, after establishing a RRC connection this channel is only used by UEs that receive MBMS. Dedicated Control Channel (DCCH) is a Point-to-point bi-directional channel that transmits dedicated control information and used by UEs having an RRC connection. In another aspect, Logical Traffic Channels comprise a Dedicated Traffic Channel (DTCH) which is a Point-to-point bi-directional channel, dedicated to one UE, for the transfer of user information.

In another aspect, Transport Channels are classified into DL and UL. DL Transport Channels comprise a Broadcast Channel (BCH), a Downlink Shared Data Channel (DL-SDCH) and a Paging Channel (PCH), the PCH for support of UE power saving (DRX cycle is indicated by the network to the UE), broadcasted over entire cell and mapped to physical resources (PHY) which can be used for other control/traffic channels. The UL Transport Channels comprise a Random Access Channel (RACH), a Request Channel (REQCH), an Uplink Shared Data Channel (UL-SDCH) and plurality of PHY channels. The PHY channels comprise a set of DL channels and UL channels.

Figure 3:
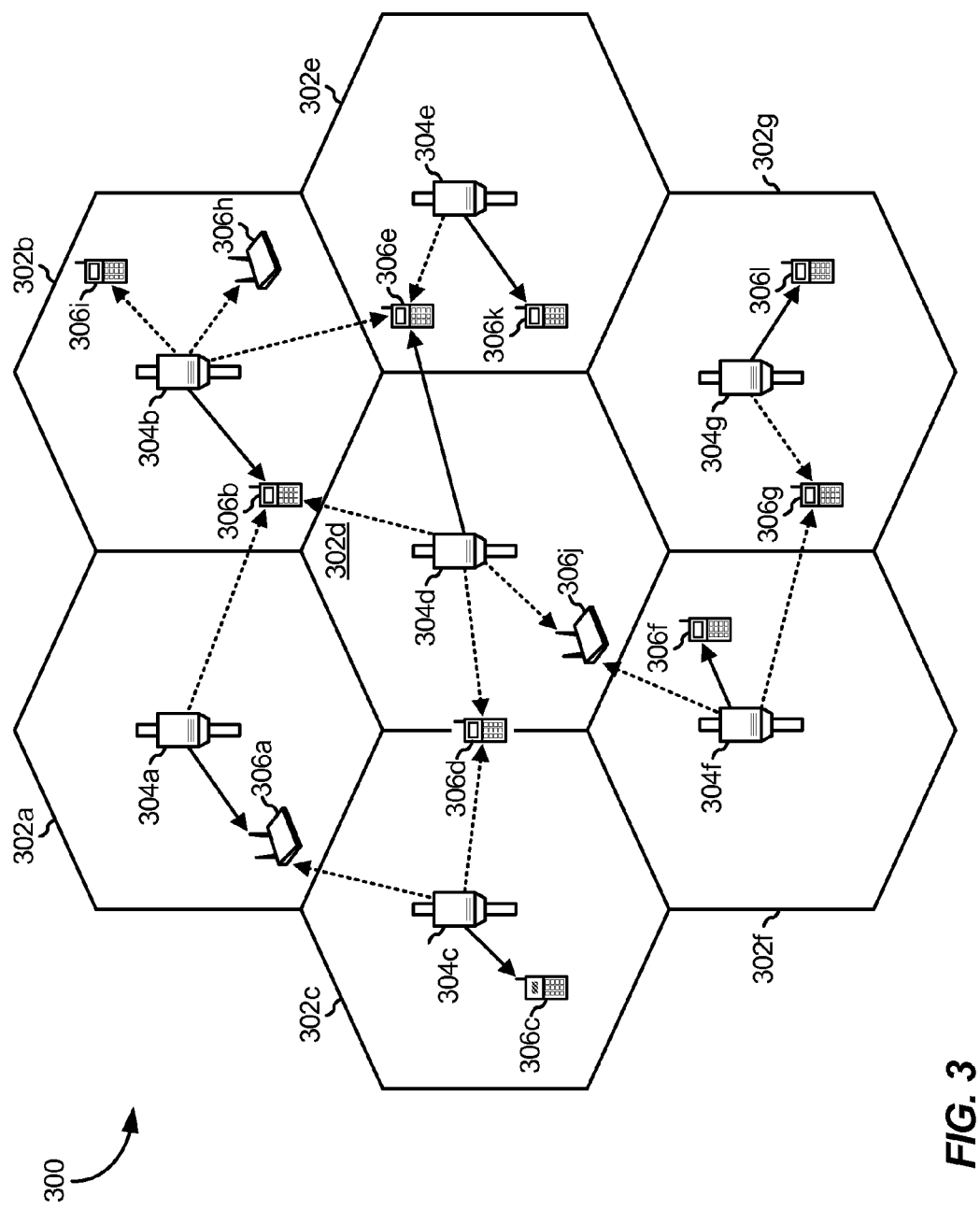
FIG. 3 illustrates an exemplary wireless communication network.

FIG. 3 illustrates an exemplary wireless communication network 300. The wireless communication network 300 is configured to support communication between multiple users. The wireless communication network 300 may be divided into one or more cells 302, such as, for example, cells 302a-302g. Communication coverage in cells 302a-302g may be provided by one or more nodes 304, such as, for example, nodes 304a-304g. Each node 304 may provide communication coverage to a corresponding cell 302. The nodes 304 may interact with a plurality of access terminals, such as, for example, ATs 306a-306l.

Each AT 306 may communicate with one or more nodes 304 on a forward link (FL) and/or a reverse link (RL) at a given moment. A FL is a communication link from a node to an AT. A RL is a communication link from an AT to a node. The nodes 304 may be interconnected, for example, by appropriate wired or wireless interfaces and may be able to communicate with each other. Accordingly, each AT 306 may communicate with another AT 306 through one or more nodes 304. For example, the AT 306j may communicate with the AT 306h as follows. The AT 306j may communicate with the node 304d. The node 304d may then communicate with the node 304b. The node 304b may then communicate with the AT 306h. Accordingly, a communication is established between the AT 306j and the AT 306h.

The wireless communication network 300 may provide service over a large geographic region. For example, the cells 302a-302g may cover only a few blocks within a neighborhood or several square miles in a rural environment. In one embodiment, each cell may be further divided into one or more sectors (not shown).

As described above, a node 304 may provide an access terminal 306 access within its coverage area to a communications network, such as, for example the internet or a cellular network.

An AT 306 may be a wireless communication device (e.g., a mobile phone, router, personal computer, server, etc.) used by a user to send and receive voice or data over a communications network. As shown, ATs 306a, 306h, and 306j comprise routers. ATs 306b-306g, 306i, 306k, and 306l comprise mobile phones. However, each of ATs 306a-306l may comprise any suitable communication device.

Figure 4:
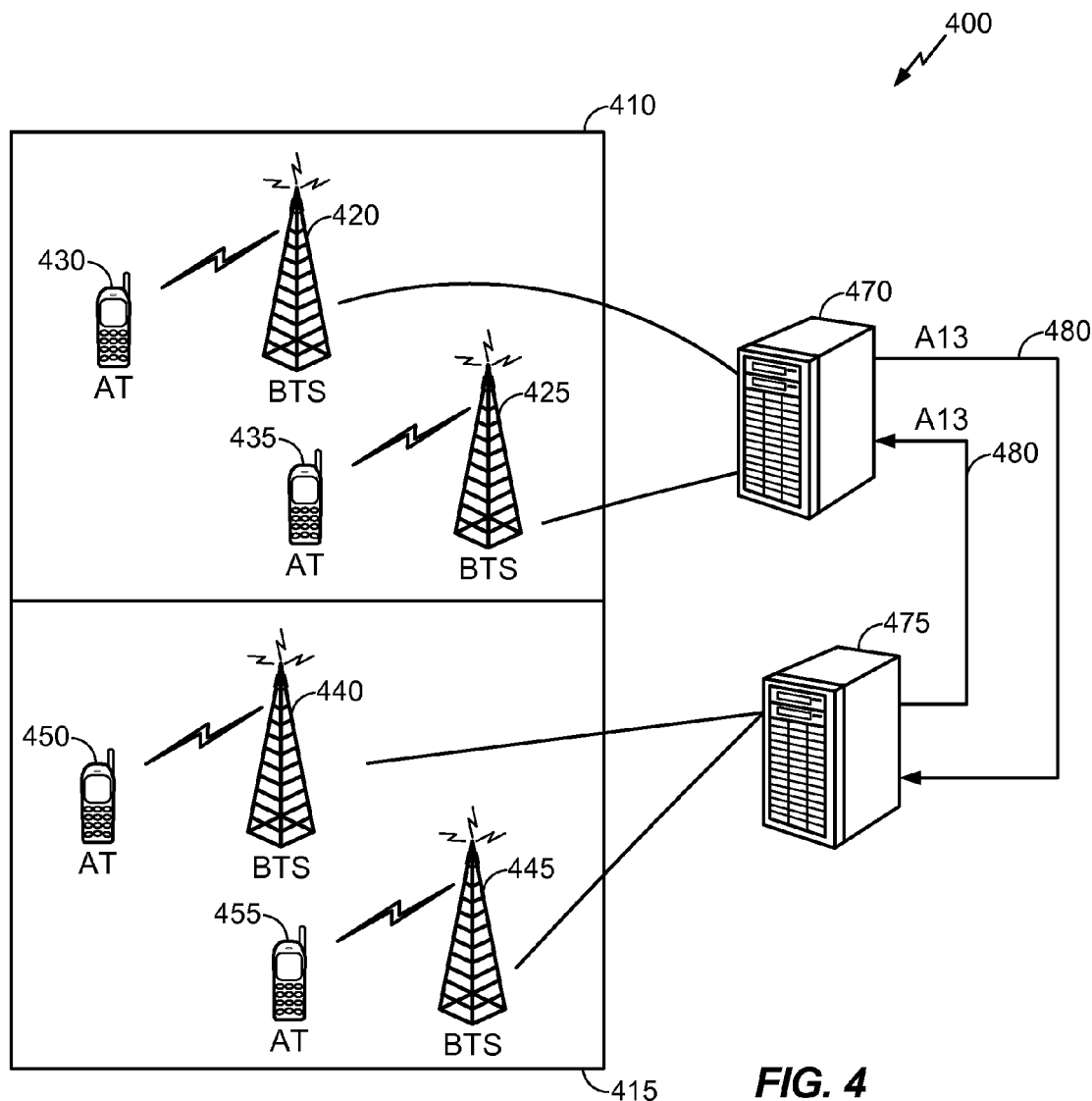
FIG. 4 illustrates exemplary interoperations of two or more communication networks.

FIG. 4 illustrates exemplary interoperations of two or more communication networks within a larger communication network 400. In the illustrated embodiment, communication network 410 and communication network 415 may be generally similar to the communication network 300 shown in FIG. 3. Communication network 410 may comprise one or more base transceiver stations (BTSs), such as BTS 420 and BTS 425. BTS 420 and BTS 425 may communicate with one or more ATs, such as AT 430 and AT 435. In the illustrated embodiment, BTSs 420 and 425 may be generally similar to access point 100 shown in FIG. 1, and ATs 430 and 435 may include MIMO system 200 shown in FIG. 2. Similarly, communication network 415 may comprise one or more BTSs, such as BTS 440 and BTS 445. BTS 440 and BTS 445 may communicate with one or more ATs, such as AT 450 and AT 455. In the illustrated embodiment, BTSs 440 and 445 may be generally similar to access point 100 shown in FIG. 1, and ATs 450 and 455 may include MIMO system 200 shown in FIG. 2. In an embodiment, a base station controller (BSC) 470 may control communication network 410, and BSC 475 may control communication network 415. BSC 470 and BSC 475 may communicate via a network interface to facilitate inter-network operations. An example of such interface is A13 interface 480. In some embodiments, a radio network controller (RNC) (not shown) may facilitate inter-network operations. The RNC may be generally similar to a BSC.

In an embodiment, an AT may initiate communication with a BTS. Communication may comprise voice and/or data-only information (collectively referred to herein as "data"). For example, AT 435 may initiate a data session with BTS 425. BTS 425 may assign AT 435 one or more identifiers, such as a unicast access terminal identifier (UATI) and a color code. BTS 425 may assign AT 435 a UATI via a UATI assignment message.

The UATI may uniquely identify the AT 435 within the larger communication network 400. The UATI may also identify the base station, BTS 425, with which AT 435 is in communication. In some embodiments, the UATI may identify the BSC 470 via a BSC_ID. The BSC_ID may be logically divided into one or more most significant bits (MSB) and one or more least significant bits (LSB). The one or more MSBs of the BSC_ID may be referred to as an upper BSC_ID or a BSC_ID_MSB, and the one or more LSBs of the BSC_ID may be referred to as a lower BSC_ID or BSC_ID_LSB. In some embodiments, the UATI is 128 bits long (collectively referred to as a UATI128). The UATI may be logically divided into one or more most significant bits (MSB) and one or more least significant bits (LSB). The one or more MSBs of the UATI may be referred to as an upper UATI, and the one or more LSBs of the UATI may be referred to as a lower UATI. In an embodiment, the upper UATI may comprise the 104 most significant bits of the UATI128, collectively referred to as a UATI104. In an embodiment, the lower UATI may comprise the 24 least significant bits of the UATI128, collectively referred to as a UATI24.

The color code may partially identify the BSC 470 and may uniquely map to one or more bits of the upper UATI. In some embodiments, the color code may be 8 bits long. In some embodiments, the color code may be mapped to the upper UATI on a one-to-one basis. Thus, in the example where an 8-bit color code maps to a 104-bit upper UATI (UATI104), only 256 different values of the UATI104 are valid. In an embodiment, the color code is provided to the AT 435 by the BTS 425. In another embodiment, the UATI is provided to the AT 435 by the BTS 425 and the AT 435 determines the color code from the UATI.

At some point, it may be desirable for an AT communicating with a BTS in communication network 410 to initiate handoff to a BTS in communication network 415. For example, AT 435 may be in communication with BTS 425 but detect a stronger signal from BTS 440. In an embodiment, AT 455 may initiate handoff from BTS 425 to BTS 440. In the illustrated example, BTS 425 may be considered a source access node, and BTS 440 may be considered a target access node. Similarly, communication network 410 may be called a source access network, and communication network 415 may be called a target access network.

In requesting handoff, AT 435 may send a handoff request to BTS 440, including identification information, which may include portions of the UATI and/or color code received from BTS 425. As discussed below, BTS 440 may use the identification information supplied by AT 435 to determine the address of the source node, BTS 425. In an embodiment, BSC 475 receives the identification information from BTS 440 and determines the address of BSC 470, which controls the source access network, communication network 410. The target node, BTS 425, may transmit a session transfer request to the source node, BTS 440. Specifically, BTS 425 may transmit the session transfer request through BSC 475, which may send an A13 message 480 to BSC 470, which in turn may forward the session transfer request to BTS 425.

Figure 5:
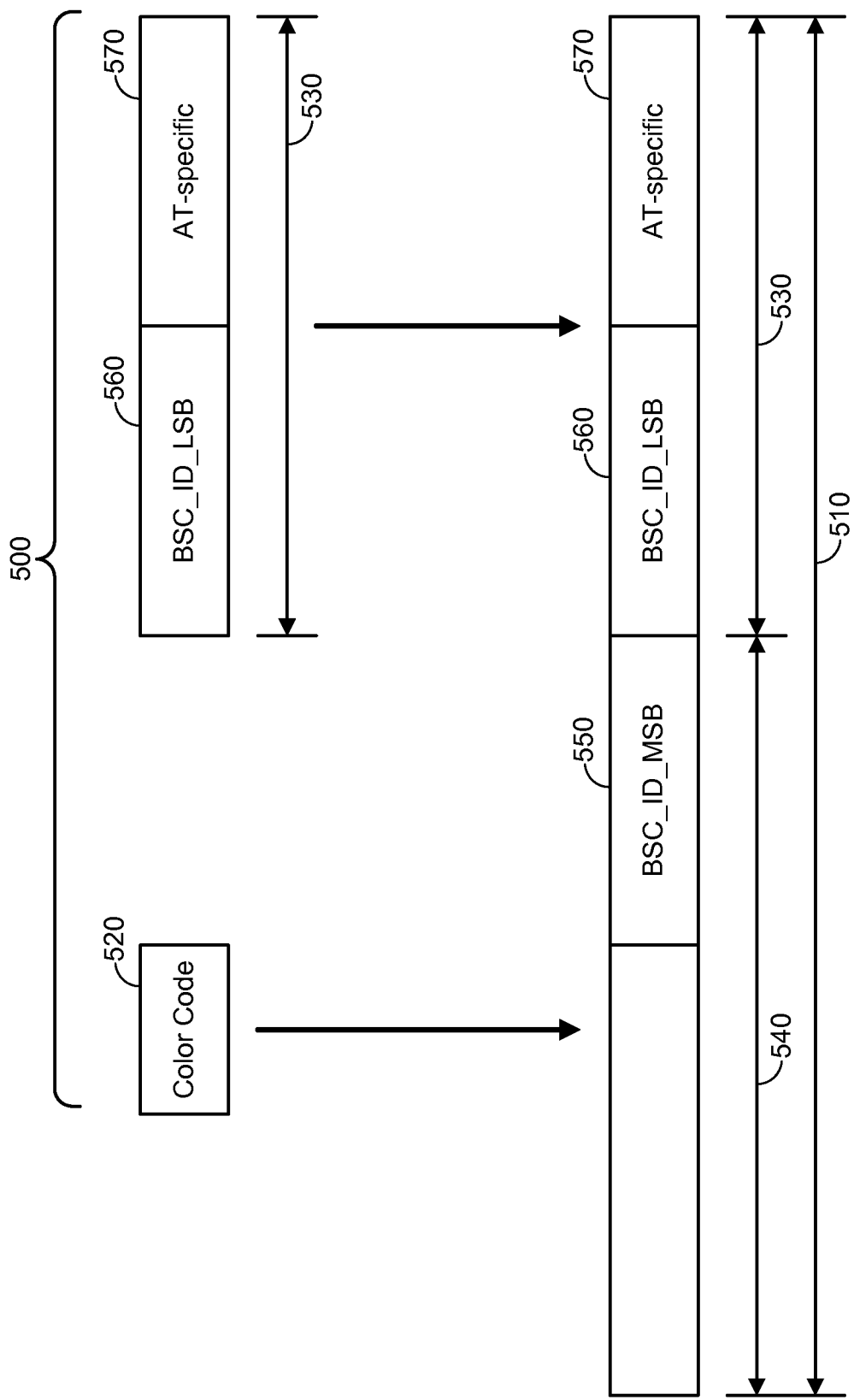
FIG. 5 illustrates an exemplary identifier assignment scheme used by a source node shown in FIG. 4.

FIG. 5 illustrates an exemplary identifier assignment scheme used by the source node shown in FIG. 4. As described with respect to FIG. 4, AT 435 may send a handoff request to BTS 440, including identification information 500, which may be mapped to the UATI 510. In the illustrated embodiment, the identification information 500 comprises the color code 520 and the lower UATI 530.

As described above, the color code 520 may uniquely map to one or more bits of the upper UATI 540. In some embodiments, the upper UATI 540 may be 104 bits long, and may be referred to as the UATI104. In some embodiments, the upper UATI 540 may include the BSC_ID_MSB 550. The BSC_ID_MSB 550 may comprise one or bits of the upper UATI 540. In the illustrated embodiment, the BSC_ID_MSB 550 comprises one or more of the least significant bits of the upper UATI 540.

In some embodiments, the lower UATI 530 may be 24 bits long, and may be referred to as the UATI24. The lower UATI 530 may include the BSC_ID_LSB 560 and an AT-specific identifier (ATID) 570. In the illustrated embodiment, the BSC_ID_LSB comprises one or more of the most significant bits of the lower UATI 530, and the ATID 570 comprises one or more of the least significant bits of the lower UATI 530.

In the illustrated embodiment, the upper UATI 540 may be mapped from the color code 520 and combined with the lower UATI 530 to form the UATI 510. Similarly, the BSC_ID_MSB may be mapped from the color code 520 and combined with the BSC_ID_LSB to form the BSC_ID. As described with respect to FIG. 4, these mappings may be performed by the BTS 440, BSC 475, or the associated RNC (not shown).

Figure 6:
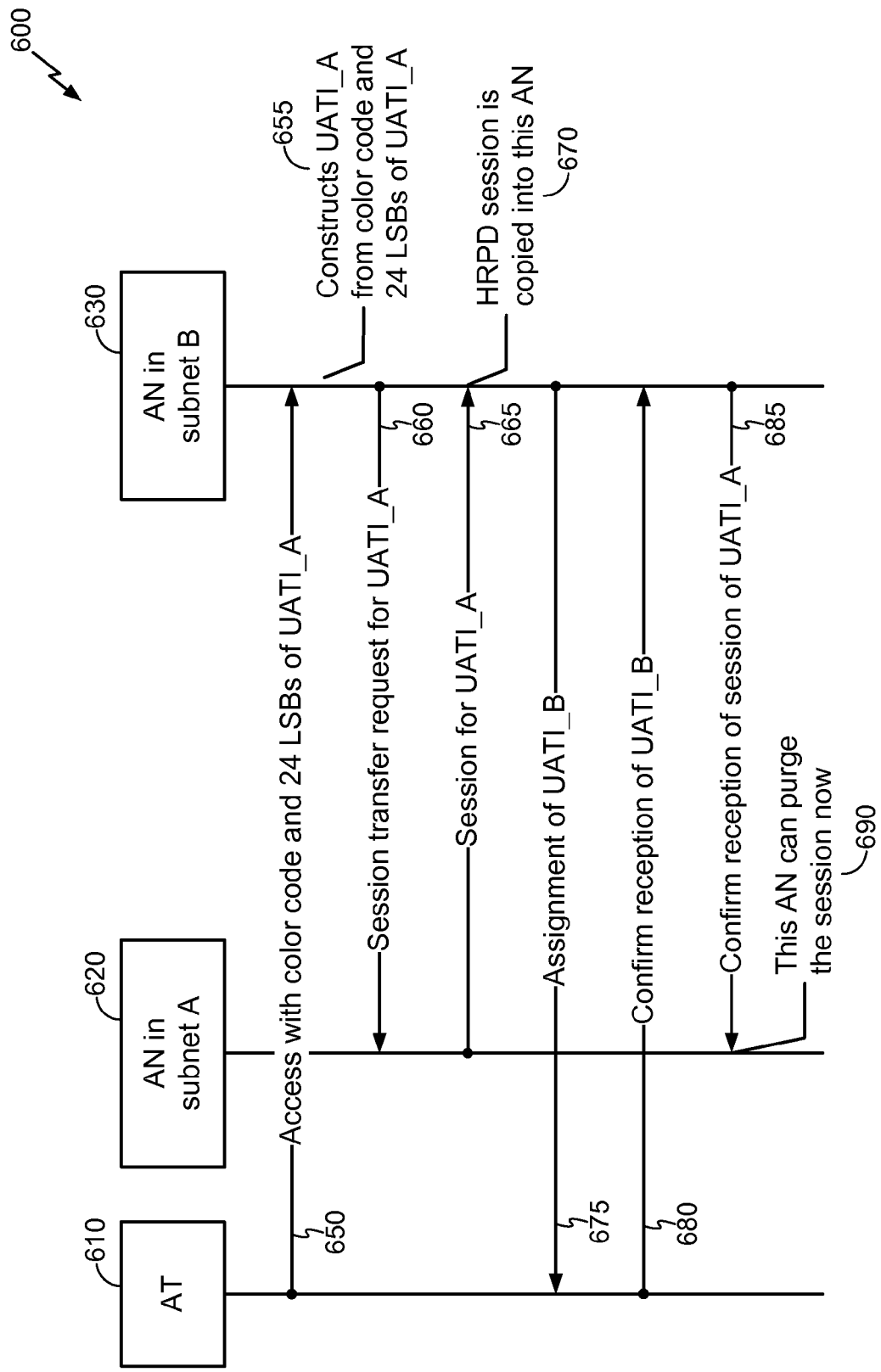
FIG. 6 illustrates an exemplary data session transfer sequence.

FIG. 6 illustrates an exemplary data session transfer sequence 600, initiated by AT 610 from a source access network 620 to a target access network 630. In an embodiment, AT 610 may be generally similar to AT 435 shown in FIG. 4. In an embodiment, the source access network 620 may be generally similar to communication network 410 shown in FIG. 4. Source access network 620 may be in a first subnet, "subnet A." In an embodiment, the target access network 630 may be generally similar to communication network 415 shown in FIG. 4. The target access network 630 may be in a second subnet, "subnet B."

In an exemplary step 650, AT 610 accesses the target access network 630 with the color code and UATI24 previously assigned by the source access network 620. Next, in step 655, the target access network 630 constructs a source UATI (UATI_A) from the color code and UATI24 received from AT 610 and determines the address of the source access network 620. Proceeding to step 660, the target access network 630 sends a session transfer request to source access network 620, using the source UATI. Moving to step 665, source access network 620 sends the session associated with the UATI to the target access network 630. Continuing to step 670, the session is copied into the target access network 630. Then, in step 675, the target access network 630 assigns a new UATI (UATI_B) to the AT 610. Subsequently, in step 680, AT 610 sends a message to the target access network 630, which confirms reception of the new UATI. Thereafter, in step 685, the target access network 630 sends a message to the source access network 620, which confirms reception of the session associated with the source UATI. Finally, in step 690, the source access network 620 purges the session associated with the source UATI.

With respect to step 655, the address of the source access network 620 may be found in a lookup table. The lookup table may be indexed to color code, thereby associating each color code with an address. Alternatively, the lookup table may be indexed to BSC_ID, thereby associating each BSC_ID with an address. In either embodiment, the size of the lookup table is correlated with the size of the color code. In various embodiments, the lookup table may be implemented at one or more of the BTS, BSC, and femto gateway associated with the target access network 630.

Figure 7:
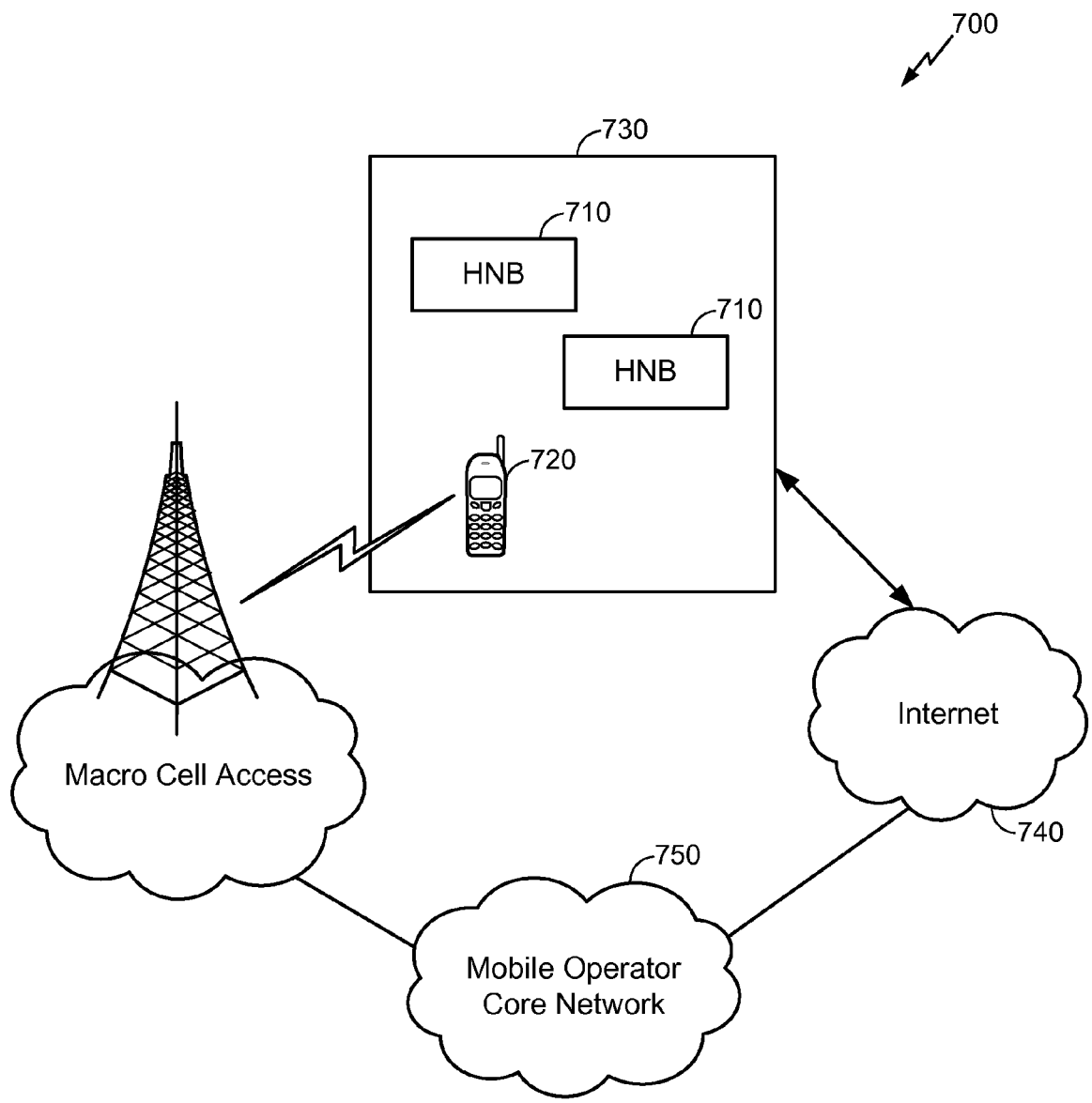
FIG. 7 illustrates an exemplary communication system to enable deployment of access point base stations within a network environment.

FIG. 7 illustrates an exemplary communication system to enable deployment of access point base stations within a network environment. As shown in FIG. 7, the system 700 includes multiple access point base stations, which may comprise access point 100 (see FIG. 1). In an embodiment, the system includes femto cells, Home Node B units, or Home evolved Node B units, such as, for example, HNBs 710, each being installed in a corresponding small scale network environment, such as, for example, in one or more user residences 730, and being configured to serve associated, as well as alien, user equipment or mobile stations 720. Each HNB 710 is further coupled to the Internet 740 and a mobile operator core network 750 via an Internet access device (not shown) such as, for example, a DSL router or a cable modem.

Figure 8:
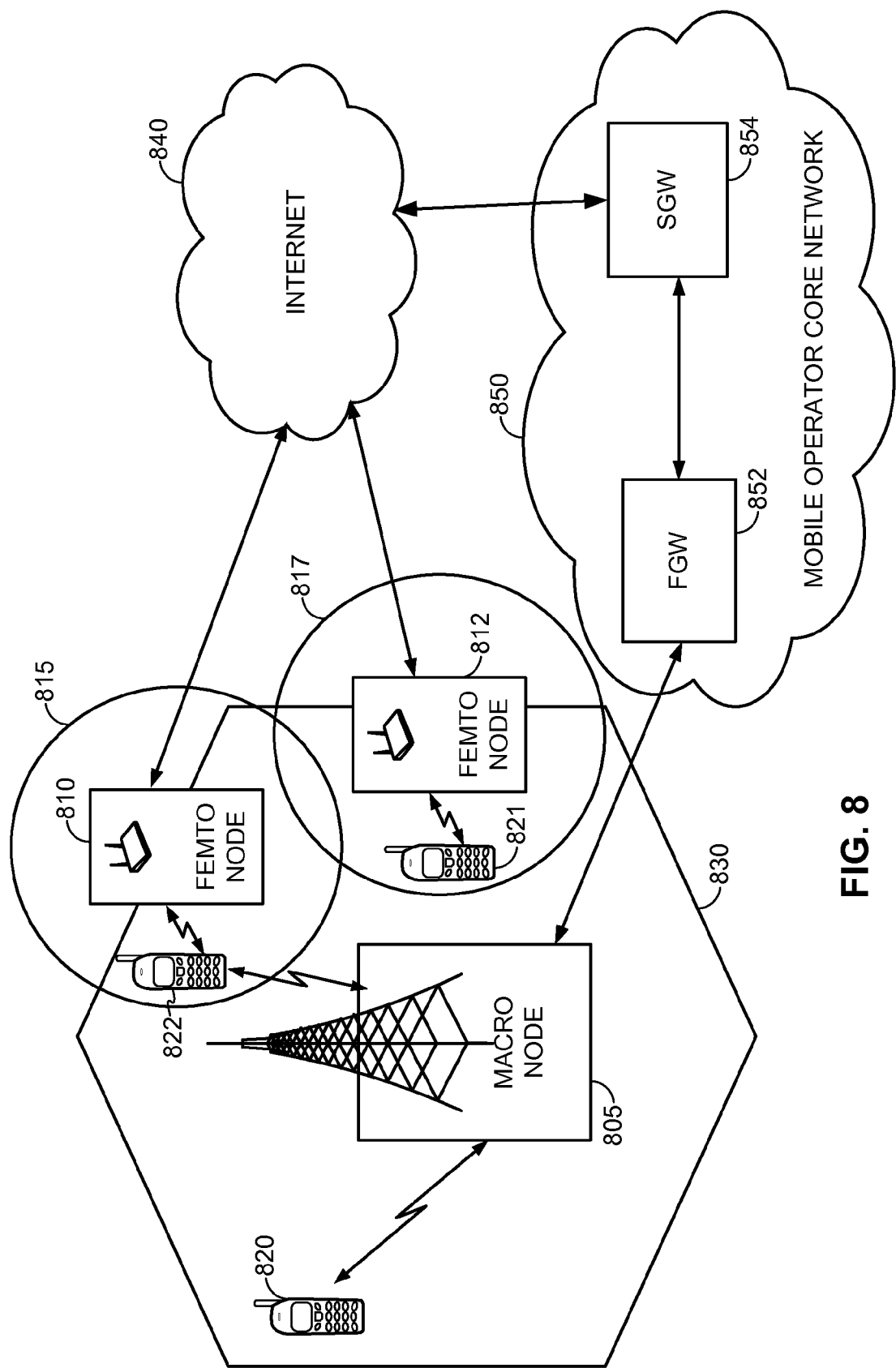
FIG. 8 illustrates exemplary interoperations of two or more communication networks.

FIG. 8 illustrates exemplary interoperations of two or more communication networks. It may desirable for an AT 820 to transmit information to and receive information from another AT, such as AT 821. FIG. 8 illustrates a manner in which the AT 820 may communicate with the AT 821. As shown in FIG. 8, the macro node 805 may provide communication coverage to access terminals within a macro area 830. For example, the AT 820 may generate and transmit a message to the macro node 805. The message may comprise information related to various types of communication (e.g., voice, data, multimedia services, etc.). The AT 820 may communicate with the macro node 805 via a wireless link.

The macro node 805 may also communicate with a femto gateway (FGW), such as the FGW 852 operating in communication network 850. For example, the macro node 805 may transmit the message received from the AT 820 to the FGW 852. Generally, the FGW 852 may facilitate communication between the AT 820 and the AT 821 by first receiving the message received from the AT 820 via the macro node 805. The FGW 852 may then transmit the message through a security gateway (SGW), such as the SGW 854, which may act as a transparent tunnel to a femto node. The macro node 805 and the FGW 852 may communicate via a wired link. For example, a direct wired link may comprise a fiber optic or Ethernet link. The macro node 805 and the FGW 852 may be co-located or deployed in different locations.

The FGW 852 may also communicate with the security gateway (SGW) 854. Generally, the SGW 854 may facilitate communication between the AT 820 and the AT 821 by providing a transparent tunnel from the FGW 852 to a femto node. The SGW 854 may act as a tunnel by first receiving the message from the AT 820 via the macro node 805 and the FGW 852. The SGW 854 may then relay the message to a femto node for transmission to the AT 821. The FGW 852 and the SGW 854 may communicate via a direct wired link as described above. The FGW 852 and the SGW 854 may be co-located or may be deployed in different locations.

The SGW 854 may also communicate with the Internet 840 (and/or another appropriate wide area network). Generally, the Internet 840 may facilitate communication between the AT 820 and the AT 821 by first receiving the message from the AT 820 via the macro node 805, the FGW 852, and the SGW 854. The Internet 840 may then transmit the message to a femto node, such as the femto node 812 for transmission to the AT 821. The SGW 854 may communicate with the Internet 840 via a wired or wireless link as described above.

The Internet 840 may also communicate with femto nodes, such as the femto nodes 810, 812. The femto node 812 may facilitate communication between the AT 820 and the AT 821 by providing communication coverage for the AT 820 within a femto area 817. For example, the femto node 812 may receive the message originating at the AT 820 via the macro node 805, the FGW 852, the SGW 854, and the Internet 840. The femto node 812 may then transmit the message to the AT 821 in the femto area 817. The femto node 812 may communicate with the AT 821 via a wireless link.

As described above, the macro node 805, the FGW 852, the SGW 854, the Internet 840, and the femto node 812 may interoperate to form a communication link between the AT 820 and the AT 821. For example, the AT 820 may generate and transmit a message to the macro node 805. The macro node 805 may then transmit the message to the FGW 852. The FGW 852 may subsequently transmit the message through the SGW 854. The SGW 854 may then transparently relay the message to the Internet 840. The Internet 840 may then transmit the message to the femto node 812. The femto node 812 may then transmit the message to the AT 821. Similarly, the reverse path may be followed from the AT 821 to the AT 820.

In one embodiment, the femto nodes 810, 812 may be deployed by individual consumers and placed in homes, apartment buildings, office buildings, and the like. The femto nodes 810, 812 may communicate with the ATs in a predetermined range (e.g., 100 m) of the femto nodes 810, 812 utilizing a predetermined cellular transmission band. In one embodiment, the femto nodes 810, 812 may communicate with the Internet 840 by way of an Internet Protocol (IP) connection, such as a digital subscriber line (DSL, e.g., including asymmetric DSL (ADSL), high data rate DSL (HDSL), very high speed DSL (VDSL), etc.), a TV cable carrying Internet Protocol (IP) traffic, a broadband over power line (BPL) connection, or other link. In another embodiment, the femto nodes 810, 812 may communicate with the SGW 854 via a direct link.

As described above, multiple femto nodes 810, 812 may be deployed within the macro area 830. The deployment of multiple femto nodes 810, 812, in the macro area 830 may make it desirable to improve the process of handing off a data session from the femto node 810 to the macro node 805. For example, the AT 822 may initiate a data session by communicating with the femto node 810. After some time, the data session may go idle. A data session may be said to be idle when data is not actively transferred, but the session persists. As the AT 822 moves, it may be advantageous for the femto node 810 to hand off the call to macro node 805. In one example, the AT 822 may be located at the edge of the femto area 815 where the coverage provided by the femto node 810 may begin to deteriorate. However, in the same area, the coverage provided by the macro node 805 in macro area 830 may be strong. Accordingly, it may be desirable for the macro node 805 to hand in the AT 822 from the femto node 810. In addition to alleviating deteriorating coverage, it may be desirable for the macro node 805 to hand in from the femto node 810 for other reasons. For example, the femto node 810 may not have the capacity to service a large number of ATs. It may be beneficial to overall system performance to offload some of the AT communication traffic from the femto node 810 by handing in ATs to macro nodes.

In an embodiment, session transfer from femto node 810 to macro node 805 may proceed generally as shown in FIG. 6. Specifically, the process of handing in from the femto node 810 to the macro node 805 may require the macro node 805 to identify the address of the femto node 810 in order to send a session transfer request.

As discussed with respect to FIG. 6, the size of the color code may limit the number of unique addresses available. In the context of macro-to-macro session transfer, this limitation may be acceptable due to the generally large size of access network. Specifically, larger access networks may allow for a lower number of access networks and therefore require fewer bits to address. Because femto nodes may be relatively small and numerous, there may not be enough bits available in the legacy UATI assignment scheme to support all the necessary color codes or BSC_IDs. As additional femto nodes are deployed within network-at-large, it may be desirable to improve the manner in which the addresses of femto nodes are identified during the hand in process.

A. UATI Assignment Differentiation

In one embodiment, access networks may adjust the UATI assignment scheme depending on whether the access network is a femto node or a macro node. FIG. 9A illustrates an exemplary identifier assignment scheme used by a femto node, such as femto node 810 shown in FIG. 8. In an embodiment, femto assignment scheme 900 may be used by femto node 810 when assigning a UATI 905 to an AT such as AT 822 (see FIG. 8). Because femto cells may cover relatively smaller areas than macro cells, they may also provide service to a relatively small number of ATs. Therefore, in an embodiment, a femto cell may allocate relatively fewer bits of the lower UATI 910 to the ATID 915. For example, the femto cell may allocate about 4 bits to the ATID 915. In some embodiments, the femto cell may allocate between about 3 bits and about 5 bits to the ATID 915. In some embodiments, the femto cell may allocate between about 2 bits and about 10 bits to the ATID 915. Accordingly, the femto cell may allocate relatively more bits of the lower UATI 910 to the BSC_ID_LSB 920. For example, the femto cell may allocate about 20 bits to the BSC_ID_LSB 920. In some embodiments, the femto cell may allocate between about 19 and about 21 bits to the BSC_ID_LSB 920. In some embodiments, the femto cell may allocate between about 14 and about 22 bits to the BSC_ID_LSB 920.

In the illustrated embodiment, as in FIG. 5, the upper UATI 925 comprises a BSC_ID_MSB 930 mapped from the color code. In some embodiments, BSC_ID_MSB 930 is about 12 bits long. In some embodiments, BSC_ID_MSB 930 is between about 11 and about 13 bits long. In some embodiments, the BSC_ID_MSB 930 is between about 10 and about 18 bits long. In some embodiments, the BSC_ID_MSB 930 may be longer than 104 bits. Together, the BSC_ID_MSB 930 and the BSC_ID_LSB 920 may compose the BSC_ID 935. In some embodiments, BSC_ID 935 may represent the IP address of the femto cell. In some embodiments, the BSC_ID 935 may map to the address of the femto cell.

FIG. 9B illustrates an exemplary identifier assignment scheme used by a macro node, such as macro node 805 shown in FIG. 8. In an embodiment, macro assignment scheme 950 may be used by macro node 805 when assigning a UATI 955 to an AT such as AT 822 (see FIG. 8). In some embodiments, macro assignment scheme 950 may comprise the assignment scheme used for UATI 510 shown in FIG. 5. Because macro cells may cover relatively larger areas than femto cells, they may also provide service to a relatively large number of ATs. Therefore, in an embodiment, a macro cell may allocate relatively more bits of the lower UATI 960 to the ATID 965. For example, the femto cell may allocate about 20 bits to the ATID 965. In some embodiments, the femto cell may allocate between about 19 bits and about 21 bits to the ATID 965. In some embodiments, the femto cell may allocate between about 14 bits and about 22 bits to the ATID 965. Accordingly, the femto cell may allocate relatively more bits of the lower UATI 960 to the BSC_ID_LSB 970. For example, the femto cell may allocate about 4 bits to the BSC_ID_LSB 970. In some embodiments, the femto cell may allocate between about 3 and about 5 bits to the BSC_ID_LSB 970. In some embodiments, the femto cell may allocate between about 2 and about 10 bits to the BSC_ID_LSB 970.

In the illustrated embodiment, as in FIG. 5, the upper UATI 975 comprises a BSC_ID_MSB 980 mapped from the color code. In some embodiments, BSC_ID_MSB 980 is about 28 bits long. In some embodiments, BSC_ID_MSB 980 is between about 27 and about 29 bits long. In some embodiments, the BSC_ID_MSB 980 is between about 12 and about 30 bits long. In some embodiments, the BSC_ID_MSB 980 may be longer than 104 bits. Together, the BSC_ID_MSB 980 and the BSC_ID_LSB 970 may compose the BSC_ID 985. The BSC_ID may be the IP address of the femto cell.

Figure 10:
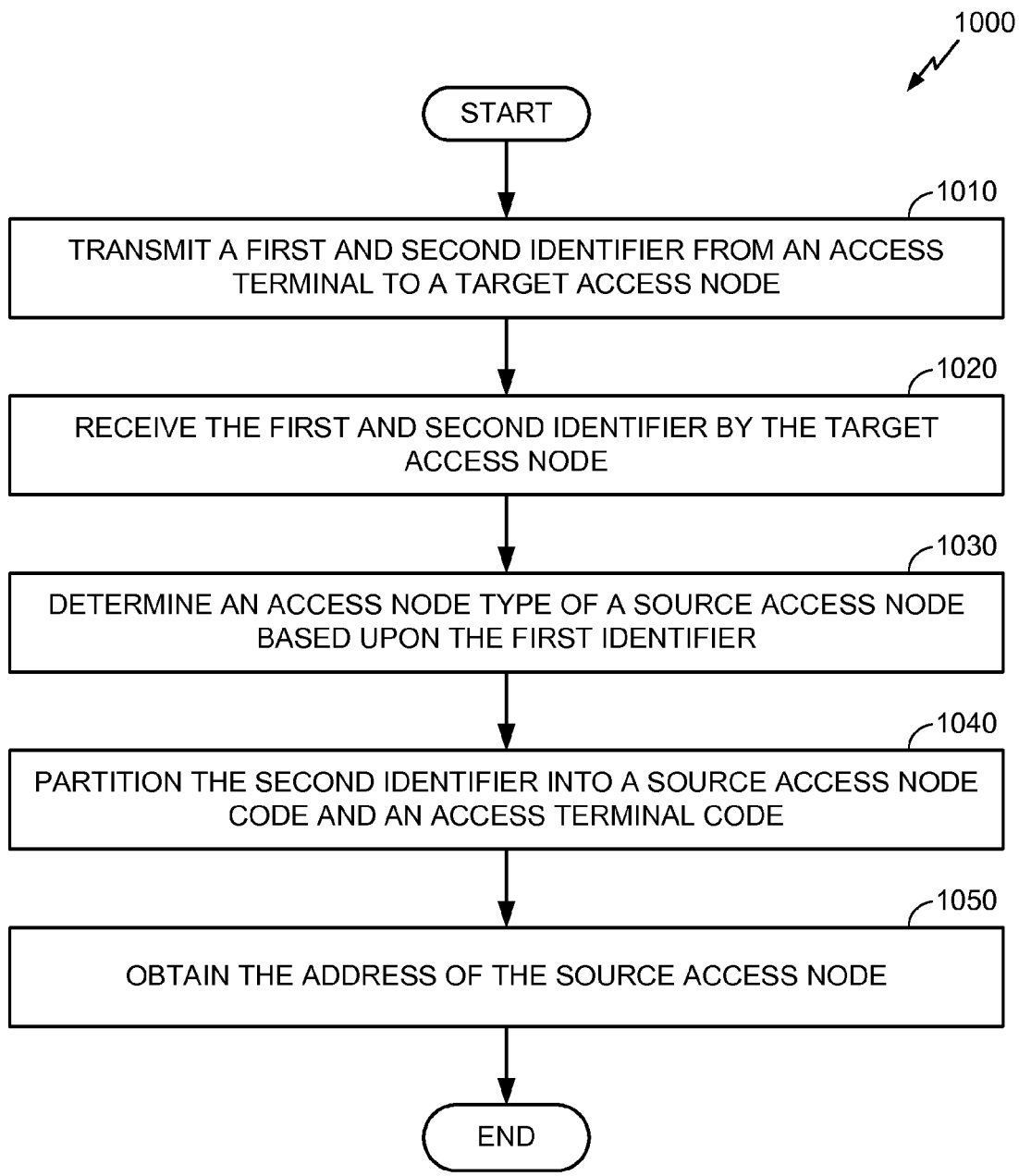
FIG. 10 is a flowchart of an exemplary process for identifying an address of a source node shown in FIG. 8.

FIG. 10 is a flowchart of an exemplary process for identifying an address of a source node shown in FIG. 8. As described above with respect to FIG. 8, the process 1000 may be used to help identify the address of a source node during a hand in process to a target node.

As shown in exemplary step 1010, an access terminal transmits a first and second identifier to a target access node. In an embodiment, the access terminal may be AT 822 and the target access node may be macro node 805. The first identifier may comprise the color code that the AT 822 previously received from the femto node 810. Alternatively, the first identifier may comprise one or more bits of the upper UATI that the AT 822 previously received from the femto node 810. The second identifier may comprise the lower UATI that the AT 822 previously received from the femto node 810. In an embodiment, the femto node 810 may have generated a UATI and assigned the UATI to the AT 822. The AT 822 may have resolved the color code from one or more bits of the UATI. In another embodiment, the femto node 810 may have transmitted the both the color code and one or more bits of the UATI to the AT 822. The AT 822 may have stored the color code and the UATI in a memory.

Next, in step 1020, the target access node receives the first and second identifier from the AT. In one embodiment, the macro node 805 may receive the color code and the lower UATI from the AT 822. The macro node 805 may store the color code and lower UATI in a memory. In one embodiment, the macro node 805 may forward the color code and lower UATI to the FGW 852 for processing.

Continuing to step 1030, a processing element determines an access node type of a source access node based upon the first identifier. In an embodiment, the processing element is the macro node 805. In another embodiment, the processing element is FGW 852. Possible node types may include macro nodes and femto nodes. The processing element may perform a lookup on the first identifier in order to determine whether the source node is a macro or femto node. In embodiments where the first identifier comprises the color code of the source node, one or more color codes may be reserved to identify the source node as a femto node. In embodiments where the first identifier comprises one or more bits of the upper UATI, the processing element may first map the first identifier to a subnet and/or BSC_ID_MSB and then compare the result with a list of known femto nodes.

Proceeding to step 1040, the processing element partitions the second identifier into a source access node code and an access terminal code. In an embodiment, the second identifier may be the lower UATI as shown in FIG. 9A and FIG. 9B. Thus, the source access node code may comprise the BSC_ID_LSB and the access terminal code may comprise the ATID. In an embodiment, the processing element may partition the second identifier as shown in 9A and 9B. For example, if the processing element determines the access node to be a femto node, the processing element may extract the BSC_ID_LSB and ATID in accordance with femto UATI assignment scheme 900, shown in FIG. 9A. Alternatively, if the processing element determines the access node to be a macro node, the processing element may extract the BSC_ID_LSB and ATID in accordance with macro UATI assignment scheme 950, shown in FIG. 9B. Thus, when the source access node is a femto node, the extracted BSC_ID_LSB may have more bits than when the source access node is a macro node. Similarly, when the source access node is a femto node, the extracted ATID may have fewer bits than when the source access node is a macro node. The processing element may store the BSC_ID_LSB and/or ATID in a memory.

Moving to step 1050, the processing element obtains the address of the source access node. When the source access node is a femto node, the processing element may map the color code to an upper UATI and extract the BSC_ID_MSB as shown in FIG. 5. The processing element may concatenate the BSC_ID_MSB with the BSC_ID_LSB to form the BSC_ID. In some embodiments, the BSC_ID of the femto access node may be the IP address of the source access node. When the source access node is a macro node, the processing element may simply perform a lookup on the color code to determine the IP address of the source access node. In some embodiments, the processing element may map the color code to an upper UATI and extract the BSC_ID_MSB as shown in FIG. 5. The processing element may concatenate the BSC_ID_MSB with the BSC_ID_LSB to form the BSC_ID. In some embodiments, the BSC_ID of the macro access node may be the IP address of the source access node.

Figure 11:
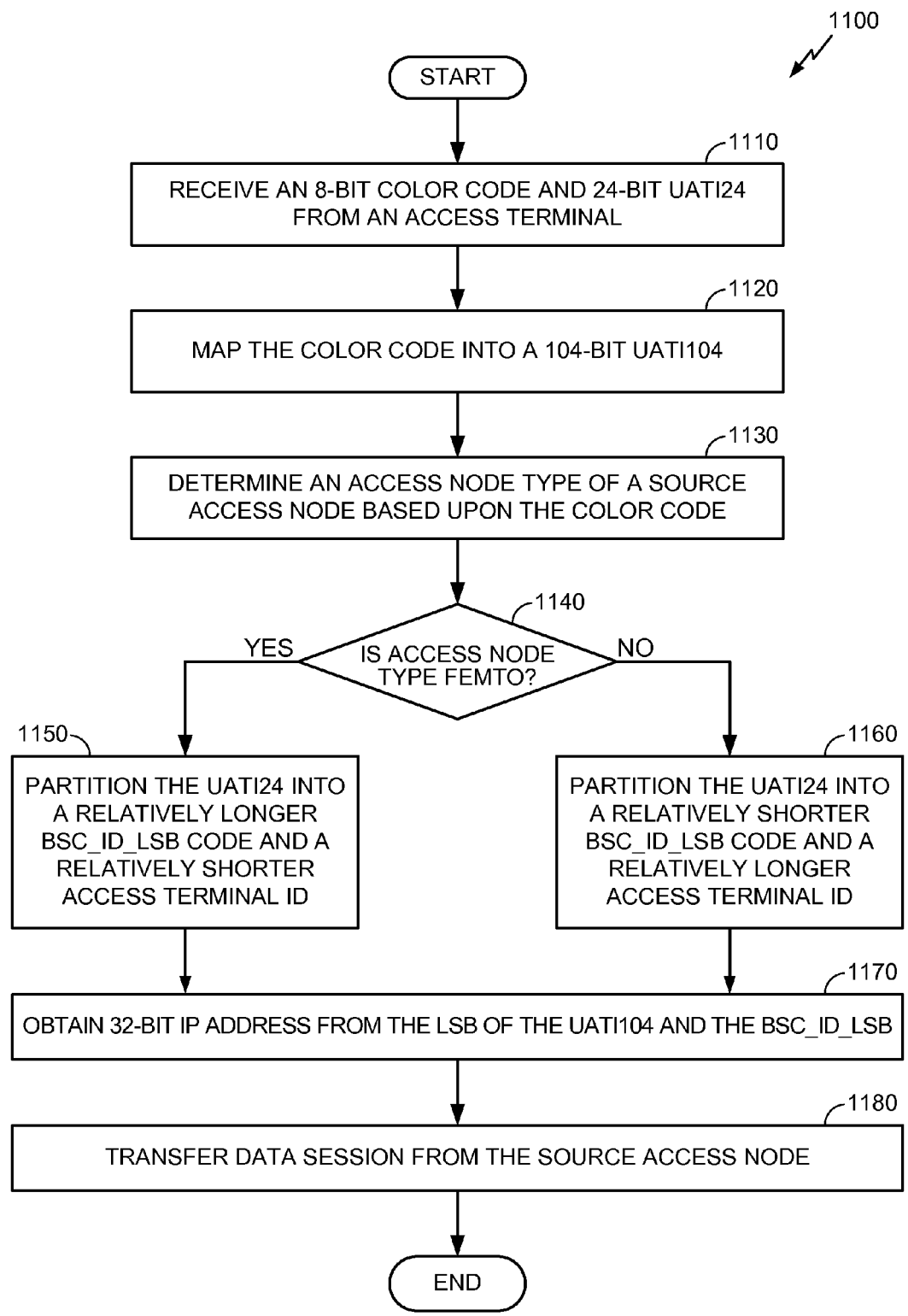
FIG. 11 is a flowchart of an exemplary process for performing a handoff from a source node to a target node shown in FIG. 8.

FIG. 11 is a flowchart of an exemplary process for performing a handoff from a source node to a target node shown in FIG. 8. As described above with respect to FIG. 8, the process 1100 may be used to transfer a data session from a source access node to a target access node. In one embodiment, the source access node is femto node.

In step 1110, a processing element receives an 8-bit color code and a 24-bit UATI24 from an AT. In an embodiment, the processing element may be a macro node such as macro node 805. In another embodiment, the processing element may be an FGW such as FGW 852.

Next, in step 1120, the processing element maps the color code into the UATI104 as shown in FIG. 5. Then, in step 1130, the processing element determines the node type of the source access node based upon the color code. Possible node types may include macro nodes and femto nodes. In an embodiment, some color code values may be reserved to indicate a femto source access node. In some embodiments, one or more bits of the color code may act as a flag indicating a femto source access node. At decision point 1140, the flowchart branches depending on whether the node type of the source access node is a femto node type or a macro node type.

If the source access node is a femto node, the processing element partitions the UATI24 accordingly in step 1150. Specifically, the processing element extracts a relatively longer BSC_ID_LSB and a relatively shorter ATID, as shown in FIG. 9A. Alternatively, if the source access node is a macro node, the processing element partitions the UATI24 differently in step 1160. Specifically, the processing element extracts a relatively shorter BSC_ID_LSB and a relatively longer ATID, as shown in FIG. 9B.

Continuing to step 1170, the processing element obtains a 32-bit IP address of the source access node by combining one or more bits from the LSB of the UATI104 with the extracted BSC_ID_LSB. In some embodiments, the one or more bits from the LSB of the UATI104 may comprise the BSC_ID_MSB. Thus, the BSC_ID_MSB is combined with the BSC_ID_LSB to for the BSC_ID, which may be the IP address of the source access node.

Proceeding to step 1180, the target access node transfers the data session from the source access node. In some embodiments, the data session transfer may operate as shown in FIG. 6. In an embodiment, target node 805 may transmit a session transfer request to the source node 810. Specifically, macro node 805 may transmit the session transfer request through FGW 852, which may send an A13 message through SGW 854, over the Internet 840 to femto node 810. Femto node 810 may transfer the data session via the reverse path.

Figure 12:
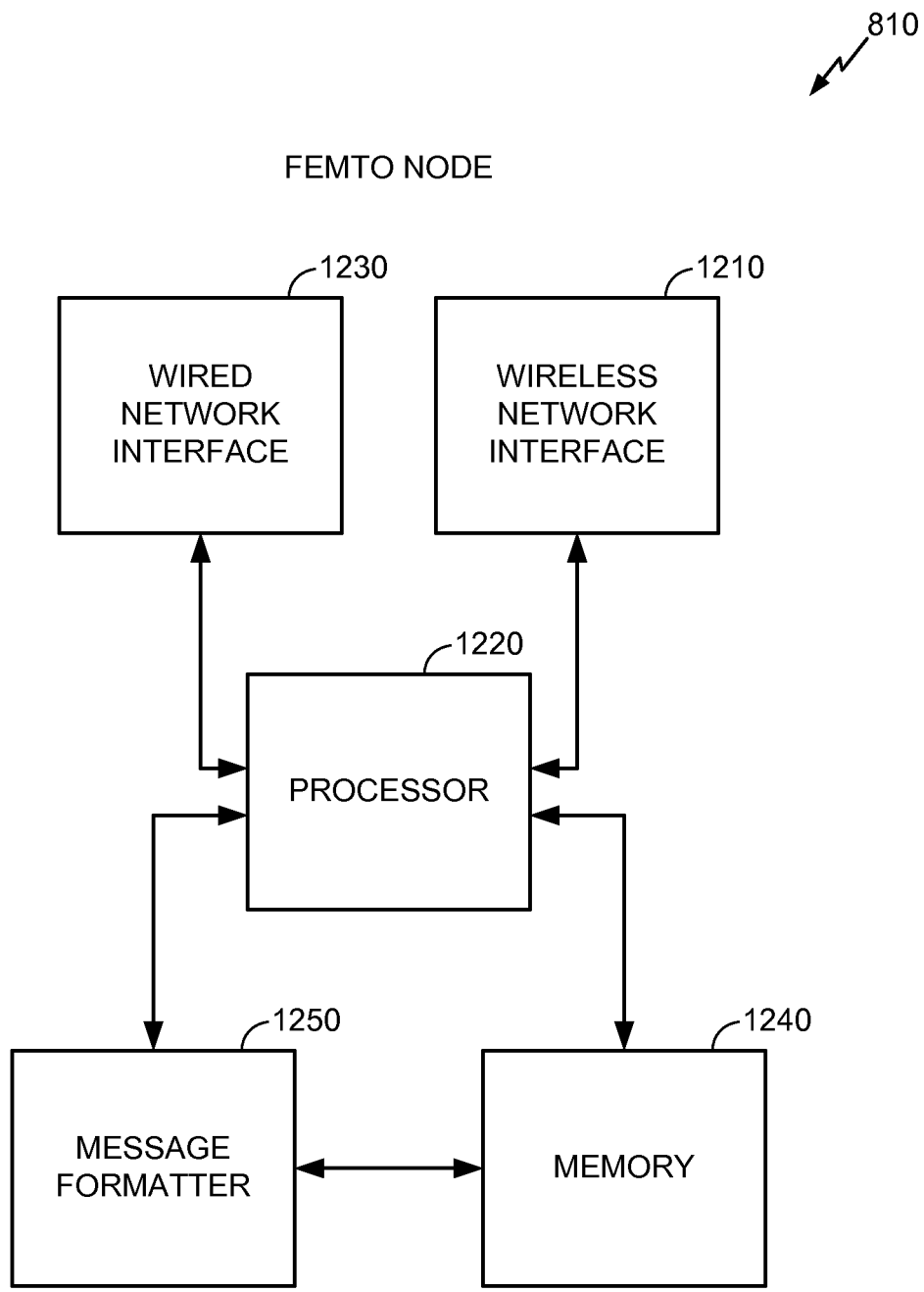
FIG. 12 is a functional block diagram of an exemplary femto node shown in FIG. 8.

FIG. 12 is a functional block diagram of an exemplary femto node 810 shown in FIG. 8. In an embodiment, as discussed above with respect to FIG. 8, the femto node 810 may facilitate a hand out from the femto node 810 to the macro node 805 by providing the AT 822 with an identifier such as a UATI. The femto node 810 also facilitate a hand out from the femto node 810 to the macro node 805 by transferring the data session to the macro node 805, as shown in FIG. 4. The femto node 810 may comprise a wireless network interface 1210 configured to transmit an outbound wireless message, such as a UATI assignment message, to the AT 822. The wireless network interface 1210 may also receive an inbound wireless message from the AT 822. Wireless network interface 1210 may be coupled to a processor 1220. The processor 1220 may be configured to process the UATI assignment message and the inbound and outbound wireless messages coming from or going to the AT 822 via the wireless network interface 1210. The processor 1220 may also be configured to control other components of the femto node 810. The processor 1220 may be further coupled to a wired network interface 1230. The wired network interface 1230 may be configured to pass an outbound wired message to, and receive an inbound wired message from, the Internet 840. The wired network interface 1230 may pass the inbound wired message to the processor 1220 for processing. The processor 1220 may process and pass the wired outbound message to the wired network interface 1210 for transmission. For example, the processor 1220 may be configured to process data session transfer messages coming from or going to the macro node 805, as described with respect to FIG. 6.

The processor 1220 may further be coupled, via one or more buses, to a memory 1240. The processor 1220 may read information from or write information to the memory 1240. For example, the memory 1240 may be configured to store inbound or outbound messages before, during, or after processing. In particular, the memory 1240 may be configured to store the UATI assignment message and/or data session transfer messages. The processor 1220 may also be coupled to a message formatter 1250. The message formatter 1250 may be configured to generate the UATI assignment message used to facilitate a hand out from the femto node 810 to the macro node 805. As described above with respect to FIG. 9A, the UATI assignment message may comprise one or more of a color code, femto BSC_ID, and ATID. The message formatter 1250 may pass the generated UATI assignment message to processor 1220 for any additional processing before the UATI assignment message is transmitted via the wireless network interface 1210 to AT 822. The message formatter 1250 may also be coupled directly to the memory 1240 in order to store or retrieve information for use in message formatting.

The wireless network interface 1210 may comprise an antenna and a transceiver. The transceiver may be configured to modulate/demodulate the wireless outbound/inbound messages going to or coming from AT 822 respectively. The wireless outbound/inbound messages may be transmitted/received via the antenna. The antenna may be configured to send and/or receive the outbound/inbound wireless messages to/from the AT 822 over one or more channels. The outbound/inbound messages may comprise voice and/or data-only information (collectively referred to herein as "data"). The wireless network interface 1210 may demodulate the data received. The wireless network interface 1210 may modulate data to be sent from the femto node 810 via the wireless network interface 1210. The processor 1220 may provide data to be transmitted.

The wired network interface 1230 may comprise a modem. The modem may be configured to modulate/demodulate the outbound/inbound wired messages going to or coming from the Internet 840. The wired network interface 1230 may demodulate data received. The demodulated data may be transmitted to the processor 1220. The wired network interface 1230 may modulate data to be sent from the femto node 810 via the wired network interface 1230. The processor 1220 may provide data to be transmitted.

The memory 1240 may comprise a processor cache, including a multi-level hierarchical cache in which different levels have different capacities and access speeds. The memory 1240 may also comprise random access memory (RAM), other volatile storage devices, or non-volatile storage devices. The storage may include hard drives, optical discs, such as compact discs (CDs) or digital video discs (DVDs), flash memory, floppy discs, magnetic tape, and Zip drives.

Although described separately, it is to be appreciated that functional blocks described with respect to the femto node 810 need not be separate structural elements. For example, the processor 1220 and the memory 1240 may be embodied in a single chip. The processor 1220 may additionally, or in the alternative, contain memory, such as processor registers. Similarly, one or more of the functional blocks or portions of the functionality of various blocks may be embodied in a single chip. Alternatively, the functionality of a particular block may be implemented on two or more chips.

One or more of the functional blocks and/or one or more combinations of the functional blocks described with respect to the femto node 810, such as processor 1220 and message formatter 1250, may be embodied as a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. One or more of the functional blocks and/or one or more combinations of the functional blocks described with respect to the femto node 810 may also be implemented as a combination of computing devices, e.g., a combination of a DSP and a microprocessor, a plurality of microprocessors, one or more microprocessors in conjunction with a DSP communication, or any other such configuration.

Figure 13:
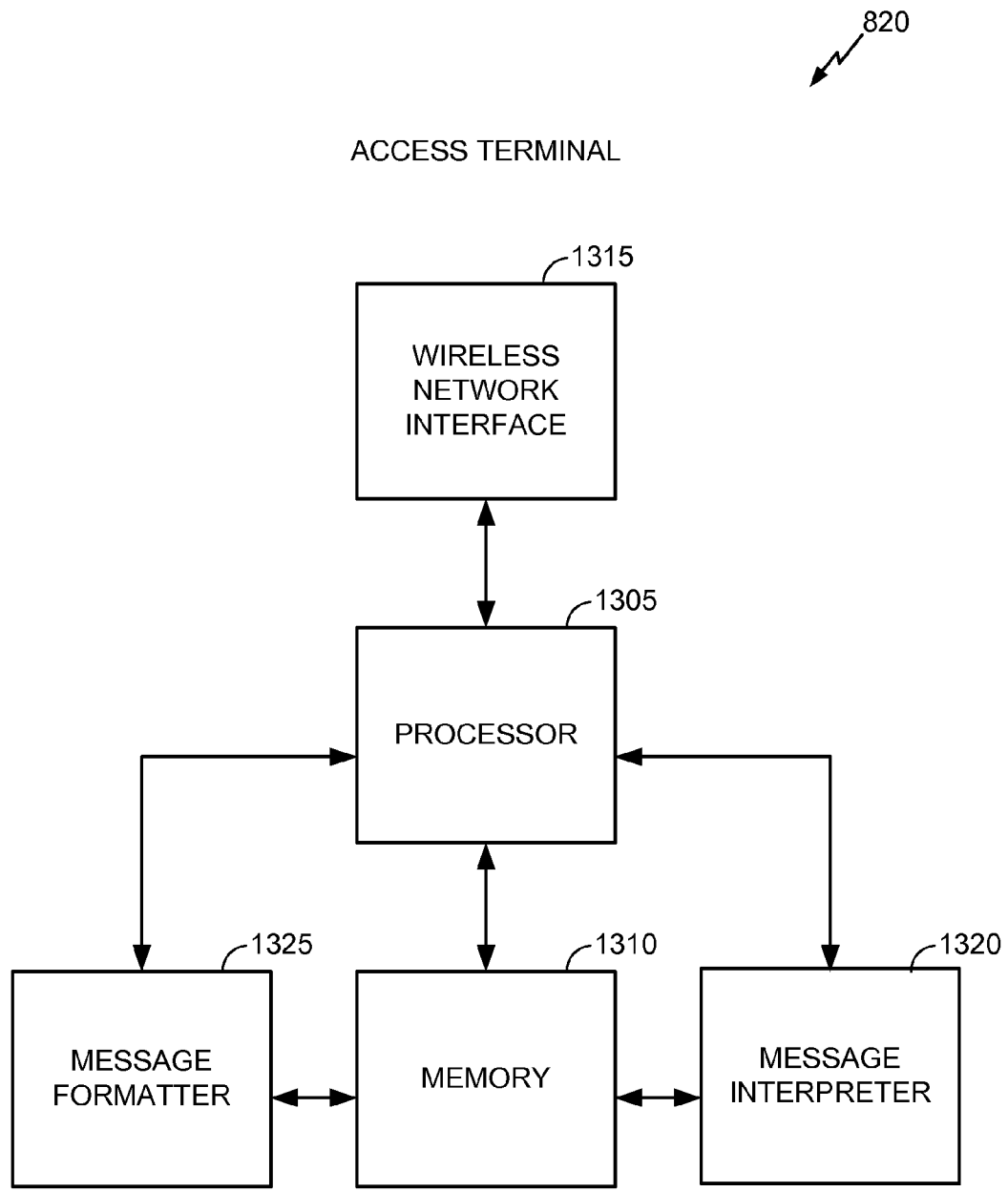
FIG. 13 is a functional block diagram of an exemplary access terminal shown in FIG. 8.

FIG. 13 is a functional block diagram of an exemplary access terminal 822 shown in FIG. 8. As discussed above, the AT 822 may be a mobile phone. The AT 822 may be used to facilitate a hand out from the femto node 810 to the macro node 805 by receiving a UATI from the femto node 810 and passing the identifying information in the UATI to the macro node 805.

The AT 822 may comprise a processor 1305 configured to process information for storage, transmission, and/or for the control of other components of the AT 822. The processor 1305 may further be coupled to a memory 1310. The processor may read information from or write information to the memory 1310. The memory 1310 may be configured to store messages before, during or after processing. In particular, the memory 1310 may be configured to store the UATI and the accompanying identifying information. The processor 1305 may also be coupled to a wireless network interface 1315. The wireless network interface 1315 may be configured to receive and inbound wireless message from, and transmit an outbound wireless message to the femto node 810 or the macro node 805. The inbound wireless message may be passed to the processor 1305 for processing. The processor 1305 may process the outbound wireless message passing the outbound wireless message to the wireless network interface 1315 for transmission.

The processor 1305 may also be coupled to a message interpreter 1320. The inbound wireless message received at the wireless network interface 1315 from the femto node 810 may be passed to the processor 1305 and passed by the processor 1305 to the message interpreter 1320 for additional processing. For example, the message interpreter 1320 may be configured to extract the lower UATI and color code from the UATI assignment message for use in identifying the AT 822 as described above. The message interpreter 1320 may pass the UATI, color code, and other information to the processor 1305 for additional processing. The message interpreter 1320 may also interpret information in a request message received from the macro node 805. For example, as described above, the macro node 805 may send a request message to the AT 822 requesting additional information about the femto node 810. In particular, the macro node 805 may request the color code and lower UATI. The message interpreter 1320 may process this request message and provide the processor 1305 with information for responding to the request message. The message interpreter 1320 may also be coupled to the memory 1310 to store or retrieve information for use in message interpreting.

The processor 1305 may also be coupled to a message formatter 1325. The message formatter 1325 may generate or format the outbound wireless message to be transmitted by the wireless network interface 1315. For example, the message formatter 1325 may be configured to include the lower UATI and color code in the outbound wireless message to the macro node 805. As described above, the message formatter 1325 may be configured to include the lower UATI and color code in an outbound wireless message requesting handout from the femto node 810 to the macro node 805. The wireless outbound message may be passed by the message formatter 1325 to the processor 1305 for transmission by the wireless network interface 1315 to the macro node 805. The macro node 805 may then use the information in the outbound wireless message, including the lower UATI and color code, to facilitate identification of the source access node as described above. The message formatter 1325 may be coupled directly to the memory 1310 in order to store or retrieve information for use in message formatting.

The wireless network interface 1315 may comprise an antenna and a transceiver. The transceiver may be configured to modulate/demodulate the outbound/inbound wireless messages going to or coming from femto node 810 and the macro node 805. The outbound/inbound wireless messages may be transmitted/received via the antenna. The antenna may be configured to communicate with the femto node 810 and macro node 805 over one or more channels. The outbound/inbound wireless message may comprise voice and/or data-only information (collectively referred to herein as "data"). The wireless network interface 1315 may demodulate the data received. The wireless network interface 1315 may modulate data to be sent from the AT 822 via the wireless network interface 1315. The processor 1305 may provide data to be transmitted.

The memory 1310 may comprise a processor cache, including a multi-level hierarchical cache in which different levels have different capacities and access speeds. The memory 1310 may also comprise random access memory (RAM), other volatile storage devices, or non-volatile storage devices. The storage may include hard drives, optical discs, such as compact discs (CDs) or digital video discs (DVDs), flash memory, floppy discs, magnetic tape, and Zip drives.

Although described separately, it is to be appreciated that functional blocks described with respect to the access terminal 822 need not be separate structural elements. For example, the processor 1305 and the memory 1310 may be embodied in a single chip. The processor 1305 may additionally, or in the alternative, contain memory, such as processor registers. Similarly, one or more of the functional blocks or portions of the functionality of various blocks may be embodied in a single chip. Alternatively, the functionality of a particular block may be implemented on two or more chips.

One or more of the functional blocks and/or one or more combinations of the functional blocks described with respect to the AT 822, such as processor 1310, message interpreter 1320, and message formatter 1325 may be embodied as a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. One or more of the functional blocks and/or one or more combinations of the functional blocks described with respect to the AT 822 may also be implemented as a combination of computing devices, e.g., a combination of a DSP and a microprocessor, a plurality of microprocessors, one or more microprocessors in conjunction with a DSP communication, or any other such configuration.

Figure 14:
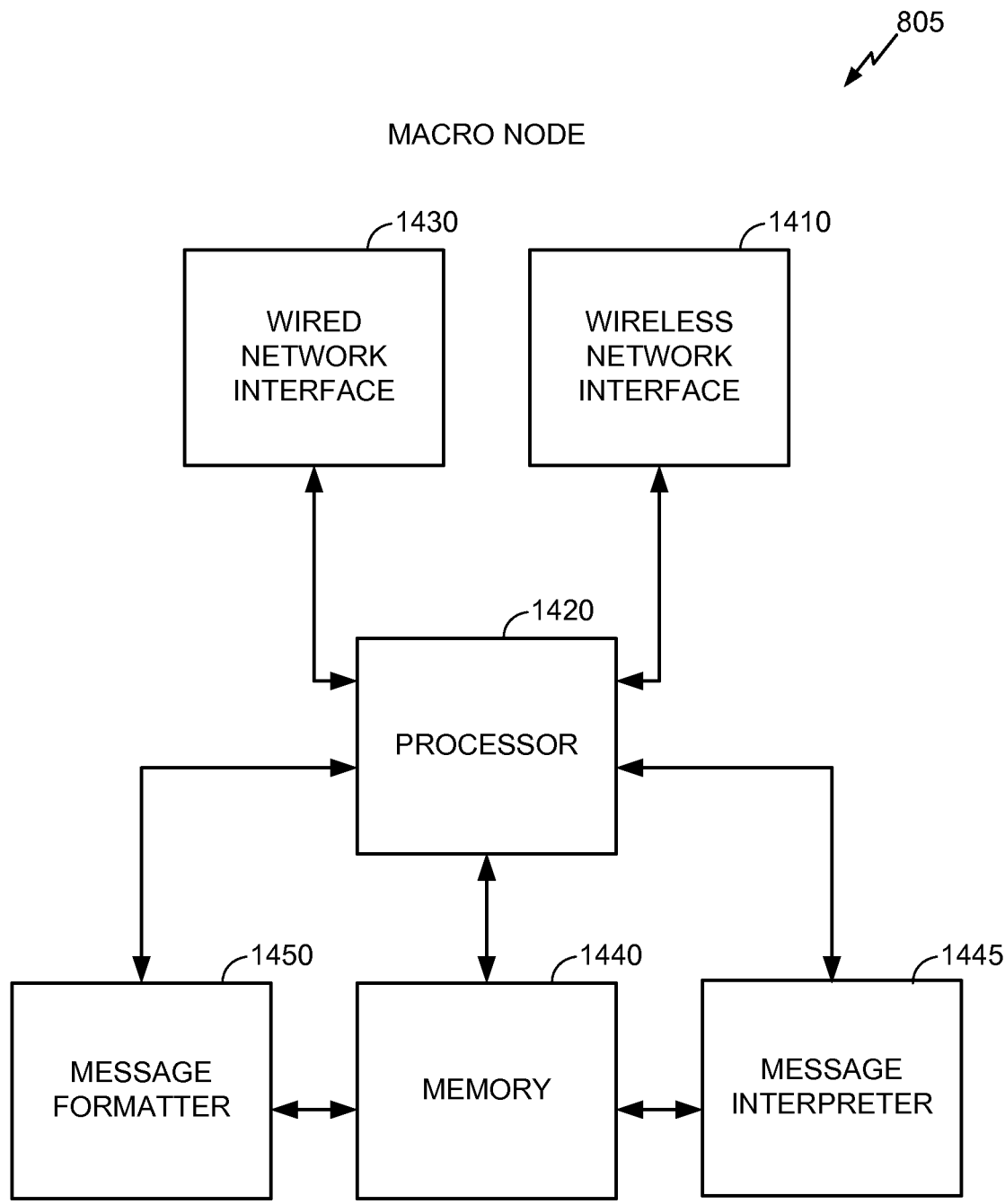
FIG. 14 is a functional block diagram of an exemplary macro node shown in FIG. 8.

FIG. 14 is a functional block diagram of an exemplary macro node 805 shown in FIG. 8. As discussed above with respect to FIG. 8, the macro node 805 may facilitate a hand out from the femto node 810 to the macro node 805 by receiving identifying information from the AT 822 and transmitting the identifying information to the FGW 852. In an embodiment, the macro node 805 may determine the address of the femto node 810 and transmit a data session transfer request to the femto node 810. The macro node 805 may comprise a wireless network interface 1410 configured to receive an inbound wireless message from and transmit an outbound wireless message to the AT 822. Wireless network interface 1410 may be coupled to the processor 1420. The processor 1420 may be configured to process the inbound and outbound wireless message coming from or going to the AT 822 via the wireless network interface 1410. The processor 1420 may also be configured to control other components of the macro node 805. The processor 1420 may be further coupled to a wired network interface 1430. The wired network interface 1430 may be configured to receive an inbound wired message from and to transmit an outbound wired message to the FGW 852. The wired network interface 1430 may receive an inbound wired message and pass the inbound wired message to the processor 1420 for processing. The processor 1420 may process an outbound wired message and pass the outbound wired message to the wired network interface 1430 for transmission to the FGW 852.

The processor 1420 may further be coupled, via one or more buses, to a memory 1440. The processor 1420 may read information from or write information to the memory 1440. The memory 1440 may be configured to store information for use in processing the inbound or outbound, wired or wireless message. The memory 1440 may also be configured to store identifying information such as the address, subnet, and color code of the macro node 805. The processor 1420 may also be coupled to a message interpreter 1445. The processor may pass the inbound wired and wireless message to the message interpreter 1445 for processing. The message interpreter 1445 may be configured to extract information from the inbound wireless message received at the wireless network interface 1410. For example, the inbound wireless message received from the AT 822 may comprise identifying information such as the lower UATI and the color code of a source AN, such as femto node 810. The message interpreter 1445 may extract the lower UATI and color code values from the inbound wireless message provided by AT 822. The message interpreter 1445 may pass this identifying information to the processor 1420 for additional processing. The message interpreter 1445 may be configured to process the inbound wireless message and to provide the processor 1420 with information for responding to the inbound wireless message by requesting additional information. The message interpreter 1445 may also be coupled directly to the memory 1440 in order to store or retrieve information for use in message interpretation.

The processor 1420 may also be coupled to a message formatter 1450. The message formatter 1450 may be configured to generate the outbound wired or wireless message. The message formatter 1450 may be further configured to pass the generated outbound wired or wireless message to the processor 1420. The processor 1420 may pass the outbound wired or wireless message to the wired network interface 1430 or the wireless network interface 1410 for transmission. The wired network interface 1430 may transmit the outbound wired message to the FGW 852. As described above, the outbound wired message may comprise a session transfer request including the UATI of AT 122. The message formatter 1450 may pass the outbound wireless message to the processor 1420. The processor 1420 may pass the outbound wireless message to the wireless network interface 1410 for transmission to the AT 822. As described above, the outbound wireless message may comprise a request for identifying information of a source AN, such as femto node 810. The message formatter 1450 may also be coupled directly to the memory 1440 in order to store or retrieve information for use in message formatting.

The wireless network interface 1410 may comprise an antenna and a transceiver. The transceiver may be configured to modulate/demodulate the outbound/inbound wireless messages going to or coming from the AT 822. The inbound/outbound wireless messages may be transmitted/received via the antenna. The antenna may be configured to send and/or receive the outbound/inbound wireless messages from the macro node 805 over one or more channels. The outbound/inbound wireless messages may comprise voice and/or data-only information (collectively referred to herein as "data"). The wireless network interface 1410 may demodulate the data received. The wireless network interface 1410 may modulate data to be sent from the macro node 805 via the wireless network interface 1410. The processor 1420 may provide data to be transmitted.

The wired network interface 1430 may comprise a modem. The modem may be configured to modulate/demodulate the outbound/inbound wired message going to or coming from the FGW 852. The wired network interface 1430 may demodulate the data received according to one or more wired standards using methods known in the art. The demodulated data may be transmitted to the processor 1420. The wired network interface 1430 may modulate data to be sent from the macro node 1410 via the wired network interface 1430 according to one or more wired standards using methods known in the art. The processor 1420 may provide data to be transmitted.

The memory 1440 may comprise a processor cache, including a multi-level hierarchical cache in which different levels have different capacities and access speeds. The memory 1440 may also comprise random access memory (RAM), other volatile storage devices, or non-volatile storage devices. The storage may include hard drives, optical discs, such as compact discs (CDs) or digital video discs (DVDs), flash memory, floppy discs, magnetic tape, and Zip drives.

Although described separately, it is to be appreciated that functional blocks described with respect to the macro node 805 need not be separate structural elements. For example, the processor 1420 and the memory 1440 may be embodied in a single chip. The processor 1420 may additionally, or in the alternative, contain memory, such as processor registers. Similarly, one or more of the functional blocks or portions of the functionality of various blocks may be embodied in a single chip. Alternatively, the functionality of a particular block may be implemented on two or more chips.

One or more of the functional blocks and/or one or more combinations of the functional blocks described with respect to the macro node 805, such as processor 1420, message interpreter 1445, and message formatter 1450, may be embodied as a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. One or more of the functional blocks and/or one or more combinations of the functional blocks described with respect to the macro node 805 may also be implemented as a combination of computing devices, e.g., a combination of a DSP and a microprocessor, a plurality of microprocessors, one or more microprocessors in conjunction with a DSP communication, or any other such configuration.

Figure 15:
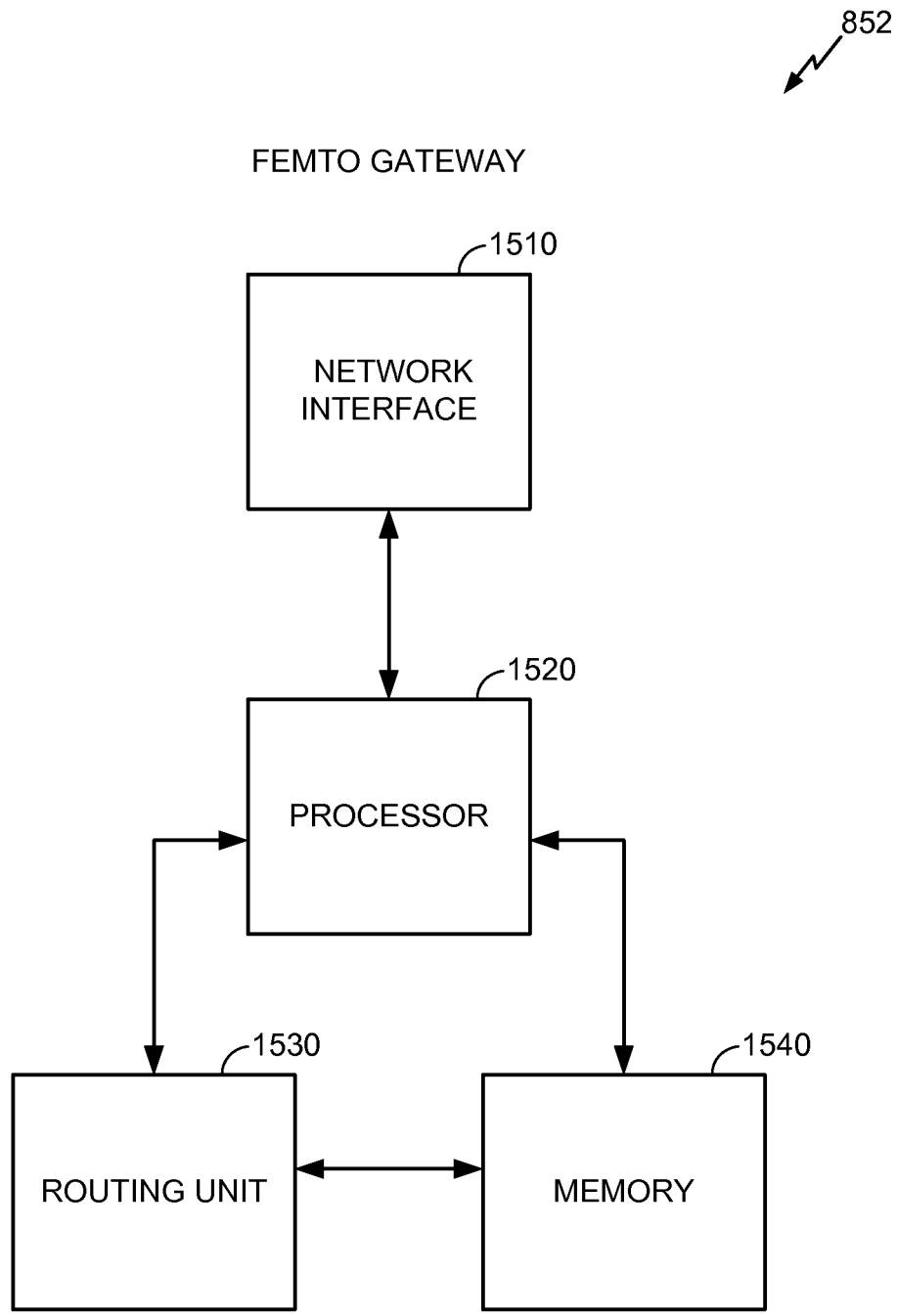
FIG. 15 is a functional block diagram of an exemplary femto gateway shown in FIG. 8.

FIG. 15 is a functional block diagram of an exemplary femto gateway (FGW) 852 shown in FIG. 8. As described above with respect to FIG. 8, the FGW 852 may operate as a router configured to route messages between the macro node 805 and the SGW 854. In addition, the FGW 852 may be configured to help identify hand in sources such as the femto node 810 by identifying the SGW associated with the femto node 810 based on an identifier such as an FGW ID, BSC ID, color code, subnet, etc. In an embodiment, the FGW 852 maps a color code and lower UATI to a UATI in order to determine the address of the femto node 810. The FGW 852 may comprise a network interface 1510 configured to receive an inbound message from and to transmit an outbound message to the macro node 805 or the femto node 810 via SGW 854. The network interface 1510 may be coupled to a processor 1520. The processor 1520 may be configured to process the inbound message received by and the outbound message transmitted by the network interface 1510. The processor 1520 may further be coupled, via one or more buses, to a memory 1525. The processor 1520 may read information from or write information to the memory 1525. The memory 1525 may be configured to store the inbound and outbound message before, during, or after processing. In particular, the memory 1525 may be configured to store an identifier such as the FGW ID, BSC ID, color code, subnet, etc.

The processor 1520 may be further coupled to a routing unit 1530. The processor 1520 may pass the inbound message to the routing unit 1530 for additional processing. The routing unit 1530 may analyze the inbound message to determine one or more destinations based, at least in part on the content of the inbound message. For example, the inbound message may contain the color code and/or BSC_ID of the femto node 810. The routing unit 1530 may analyze the color code and/or BSC_ID and determine that the femto node 810 is associated with the SGW 854. The routing unit 1530 may be directly coupled to the memory 1525 to facilitate making routing decisions. For example, the memory 1525 may store a data structure, e.g., a list or table, containing information associating BSC_ID values with addresses or other identifiers for SGWs. The routing unit 1530 may be configured to look up the identifiers for an SGW in the memory 1525 using the BSC_ID. The routing unit 1530 may also be configured to provide information to the processor 1520 such as an address or other identifier for the SGW 854 to which the BSC_ID and other information should be sent. The processor 1520 may be configured to use this information from the routing unit 1530 to generate the outbound message. The processor 1520 may pass the outbound message to the network interface 1510 for transmission to the SGW 854.

The network interface 1510 may comprise a modem. The modem may be configured to modulate/demodulate the outbound/inbound messages. The network interface 1510 may demodulate the data received according. The demodulated data may be transmitted to the processor 1520. The network interface 1510 may modulate data to be sent from the FGW 852. Data to be sent may be received from the processor 1520.

The memory 1525 may comprise a processor cache, including a multi-level hierarchical cache in which different levels have different capacities and access speeds. The memory 1525 may also comprise random access memory (RAM), other volatile storage devices, or non-volatile storage devices. The storage may include hard drives, optical discs, such as compact discs (CDs) or digital video discs (DVDs), flash memory, floppy discs, magnetic tape, and Zip drives.

Although described separately, it is to be appreciated that functional blocks described with respect to the FGW 852 need not be separate structural elements. For example, the processor 1520 and the memory 1525 may be embodied in a single chip. The processor 1520 may additionally, or in the alternative, contain memory, such as processor registers. Similarly, one or more of the functional blocks or portions of the functionality of various blocks may be embodied in a single chip. Alternatively, the functionality of a particular block may be implemented on two or more chips.

One or more of the functional blocks and/or one or more combinations of the functional blocks described with respect to the FGW 852, such as processor 1520 and routing unit 1530 may be embodied as a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. One or more of the functional blocks and/or one or more combinations of the functional blocks described with respect to the FGW 852 may also be implemented as a combination of computing devices, e.g., a combination of a DSP and a microprocessor, a plurality of microprocessors, one or more microprocessors in conjunction with a DSP communication, or any other such configuration.

Figure 16:
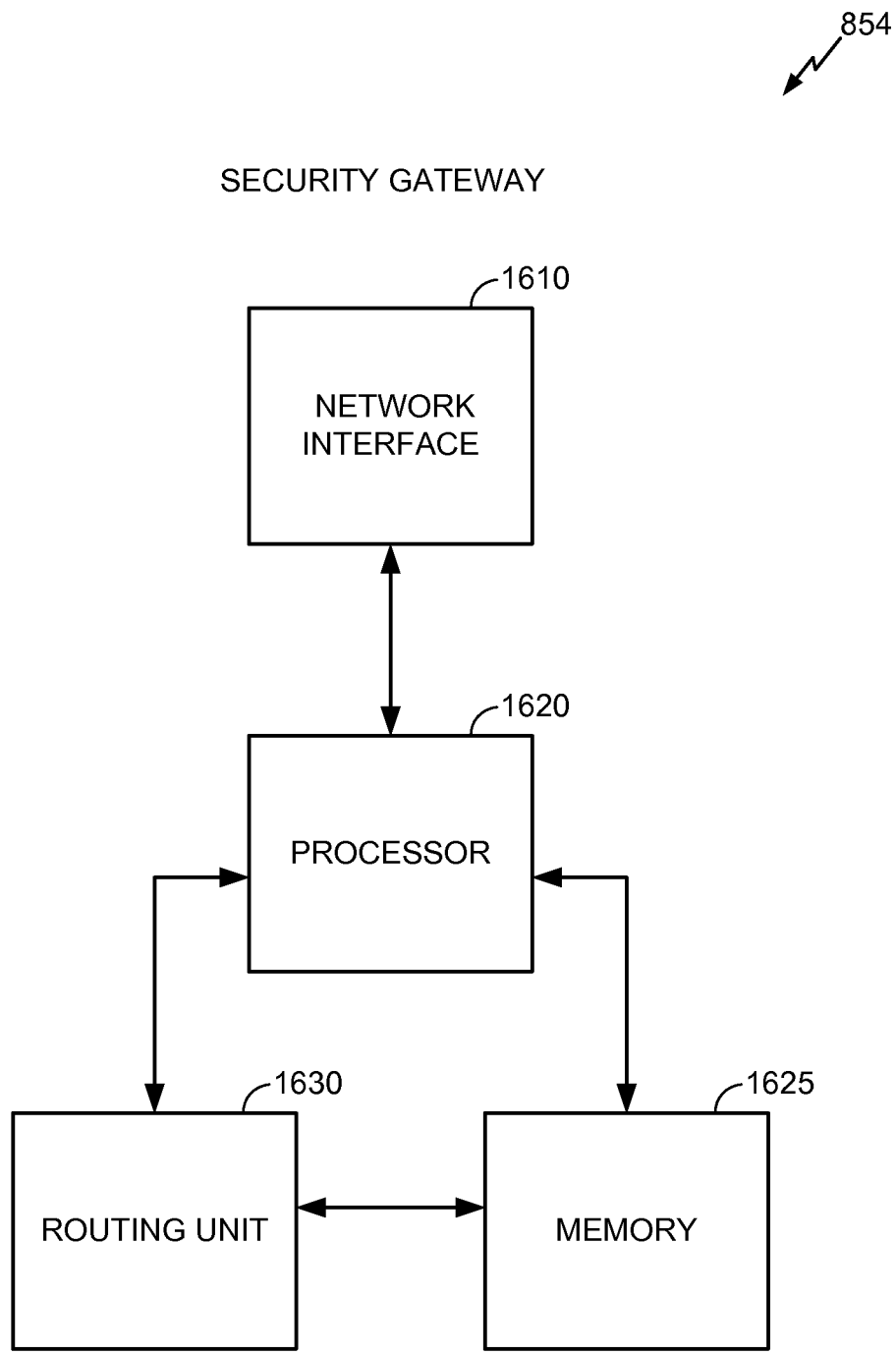
FIG. 16 is a functional block diagram of an exemplary security gateway shown in FIG. 8.

FIG. 16 is a functional block diagram of an exemplary security gateway shown in FIG. 8. As described above with respect to FIG. 8, the SGW 854 may operate as a transparent tunnel configured to route messages between the FGW 852 and the femto node 810 via Internet 840. The SGW 854 may comprise a network interface 1610 configured to receive an inbound message from and to transmit an outbound message to the FGW 852 or the femto node 810 via the Internet 840. The network interface 1610 may be coupled to a processor 1620. The processor 1620 may be configured to process the inbound and outbound messages. The processor 1620 may further be coupled, via one or more buses, to a memory 1625. The processor 1620 may read information from or write information to the memory 1625. The memory 1625 may be configured to store the inbound and outbound messages before, during, or after processing. In particular, the memory 1625 may be configured to store the color code and/or BSC_ID described above.

The processor 1620 may be further coupled to a routing unit 1630. The processor 1620 may pass the inbound message to the routing unit 1630 for additional processing. The routing unit 1630 may analyze the inbound message to determine one or more destinations based, at least in part on the content of the inbound message. For example, the inbound message may comprise a color code and/or BSC_ID. The routing unit 1630 may analyze the color code and/or BSC_ID and determine that the femto node is associated with the identifier. The routing unit 1630 may be directly coupled to the memory 1625 to facilitate making routing decisions. For example, the memory 1625 may store a data structure, e.g., a list or table, containing information associating color code and/or BSC_ID values with addresses or other identifiers for femto nodes. The routing unit 1630 may be configured to look up the identifiers for a femto node in the memory 1625 using the color code and/or BSC_ID. The routing unit 1630 may be configured to provide information to the processor 1620 such as an address or other identifier for the femto node that is the hand in source. The processor 1620 may be configured to use this information from the routing unit 1630 to generate the outbound message. The processor 1620 may pass the outbound message to the network interface 1610 for transmission to the Internet 840 or to the FGW 852.

The network interface 1610 may comprise a modem. The modem may be configured to modulate/demodulate the outbound/inbound messages going to or coming from the SGW 854. The network interface 1610 may demodulate the data received. The demodulated data may be transmitted to the processor 1620. The network interface 1610 may modulate data to be sent from the FGW 852. Data to be sent may be received from the processor 1620.

The memory 1625 may comprise a processor cache, including a multi-level hierarchical cache in which different levels have different capacities and access speeds. The memory 1625 may also comprise random access memory (RAM), other volatile storage devices, or non-volatile storage devices. The storage may include hard drives, optical discs, such as compact discs (CDs) or digital video discs (DVDs), flash memory, floppy discs, magnetic tape, and Zip drives.

Although described separately, it is to be appreciated that functional blocks described with respect to the SGW 854 need not be separate structural elements. For example, the processor 1620 and the memory 1625 may be embodied in a single chip. The processor 1620 may additionally, or in the alternative, contain memory, such as processor registers. Similarly, one or more of the functional blocks or portions of the functionality of various blocks may be embodied in a single chip. Alternatively, the functionality of a particular block may be implemented on two or more chips.

One or more of the functional blocks and/or one or more combinations of the functional blocks described with respect to the SGW 854, such as processor 1620 and routing unit 1630 may be embodied as a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. One or more of the functional blocks and/or one or more combinations of the functional blocks described with respect to the SGW 854 may also be implemented as a combination of computing devices, e.g., a combination of a DSP and a microprocessor, a plurality of microprocessors, one or more microprocessors in conjunction with a DSP communication, or any other such configuration.

B. DNS Address Resolution

Figure 17:
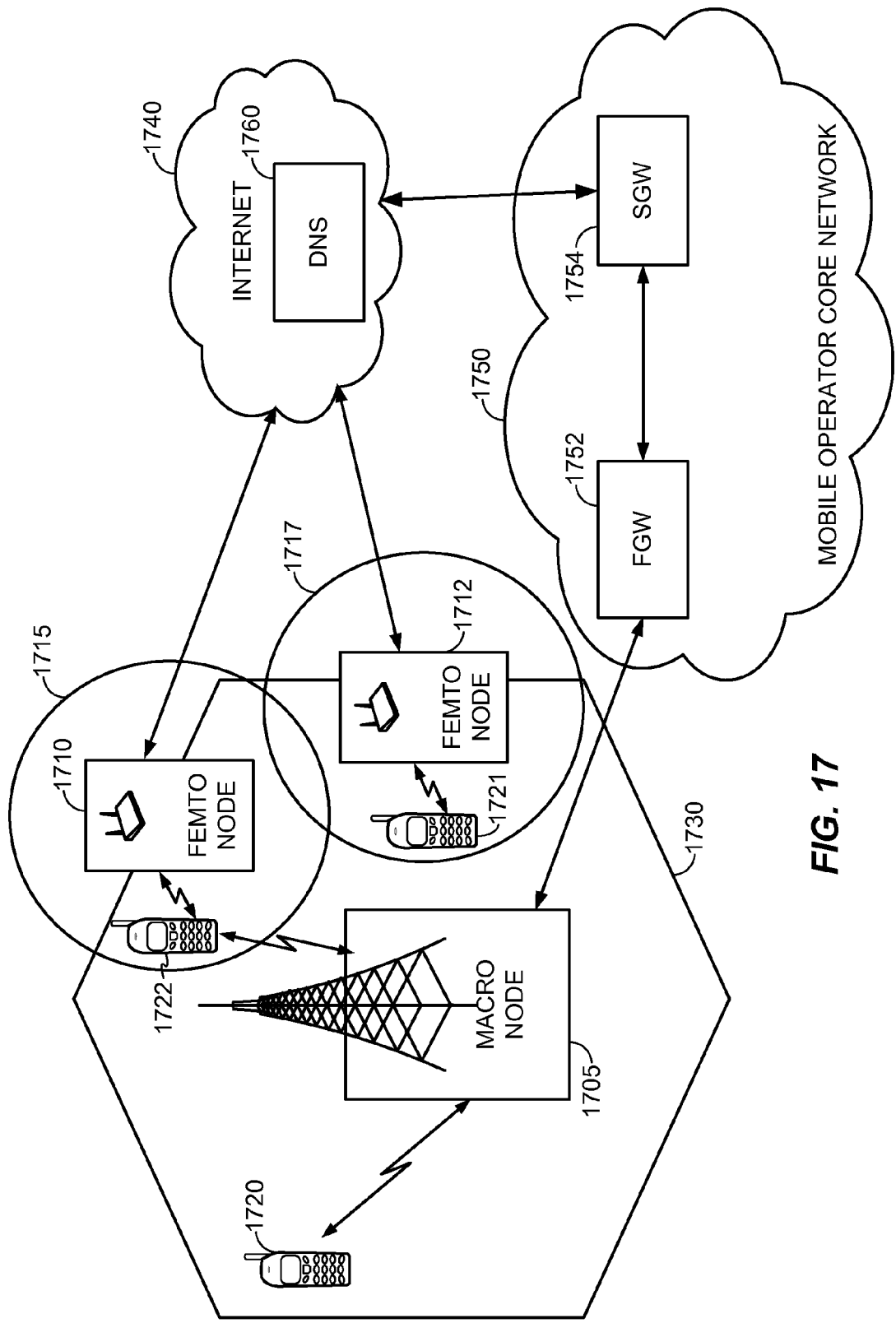
FIG. 17 illustrates exemplary interoperations of two or more communication networks implementing a domain name system.

In one embodiment, the communication network may incorporate a domain name system (DNS) in order to facilitate source access node address lookup during a handout procedure. FIG. 17 illustrates exemplary interoperations of two or more communication networks using a DNS 1760. In the illustrated embodiment, in which many elements may be generally similar to those shown in FIG. 8, macro node 1705 communicates with AT 1720 and AT 1722, all of which operate within macro area 1730. Femto node 1710 communicates with AT 1710, both of which operate within femto area 1715. Similarly, femto node 1712 communicates with AT 1721, both of which operate in femto area 1715. FGW 1752, operating in communication network 1750, may communicate with one or more of the macro node 1705, SGW 1754, and DNS 1760. The Internet 1740 may communicate with femto nodes 1710, 1712, and SGW 1754. In the illustrated embodiment, the DNS 1760 is connected to the Internet 1740. In other embodiments, the DNS 1760 may be co-located with other functions, such as FGW 1752 or SGW 1754, or may be deployed in a different location. In some embodiments, the DNS 1760 may be implemented as a server. In some embodiments, the DNS 1760 may be implemented as a function integrated with another element of the communication network. In some embodiments, more than one DNS is available. In some embodiments, hierarchical DNSs are available. In some embodiments, there is at least one DNS per macro subnet.

Figure 18:
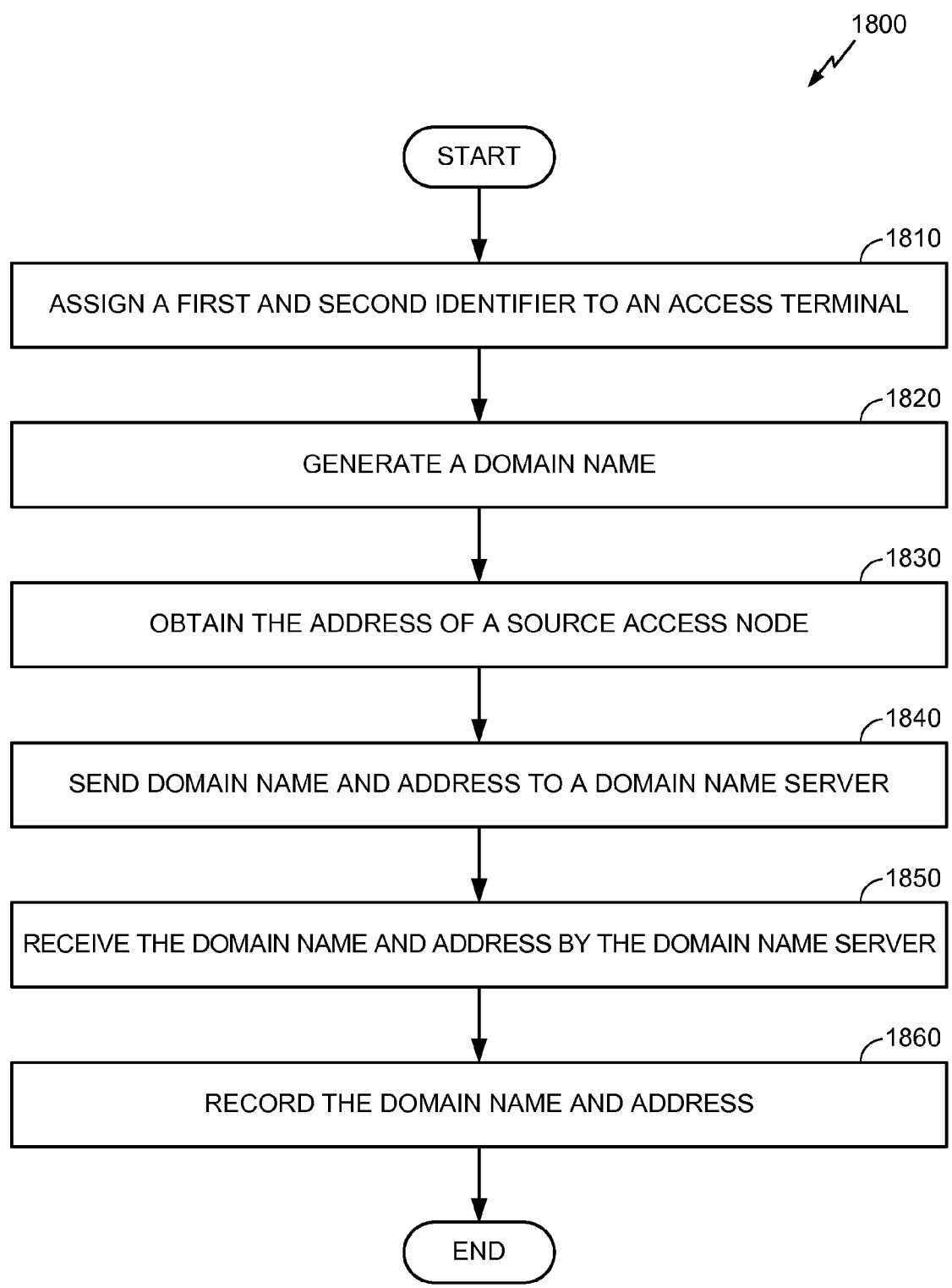
FIG. 18 is a flowchart of an exemplary process for registering an address of a source node shown in FIG. 17.

FIG. 18 is a flowchart of an exemplary process for registering an address of a source node shown in FIG. 17. As described above with respect to FIG. 17, the process 1800 may be used to register the address of a source node allowing later retrieval by a target node. In some embodiments, the source node may be femto node 1710 and the target node may be macro node 1705. To facilitate hand in a source node such as femto node 1710 may assign a first and second identifier to an AT such as AT 1722, as shown in step 1810. In some embodiments, the first identifier may comprise a color code. In other embodiments, the first identifier may comprise one or more bits from the upper UATI. In some embodiments, the second identifier may comprise one or more bits from the lower UATI.

Continuing to step 1820, the source node generates a domain name based upon the first and second identifiers. The domain name may be formatted as a character string. In one embodiment, the domain name may be in the form "uati32-<UATI32>.subnet-<subnet>.HRPD.RAN.<operator's domain>" where <UATI32> represents the 32 least significant bits of the UATI, <subnet> represents a character string identifying the subnet of the source node, and <operator's domain> represents a character string identifying the communication network operator's domain. The UATI32 may be formatted, for example, in a binary or hexadecimal representation. The domain name may include hard or soft-coded strings such as "HRPD" and "RAN" to signify, for instance an HRPD session in a radio area network (RAN). As an example, if the UATI32 is 0xF000F000, the subnet is "subnet A", and the operator's domain is "example.com", the domain name may be "uati32-F000F000.subnet-A.HRPD.RAN.example.com".

In another embodiment, the domain name may be in the form "uati24-<UATI24>.uati104-<UATI104>.HRPD.RAN.<operator's domain>" where <UATI24> represents the UATI24, <UATI104> represents the UATI104, and <operator's domain> represents a character string identifying the communication network operator's domain. For example, if the UATI24 is 0xF00F00, the UATI104 is 0x0123456789ABC, and the operator's domain is "example.com", the domain name may be "uati24-F00F00.uati104-0123456789ABC.HRPD.RAN.example.com". It will be understood that the foregoing embodiments are merely examples, and other domain names may be used.

Proceeding to step 1830, the source node obtains its IP address. In various embodiments, the source node may obtain its IP address from its wired or wireless network interface, accessing an IP address stored in a memory, or the like. Moving to step 1840, the source node sends a DNS registration request including the generated domain name and the IP address of the source node to a DNS such as DNS 1760. Then, in step 1850, the DNS receives the DNS registration request and extracts the domain name and the IP address of the source node. Finally, in step 1860, the DNS associates the IP address of the source node with the provided domain name in a memory.

Figure 19:
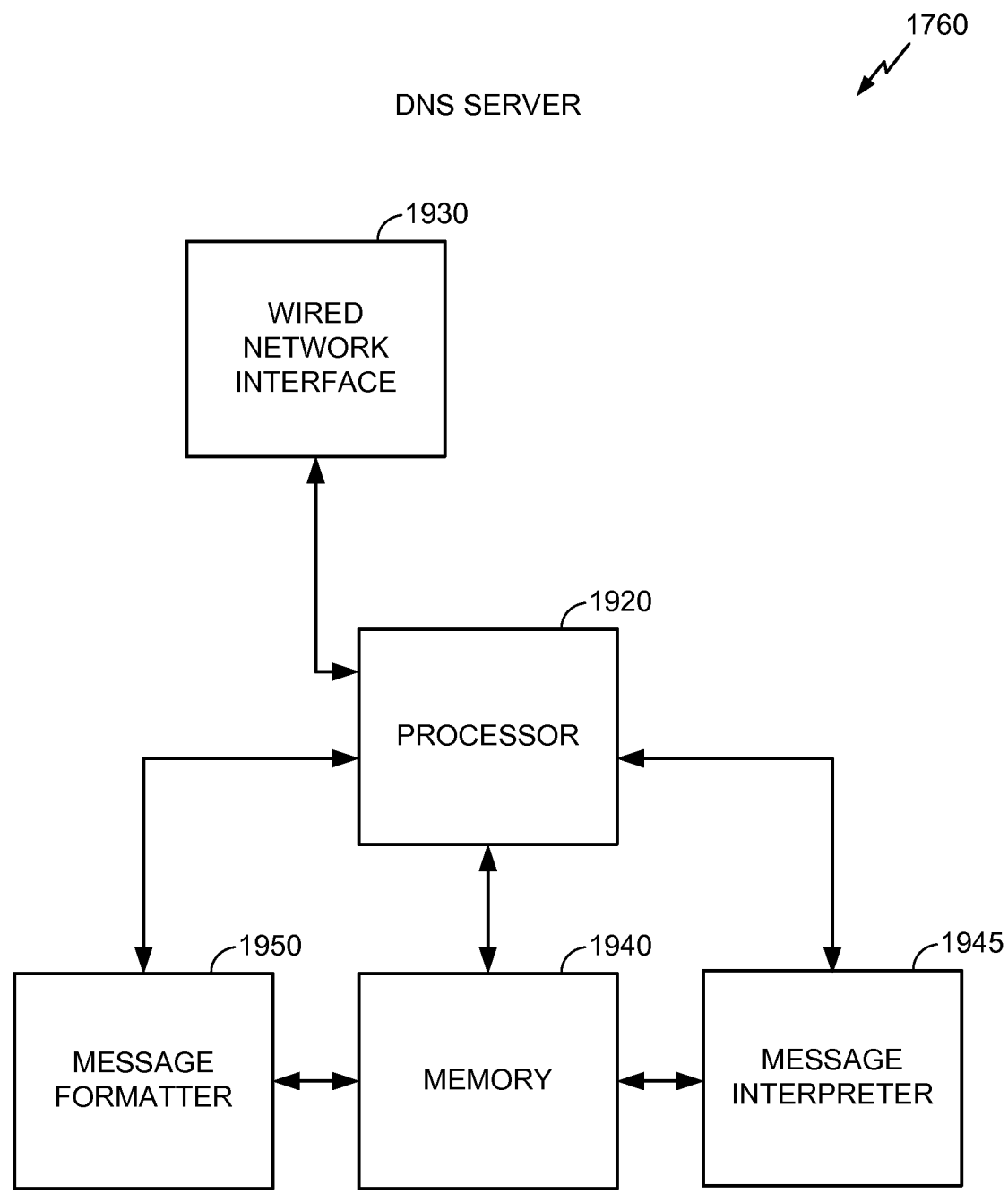
FIG. 19 is a functional block diagram of an exemplary domain name system shown in FIG. 17.

FIG. 19 is a functional block diagram of an exemplary DNS 1760 shown in FIG. 17. As discussed above with respect to FIG. 17, the DNS 1760 may facilitate a hand out from the femto node 1710 to the macro node 1705 by recording the address of the femto node 1710 via a registration procedure and supplying the address of the femto node 1710 to the macro node 1705 via a DNS query procedure. The DNS 1760 may comprise a processor 1920 coupled to a wired network interface 1930. The wired network interface 1930 may be configured to receive an inbound wired message from and to transmit an outbound wired message to an address. The wired network interface 1930 may receive an inbound wired message and pass the inbound wired message to the processor 1920 for processing. The processor 1920 may process an outbound wired message and pass the outbound wired message to the wired network interface 1930 for transmission to an address. For example, during a domain registration procedure, the wired network interface 1930 may receive a domain registration request from the femto node 1710 and pass the domain registration request to the processor 1920 for processing. During a DNS query procedure, the wired network interface 1930 may receive a DNS query from the macro node 1705 and pass the DNS query to the processor 1920 for processing. The processor 1920 may pass formatted responses to the wired network interface 1930 for transmission to, for example, the femto node 1710 and/or the macro node 1705.

The processor 1920 may further be coupled, via one or more buses, to a memory 1940. The processor 1920 may read information from or write information to the memory 1940. The memory 1940 may be configured to store information for use in processing the inbound or outbound wired message. The memory 1940 may also be configured to store domain information such as a domain name and an associated IP address. The processor 1920 may also be coupled to a message interpreter 1945. The processor may pass the inbound wired message to the message interpreter 1945 for processing. The message interpreter 1945 may be configured to extract information from the inbound wired message received at the wired network interface 1930. For example, the inbound DNS registration request received from femto node 1710 may comprise domain information such as a domain name and an IP address. The message interpreter 1945 may extract the domain name and the IP address from the inbound wired message provided by femto node 1710. The message interpreter 1945 may pass this identifying information to the processor 1920 for additional processing. The message interpreter 1945 may also be coupled directly to the memory 1940 in order to store or retrieve information for use in message interpretation.

The processor 1920 may also be coupled to a message formatter 1950. The message formatter 1950 may be configured to generate the outbound wired message. The message formatter 1950 may be further configured to pass the generated outbound wired message to the processor 1920. The processor 1920 may pass the outbound wired message to the wired network interface 1930 for transmission. The wired network interface 1930 may transmit the outbound wired message to, for example, the femto node 1710 and/or the macro node 1705. The outbound wired message may comprise a DNS registration response, such as an acknowledgement or a negative acknowledgement. The outbound wired message may also comprise a DNS query response, including an IP address of the queried domain name. The message formatter 1950 may also be coupled directly to the memory 1940 in order to store or retrieve information for use in message formatting.

The wired network interface 1930 may comprise a modem. The modem may be configured to modulate/demodulate the outbound/inbound wired message going to or coming from a network address. The wired network interface 1930 may demodulate the data received according to one or more wired standards using methods known in the art. The demodulated data may be transmitted to the processor 1920. The wired network interface 1930 may modulate data to be sent from the macro node 1910 via the wired network interface 1930 according to one or more wired standards using methods known in the art. The processor 1920 may provide data to be transmitted.

The memory 1940 may comprise a processor cache, including a multi-level hierarchical cache in which different levels have different capacities and access speeds. The memory 1940 may also comprise random access memory (RAM), other volatile storage devices, or non-volatile storage devices. The storage may include hard drives, optical discs, such as compact discs (CDs) or digital video discs (DVDs), flash memory, floppy discs, magnetic tape, and Zip drives.

Although described separately, it is to be appreciated that functional blocks described with respect to the DNS 1760 need not be separate structural elements. For example, the processor 1920 and the memory 1940 may be embodied in a single chip. The processor 1920 may additionally, or in the alternative, contain memory, such as processor registers. Similarly, one or more of the functional blocks or portions of the functionality of various blocks may be embodied in a single chip. Alternatively, the functionality of a particular block may be implemented on two or more chips.

One or more of the functional blocks and/or one or more combinations of the functional blocks described with respect to the DNS 1760, such as processor 1920, message interpreter 1945, and message formatter 1950, may be embodied as a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. One or more of the functional blocks and/or one or more combinations of the functional blocks described with respect to the DNS 1760 may also be implemented as a combination of computing devices, e.g., a combination of a DSP and a microprocessor, a plurality of microprocessors, one or more microprocessors in conjunction with a DSP communication, or any other such configuration.

Figure 20:
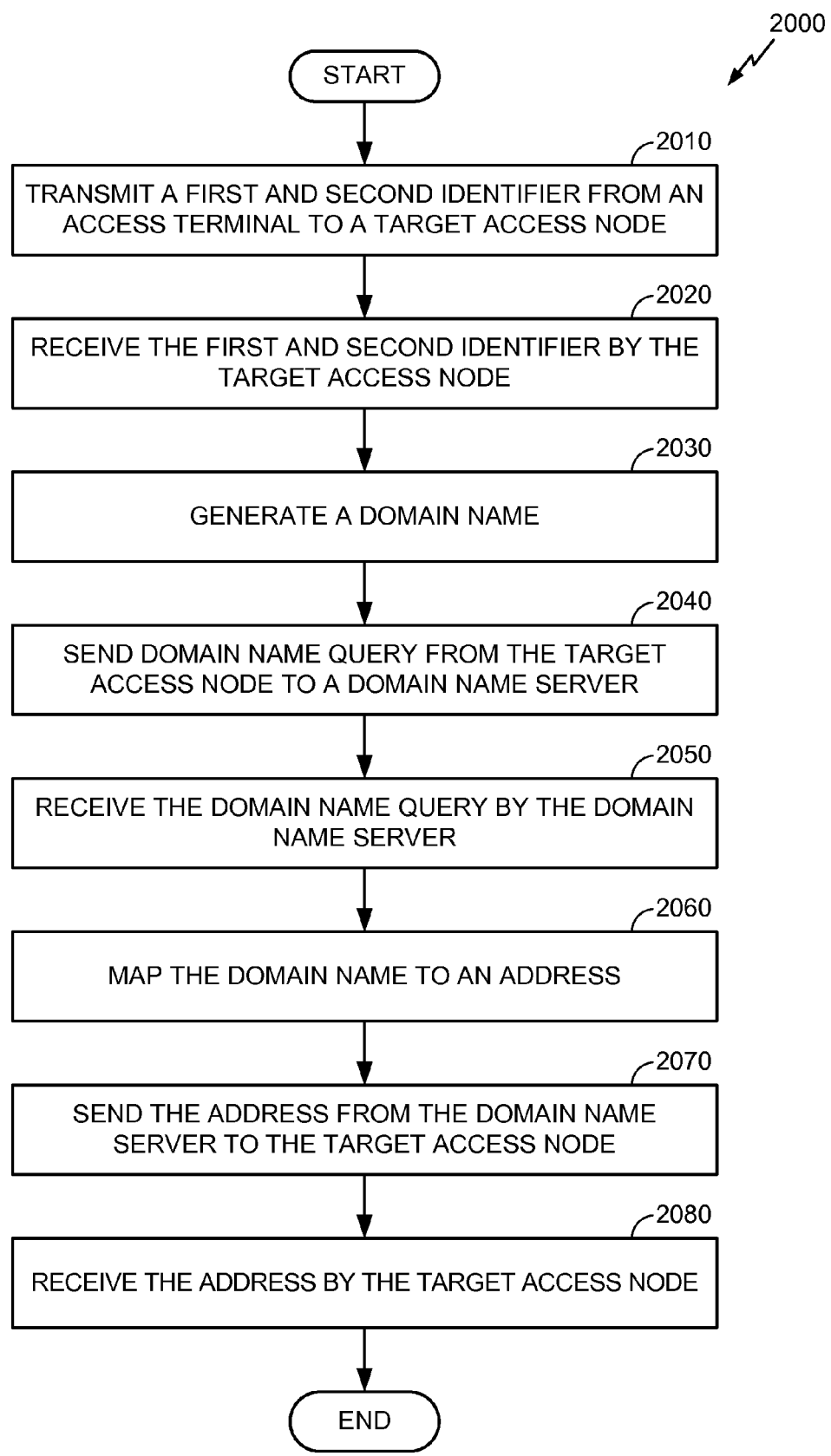
FIG. 20 is a flowchart of an exemplary process for identifying an address of a source node shown in FIG. 17.

FIG. 20 is a flowchart of an exemplary process for identifying an address of a source node shown in FIG. 17. As described with respect to FIG. 17, the process 2000 may be used to help identify the address of a source node during a hand in process to a target node. To facilitate hand in, an AT such as AT 1722 transmits a first and second identifier to a target access node such as macro node 1705, as shown in step 2010. The first identifier may comprise the color code that the AT 1722 previously received from the femto node1 810. Alternatively, the first identifier may comprise one or more bits of the upper UATI that the AT 1722 previously received from the femto node 1710. The second identifier may comprise the lower UATI that the AT 1722 previously received from the femto node 1710. In an embodiment, the femto node 1710 may have generated a UATI and assigned the UATI to the AT 1722. The femto node 1710 may have generated a domain name based on the first and second identifiers and registered its IP address and domain name with the DNS 1760. Proceeding to step 2020, the target access node receives the first and second identifier.

Continuing to step 2030, the source node generates a domain name based upon the first and second identifiers. The domain name may be formatted as a character string. In one embodiment, the domain name may be in the form "uati32-<UATI32>.subnet-<subnet>.HRPD.RAN.<operator's domain>" where <UATI32> represents the 32 least significant bits of the UATI, <subnet> represents a character string identifying the subnet of the source node, and <operator's domain> represents a character string identifying the communication network operator's domain. The UATI32 may be formatted, for example, in a binary or hexadecimal representation. The domain name may include hard or soft-coded strings such as "HRPD" and "RAN" to signify, for instance an HRPD session in a radio area network (RAN). As an example, if the UATI32 is 0xF000F000, the subnet is "subnet A", and the operator's domain is "example.com", the domain name may be "uati32-F000F000.subnet-A.HRPD.RAN.example.com".

In another embodiment, the domain name may be in the form "uati24-<UATI24>.uati104-<UATI104>.HRPD.RAN.<operator's domain>" where <UATI24> represents the UATI24, <UATI104> represents the UATI104, and <operator's domain> represents a character string identifying the communication network operator's domain. For example, if the UATI24 is 0xF00F00, the UATI104 is 0x0123456789ABC, and the operator's domain is "example.com", the domain name may be "uati24-F00F00.uati104-0123456789ABC.HRPD.RAN.example.com". It will be understood that the foregoing embodiments are merely examples, and other domain names may be used.

Proceeding to step 2040, the target node sends a domain name query to a DNS such as DNS 1760. In step 2050, the DNS receives the DNS query and extracts the domain name from the query. Then, in step 2060, the DNS maps the domain name to the IP address of the source node. In an embodiment, the DNS performs a lookup based upon the domain name and retrieves the associated IP address from memory. Moving to step 2070, the DNS formats a query response including the IP address of the source node and sends the response to the target access node.

Finally, in step 2080, the target access node receives the query response from the DNS. In an embodiment, the target access node extracts the IP address of the source node from the query response. In an embodiment, the target access node may send a session transfer request to the IP address of the source node, and proceeds as shown in FIG. 6.

C. Proxy

Figure 21:
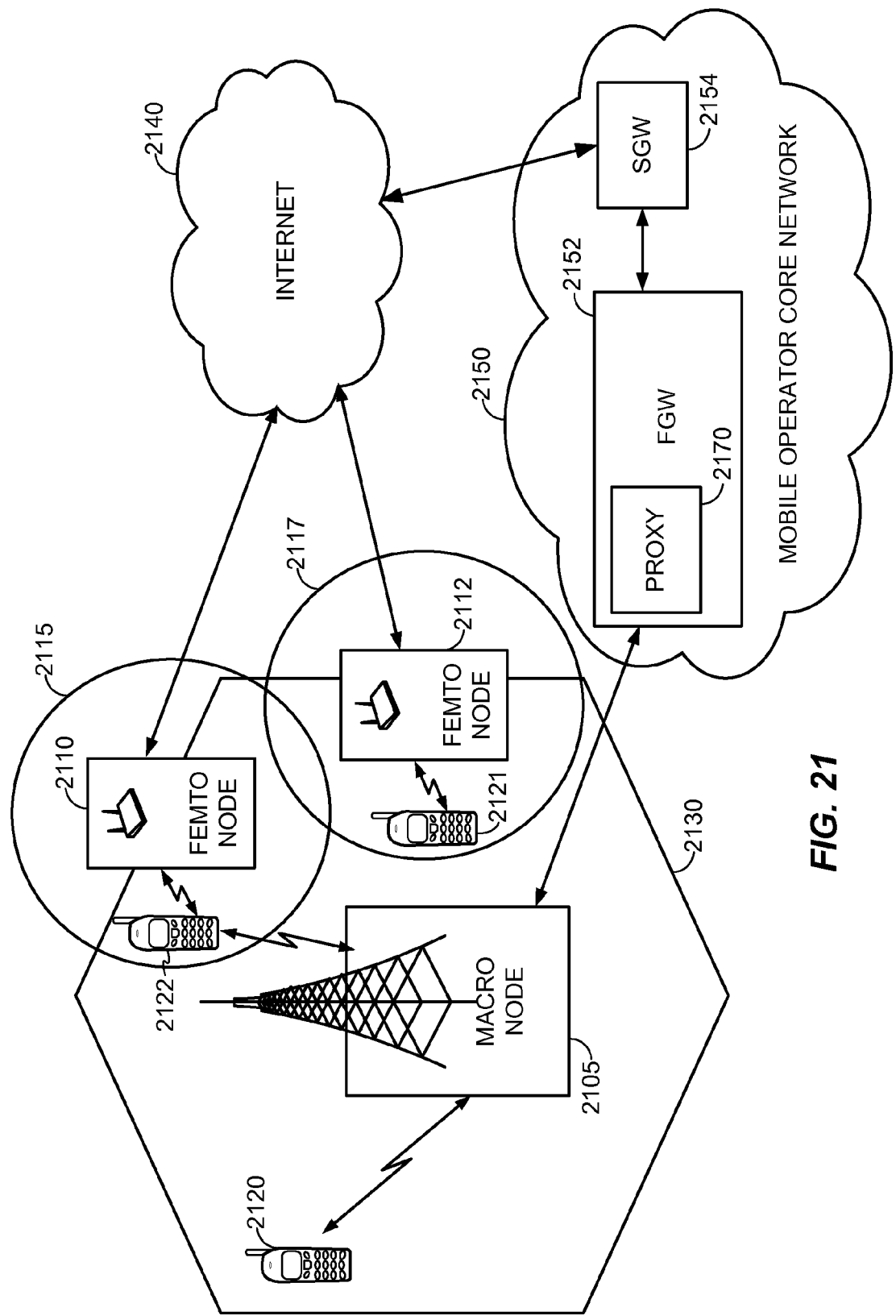
FIG. 21 illustrates exemplary interoperations of two or more communication networks.

In one embodiment, the communication network may incorporate a proxy in order to facilitate communication between a target access node and a source access node during a handout procedure. FIG. 21 illustrates exemplary interoperations of two or more communication networks implementing a proxy 2170. In the illustrated embodiment, in which many elements may be generally similar to those shown in FIG. 8, macro node 2105 communicates with AT 2120 and AT 2122, all of which operate within macro area 2130. Femto node 2110 communicates with AT 2110, both of which operate within femto area 2115. Similarly, femto node 2112 communicates with AT 2121, both of which operate in femto area 171. FGW 2152, operating in communication network 2150, may communicate with one or more of the macro node 2105, SGW 2154, and a proxy 2170. The Internet 2140 may communicate with femto nodes 2110, 2112, and SGW 2154.

In the illustrated embodiment, the proxy 2170 is co-located with the FGW, and communicates with the macro node 2105 and the SGW 2154. In other embodiments, the proxy 2170 may be co-located with other functions, may operate as a stand-alone element, or may be deployed in a different location. In some embodiments, the proxy 2170 may be implemented as a server. In some embodiments, the proxy 2170 may be implemented as a function integrated with another element of the communication network. In some embodiments, more than one proxy is available. In some embodiments, the proxy 2170 is a proxy for A13 messages.

In some embodiments, the proxy 2170 may act as a stateful proxy. In acting as a stateful proxy, the proxy 2170 may maintain a record the state of communications between two nodes. The proxy 2170 may allow a target node to send a message to a source node without determining the address of the source node. For example, the proxy 2170 may statefully facilitate communication between macro node 2105 and femto node 2110 without the macro node 2105 obtaining the address of femto node 2110. In an embodiment, macro node 2105 may statefully communicate with the proxy 2170 as if the proxy were another macro node. The proxy may communicate with femto node 2110 on the behalf of macro node 2105. As such, in communicating with femto node 2110 through the proxy 2170, the macro node 2105 may follow the same steps and/or procedures as it would if there were no femto nodes and/or proxies in the communication network. In an embodiment, the proxy 2170 may alter messages from the macro node 2105 such that they appear to originate from the proxy 2170. Furthermore, the proxy 2170 may alter messages from the macro node 2105 such that responses from the femto node 2110 are intercepted by the proxy 2170. The proxy 2170 may statefully communicate with the macro node 2105 on behalf of the femto node 2110. As such, in communicating with macro node 2105 through the proxy 2170, the femto node 2105 may follow the same steps and/or procedures as it would if there were no proxies in the communication network.

In some embodiments, the proxy 2170 may act as a stateless proxy. In acting as a stateless proxy, the proxy 2170 may facilitate communication between two nodes without maintaining a record of the state of that communication. The proxy 2170 may allow a target node to send a message to a source node without initially determining the address of the source node. For example, the proxy 2170 may statelessly facilitate communication between macro node 2105 and femto node 2110 without the macro node 2105 initially obtaining the address of femto node 2110. In an embodiment, macro node 2105 may communicate with the proxy 2170 as if the proxy were another macro node. The proxy may communicate with femto node 2110 on the behalf of macro node 2105. As such, in initially communicating with femto node 2110 through the proxy 2170, the macro node 2105 may follow the same steps and/or procedures as it would if there were no femto nodes and/or proxies in the communication network. In an embodiment, the proxy 2170 may forward messages from the macro node 2105 such that they appear to originate from the macro node 2105. Thus, the femto node 2110 may obtain the address of the macro node 2105 and may send responses directly to the macro node 2105, bypassing the proxy 2170. Responses from the femto node 2110 to the macro node 2105 may contain information identifying the address of the femto node 2110. The macro node 2105 may receive responses from the femto node 2110 and determine the address of the femto node 2110. The macro node 2105 may send subsequent messages directly to the femto node 2110, bypassing the proxy 2170.

Figure 22A:
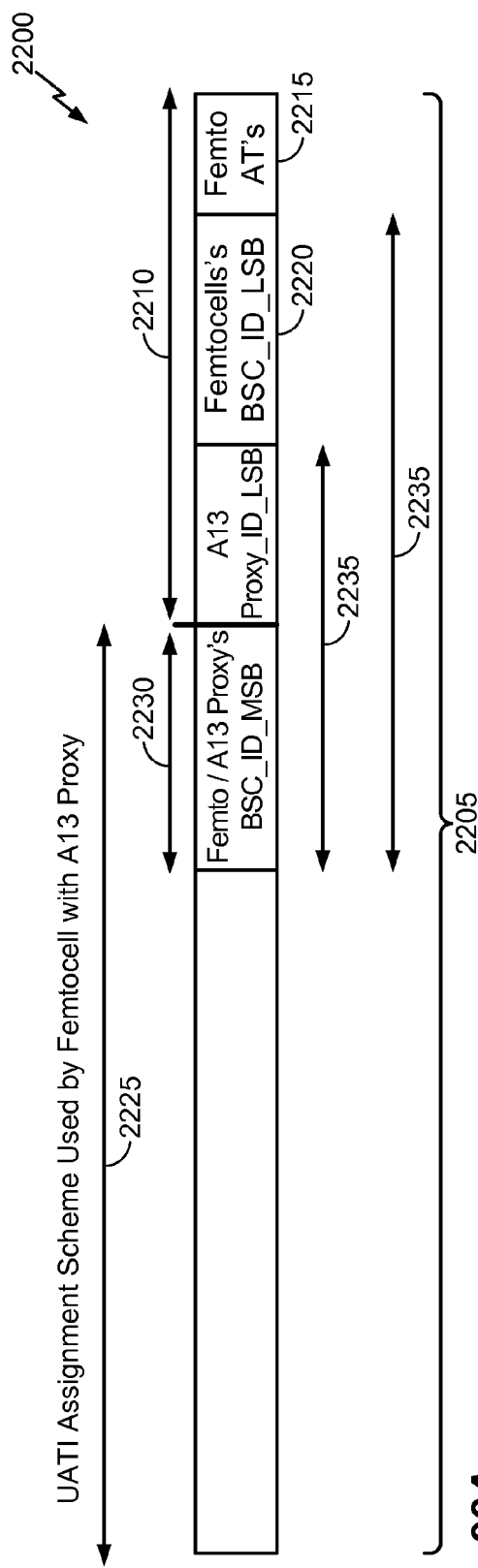
FIG. 22A illustrates an exemplary identifier assignment scheme used by a femto node in a communication system including a proxy.

FIG. 22A illustrates an exemplary identifier assignment scheme used by a femto node in a communication system including a proxy. In an embodiment, femto assignment scheme 2200 may be used by femto node 2110 when assigning a UATI 2205 to an AT such as AT 2122 (see FIG. 21). Assignment scheme 2200 may be generally similar to assignment scheme 900, shown in FIG. 9A. For example, UATI 2205 may comprise lower UATI 2210, including ATID 2215 and BSC_ID_LSB 2220. UATI 2205 may also comprise upper UATI 2225, including BSC_ID_MSB 2230. Together, BSC_ID_MSB 2230 and BSC_ID_LSB 2220 may compose one or more bits of BSC_ID 2240. In some embodiments, BSC_ID 2235 may represent the IP address of the femto node 2110. In some embodiments, the BSC_ID 2235 may map to the address of the femto cell.

In an embodiment, however, lower UATI 2210 may also include one or more LSBs of a proxy identifier (Proxy_ID_LSB) 2245. Proxy_ID_LSB 2245 may occupy one or more of the MSBs of the lower UATI. In an embodiment, BSC_ID_MSB 2230 may also be interpreted as the MSBs of the proxy identifier (Proxy_ID_MSB) 2230. In an embodiment, Proxy_ID_MSB, together with Proxy_ID_LSB, may compose one or more bits of the proxy identifier (Proxy_ID) 2235. As will be discussed below with reference to FIG. 22B, Proxy_ID 2235 may be the same size as the BSC_ID associated with the macro node 2105. In some embodiments, Proxy_ID 2240 may represent the IP address of the femto node 2110. In some embodiments, the BSC_ID 2240 may map to the address of the femto cell.

Figure 22B:
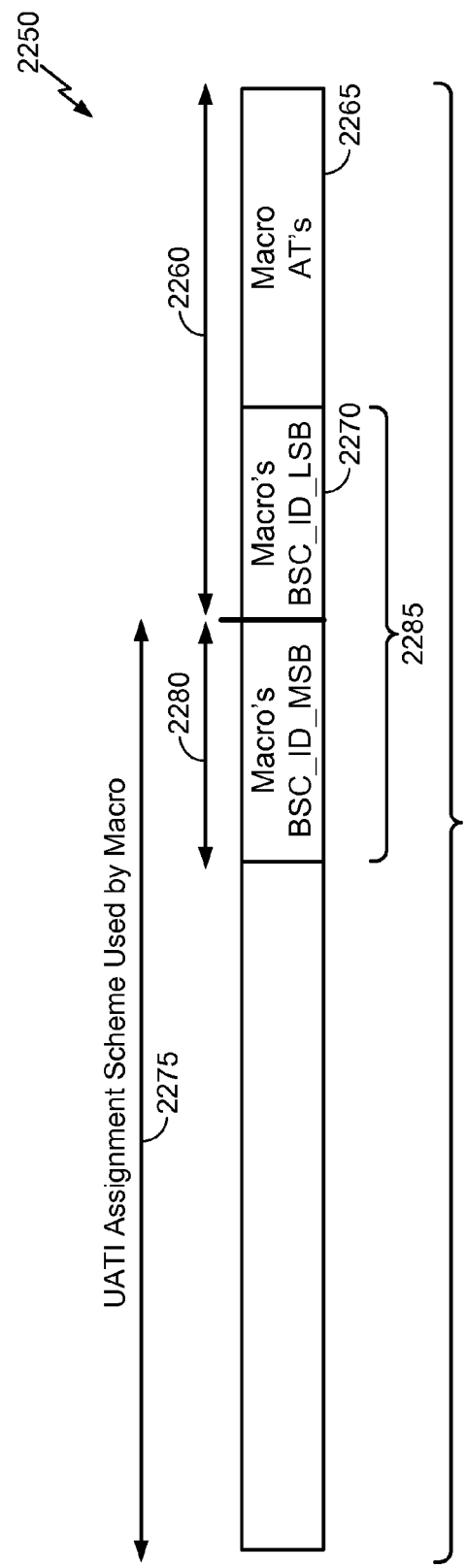
FIG. 22B illustrates an exemplary identifier assignment scheme used by a macro node in a communication system including proxy.

FIG. 22B illustrates an exemplary identifier assignment scheme used by a macro node in a communication system including a proxy. In an embodiment, macro assignment scheme 2250 may be used by macro node 2105 when assigning a UATI 2255 to an AT such as AT 2122 (see FIG. 21). In some embodiments, macro assignment scheme 2250 may comprise the assignment scheme used for UATI 510 shown in FIG. 5. For example, UATI 2255 may comprise lower UATI 2260, including ATID 2265 and BSC_ID_LSB 2270. UATI 2255 may also comprise upper UATI 2275, including BSC_ID_MSB 2280. Together, BSC_ID_MSB 2280 and BSC_ID_LSB 2270 may compose one or more bits of BSC_ID 2285. In some embodiments, BSC_ID 2285 may represent the IP address of the femto node 2110. In some embodiments, the BSC_ID 2235 may map to the address of the femto cell.

In some embodiments, the BSC_ID 2285 may be the same size as the Proxy_ID 2235. This may allow a target cell such as macro node 2105 to process a UATI using the femto UATI assignment scheme 2200 in the same manner as any other macro node. In other words, the proxy may be addressed according to existing methodologies. In embodiments where the Proxy_ID is format-compatible with the BSC_ID used in the macro UATI assignment scheme 2250, a proxy may function as a drop-in network element without modification to the macro nodes.

Figure 23:
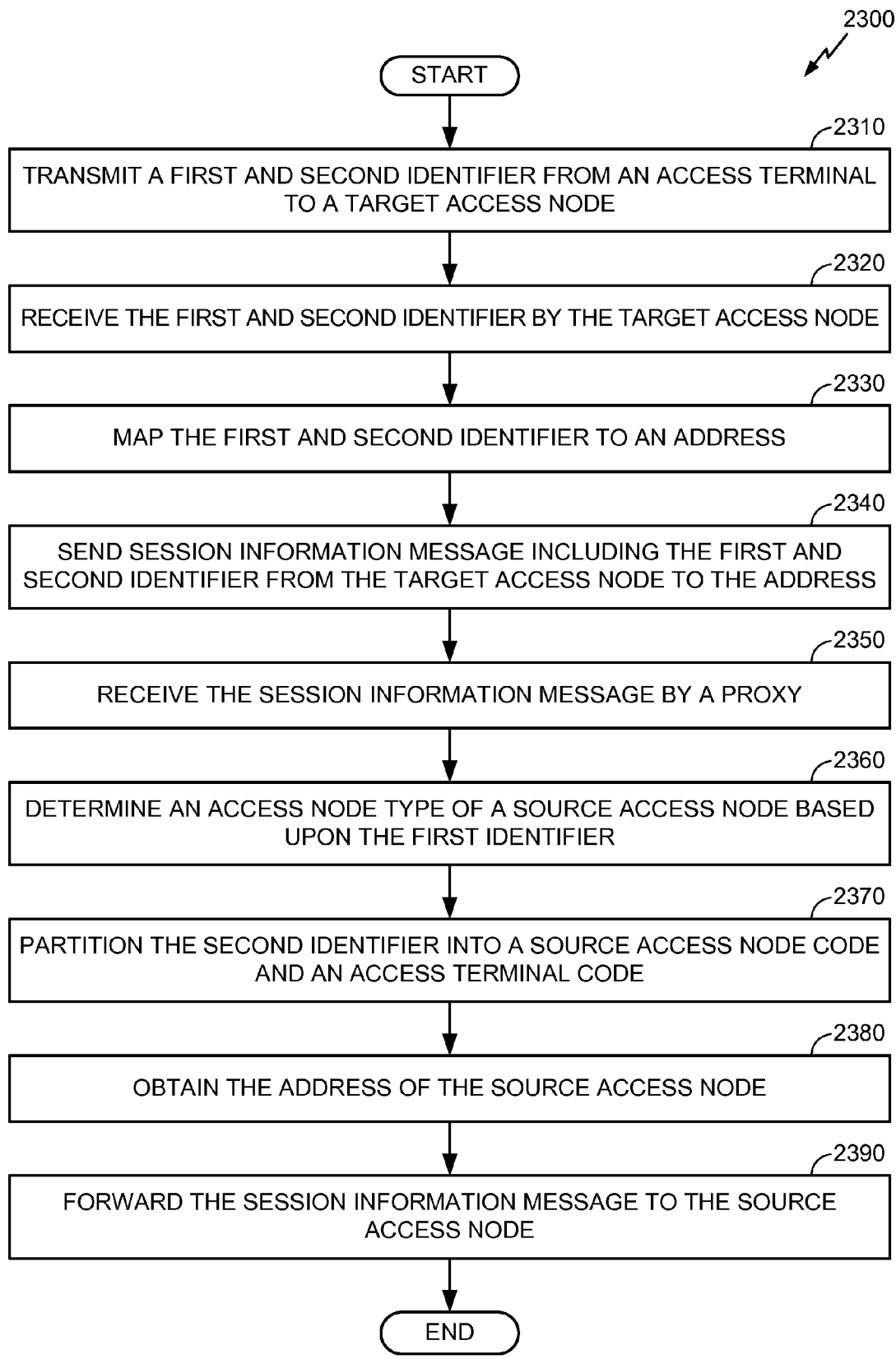
FIG. 23 is a flowchart of an exemplary process for relaying a message from a target access node to a source access node by a proxy shown in FIG. 21.

FIG. 23 is a flowchart of an exemplary process for relaying a message from a target access node to a source access node by a proxy 2170 shown in FIG. 21. As described above with respect to FIG. 21, the process 2300 may be used to facilitate communication between a target access node and a source access node.

As shown in step 2310, an access terminal transmits a first and second identifier to a target access node. In an embodiment, the access terminal may be AT 2122 and the target access node may be macro node 2105. The first identifier may comprise the color code that the AT 2122 previously received from the femto node 2110. Alternatively, the first identifier may comprise one or more bits of the upper UATI that the AT 2122 previously received from the femto node 2110. The second identifier may comprise the lower UATI that the AT 2122 previously received from the femto node 2110. In an embodiment, the femto node 2110 may have generated a UATI and assigned the UATI to the AT 2122. The AT 2122 may have resolved the color code from one or more bits of the UATI. In another embodiment, the femto node 2110 may have transmitted the both the color code and one or more bits of the UATI to the AT 2122. The AT 2122 may have stored the color code and the UATI in a memory. In an embodiment, the UATI generated by the femto node 2110 may contain the BSC_ID of the proxy 2170, instead of the BSC_ID of the femto node 2110. In another embodiment, the color code used by the femto node 2110 may be associated with the address of the proxy 2170 in the lookup tables of macro node 2105.

Continuing to step 2320, the target access node receives the first and second identifier from the AT. In some embodiments, the macro node 2105 may receive the color code and the lower UATI from the AT 2122. The macro node 2105 may store the color code and lower UATI in a memory. In one embodiment, the macro node 2105 may forward the color code and lower UATI to the FGW 2152 for processing.

Next, in step 2330, proxy 2170 maps the first and second identifiers to an address. In an embodiment, proxy 2170 may map the identifiers in a manner generally similar to that as shown in FIG. 5 and described with respect to FIG. 6. However, in some embodiments the Proxy_ID may occupy the bits normally used for the BSC_ID. For example, macro node 2105 may map the color code to an upper UATI and combine one or more bits from the upper UATI with one or more bits from the lower UATI to extract the Proxy_ID of the proxy 2170. In another embodiment, the macro node 2105 may perform a memory lookup on the color code and retrieve an associated IP address. In some embodiments, the macro node 2105 may follow the same steps and/or procedures as it would if there were no femto nodes and/or proxies in the communication network. In some embodiments, because the femto node 2110 previously supplied the AT 2122 with identifiers including the Proxy_ID in place of the BSC_ID, the target AN may retrieve the IP address of the proxy 2170 instead of the address of the femto 2110.

Proceeding to step 2340, the target node sends a session information message including the first and second identifiers to the IP address of the proxy 2170. In some embodiments, the session information message may comprise an A13 message. In some embodiments, the session information message may comprise a data session transfer request. Then, in step 2350, the proxy 2170 receives the session information message from the target node. The proxy 2170 may store the session information message in a memory.

In steps 2360-2280, the proxy 2170 determines the address of the source node. In an embodiment, the proxy 2170 determines the address of the source node in a manner generally similar to that shown in FIG. 10. For example, in step 2360, the proxy 2170 may determine an access node type of the source access node based upon the first identifier. Possible node types may include macro nodes and femto nodes. The proxy 2170 may perform a lookup on the first identifier in order to determine whether the source node is a macro or femto node. In embodiments where the first identifier comprises the color code of the source node, one or more color codes may be reserved to identify the source node as a femto node. In embodiments where the first identifier comprises one or more bits of the upper UATI, the proxy 2170 may first map the first identifier to a subnet and/or BSC_ID_MSB and then compare the result with a list of known femto nodes.

Thereafter, in step 2370, the proxy 2170 partitions the second identifier into a source access node code and an access terminal code. In an embodiment, the second identifier may be the lower UATI as shown in FIG. 22A and FIG. 22B. Thus, the source access node code may comprise the BSC_ID_LSB and the access terminal code may comprise the ATID. In an embodiment, the proxy 2170 may partition the second identifier as shown in 22A and 22B. For example, if the proxy 2170 determines the access node to be a femto node, the proxy 2170 may extract the BSC_ID_LSB and ATID in accordance with femto UATI assignment scheme 2200, shown in FIG. 22A. Alternatively, if the proxy 2170 determines the access node to be a macro node, the proxy 2170 may extract the BSC_ID_LSB and ATID in accordance with macro UATI assignment scheme 2250, shown in FIG. 22B. Thus, when the source access node is a femto node, the extracted BSC_ID_LSB may have more bits than when the source access node is a macro node. Similarly, when the source access node is a femto node, the extracted ATID may have fewer bits than when the source access node is a macro node. The proxy 2170 may store the BSC_ID_LSB and/or ATID in a memory.

Subsequently, in step 2380, the proxy 2170 obtains the address of the source access node. When the source access node is a femto node, the proxy 2170 may map the color code to an upper UATI and extract the BSC_ID_MSB as shown in FIG. 5. The proxy 2170 may concatenate the BSC_ID_MSB with the BSC_ID_LSB to form the BSC_ID. In some embodiments, the BSC_ID of the femto access node may be the IP address of the source access node. When the source access node is a macro node, the proxy 2170 may simply perform a lookup on the color code to determine the IP address of the source access node. In some embodiments, the proxy 2170 may map the color code to an upper UATI and extract the BSC_ID_MSB as shown in FIG. 5. The proxy 2170 may concatenate the BSC_ID_MSB with the BSC_ID_LSB to form the BSC_ID. In some embodiments, the BSC_ID of the macro access node may be the IP address of the source access node.

Finally, in step 2390, the proxy 2170 forwards the session information message to the source access node at the address obtained in step 2380. In some embodiments, the proxy 2170 may statelessly forward the message. The proxy 2170 may modify the message and/or relevant transmission protocol such that it appears to the source node that the forwarded message has been sent directly from the target node. For example, when forwarding a message from macro node 2105 to femto node 2110, the proxy 2170 may spoof the source address of a transmission packet by replacing the address of the proxy 2170 with the address of the target node 2105. In some embodiments, proxy 2170 may spoof the IP address of the sender of the message by modifying a source IP address field of an IP packet comprising one or more bits of the message.

Figure 24:
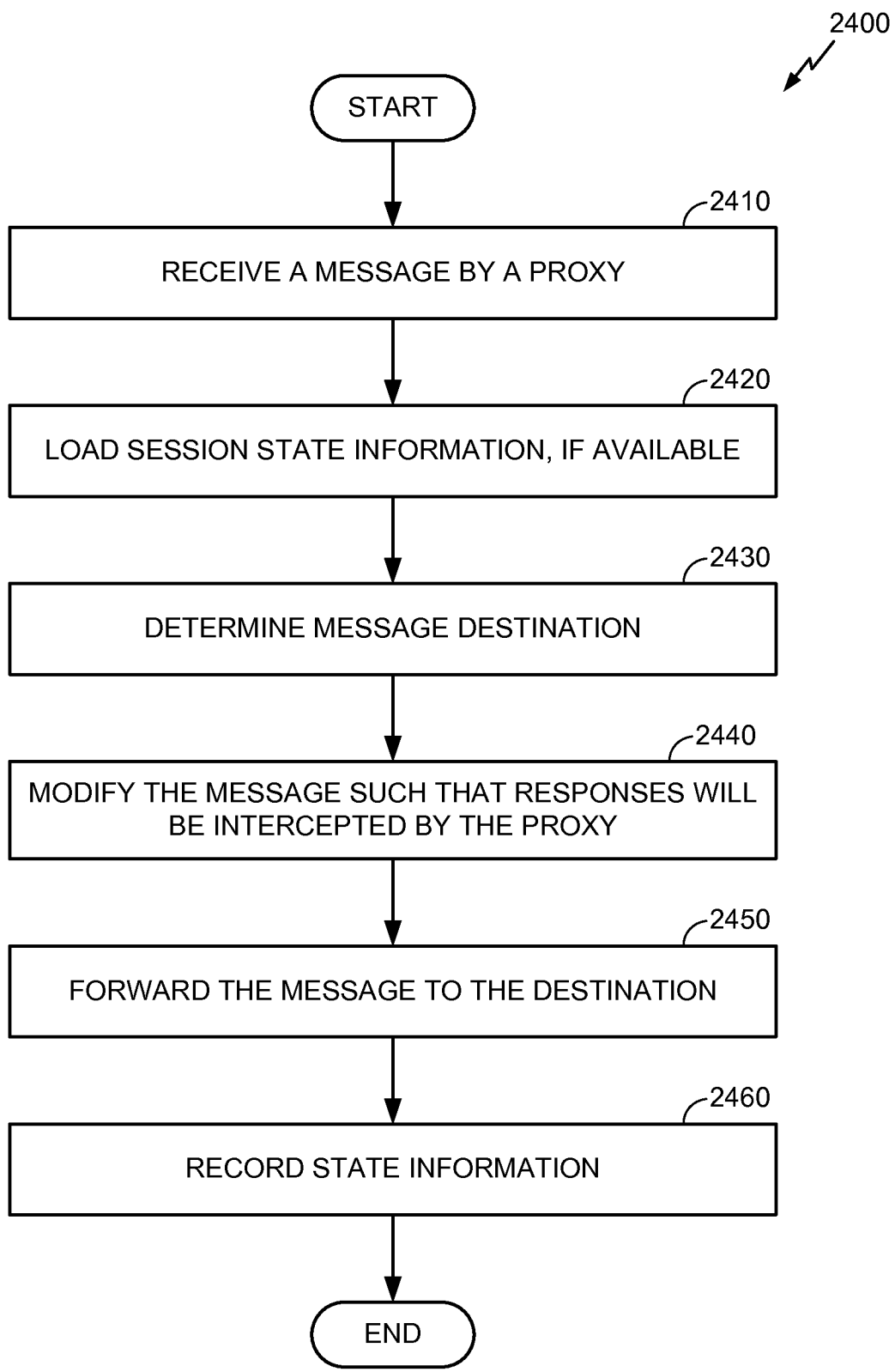
FIG. 24 is a flowchart of an exemplary process for statefully relaying a message by a proxy shown in FIG. 21.

FIG. 24 is a flowchart of an exemplary process for statefully relaying a message by a proxy 2170 shown in FIG. 21. As described above with respect to FIG. 21, the process 2400 may be used to facilitate communication between a target access node and a source access node by the proxy 2170.

As shown in exemplary step 2410, the proxy receives a message from a source communication node. In an embodiment, the proxy may be proxy 2170 and the source communication node may be macro node 2105, as shown in FIG. 21. In an alternative embodiment, the source communication node may be femto node 2110.

Continuing to step 2420, the proxy loads available session state information. In an embodiment, the proxy may determine the IP address of the message sender and retrieve related state information from a memory. State information may include the address of a target communication node with which the source communication node intends to communicate, a history of communications between the two communication nodes, and information that may help interpret the content of the message. For example, macro node 2105 may send a new data session transfer request to the proxy 2180. In this case, proxy 2170 may not retrieve any state information. In another example, femto node 2110 may send a response to a data session transfer request to the proxy 2180. In this case, proxy 2170 may retrieve a record of a data session transfer request previously forwarded from macro node 2105.

Next, in step 2430, the proxy 2170 determines the message destination. In some embodiments, the proxy 2170 may extract a destination address from the message data. For example, as described with respect to FIG. 23, proxy 2170 may receive a data session transfer request from macro node 2105. The proxy 2170 may map first and second identifiers embedded within the data session transfer request to the address of the femto node 2110. In some embodiments, the proxy 2170 may determine the destination address from state information loaded from memory in step 2420. For example, proxy 2170 may receive a response to a data session transfer request from femto node 2110. The proxy 2170 may extract the address of the femto node 2110 from a source IP address field of an IP packet and look up the address in stored transmission logs. The proxy 2170 may determine that it previously relayed the data session transfer request from macro node 2105 and may therefore determine that the proper message destination is the macro node 2105. In other embodiments, the proxy 2170 may determine the destination address from an external source, such by querying a DNS as described above with respect to FIG. 17.

Then, in step 2440, the proxy 2170 modifies the message such that responses will be intercepted by the proxy. In an embodiment, proxy 2170 replaces all occurrences of the address of the sender of the message with the address of the proxy 2170. For example, the proxy 2170 may receive a data session transfer request from macro node 2105. The proxy 2170 may replace all instances of the address of macro node 2105 with the address of proxy 2170. In another example, the proxy 2170 may receive a data session transfer response from femto node 2110. The proxy 2170 may replace all instances of the address of femto node 2110 with the address of proxy 2170.

Moving to step 2450, the proxy 2170 sends the modified message to the message destination, as determined in step 2430. For example, the proxy 2170 may transmit the modified message to the IP address of the femto node 2110. In another example, the proxy 2170 may transmit the modified message to the IP address of the macro node 2105.

Finally, in step 2450, the proxy 2170 records state information pertaining to the forwarded message. In an embodiment, the proxy 2170 may record information such as the message type, source address, destination address, actions taken, and the like. For example, after forwarding a data session transfer request from macro node 2105 to femto node 2110, proxy 2170 may record one or more of the address of the macro node 2105, the address of the femto node 2110, and the data session transfer request message type. In another example, after forwarding a response to a data session transfer request from femto node 2110 to macro node 2105, proxy 2170 may record one or more of the address of the macro node 2105, the address of the femto node 2110, and the data session transfer response message type.

Figure 25:
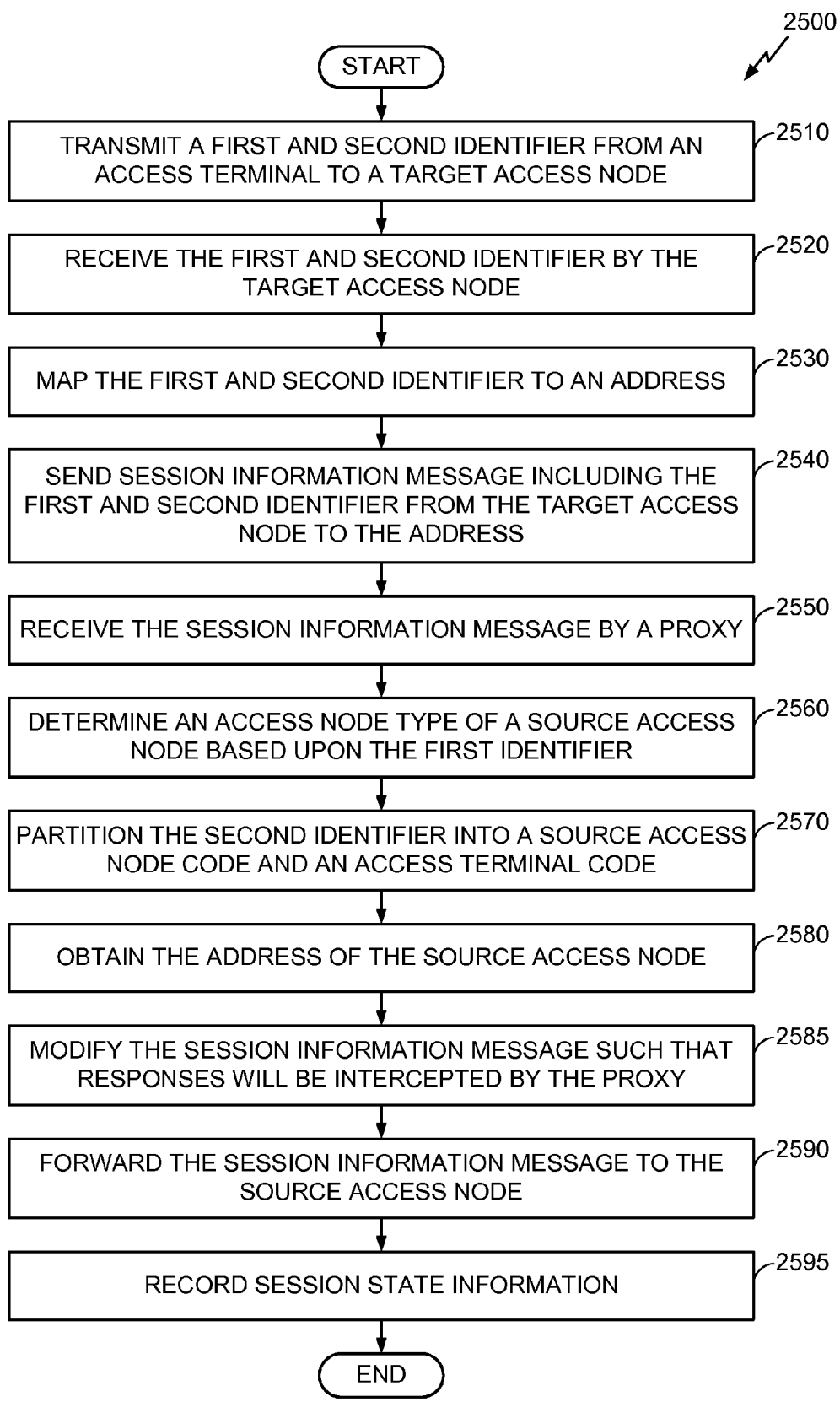
FIG. 25 is a flowchart of an exemplary process for statefully relaying a message from a target access node to a source access node by a proxy shown in FIG. 21.

FIG. 25 is a flowchart of an exemplary process for statefully relaying a message from a target access node to a source access node by proxy 2170 shown in FIG. 21. As described above with respect to FIG. 21, the process 2500 may be used to facilitate communication between a target access node and a source access node by the proxy 2170.

As shown in exemplary step 2510, an access terminal transmits a first and second identifier to a target access node. In an embodiment, the access terminal may be AT 2122 and the target access node may be macro node 2105. The first identifier may comprise the color code that the AT 2122 previously received from the femto node 2110. Alternatively, the first identifier may comprise one or more bits of the upper UATI that the AT 2122 previously received from the femto node 2110. The second identifier may comprise the lower UATI that the AT 2122 previously received from the femto node 2110. In an embodiment, the femto node 2110 may have generated a UATI and assigned the UATI to the AT 2122. The AT 2122 may have resolved the color code from one or more bits of the UATI. In another embodiment, the femto node 2110 may have transmitted the both the color code and one or more bits of the UATI to the AT 2122. The AT 2122 may have stored the color code and the UATI in a memory. In an embodiment, the UATI generated by the femto node 2110 may contain the BSC_ID of the proxy 2170, instead of the BSC_ID of the femto node 2110. In another embodiment, the color code used by the femto node 2110 may be associated with the address of the proxy 2170 in the lookup tables of macro node 2105.

Continuing to step 2520, the target access node receives the first and second identifier from the AT. In some embodiments, the macro node 2105 may receive the color code and the lower UATI from the AT 2122. The macro node 2105 may store the color code and lower UATI in a memory. In one embodiment, the macro node 2105 may forward the color code and lower UATI to the FGW 2152 for processing.

Then, in step 2530, proxy 2170 maps the first and second identifiers to an address, as shown in FIG. 5 and described with respect to FIG. 6. For example, macro node 2105 may map the color code to an upper UATI and combine one or more bits from the upper UATI with one or more bits from the lower UATI to extract the BSC_ID of the proxy 2170. In another embodiment, the macro node 2105 may perform a memory lookup on the color code and retrieve an associated IP address. In some embodiments, the macro node 2105 may follow the same steps and/or procedures as it would if there were no femto nodes and/or proxies in the communication network. In some embodiments, because the femto node 2110 previously supplied the AT 2122 with identifiers associated with the proxy 2170, the target AN will retrieve the IP address of the proxy 2170 instead of the address of the femto 2110.

Moving to step 2540, the target node sends a session information message including the first and second identifiers to the IP address of the proxy 2170. In some embodiments, the session information message may comprise an A13 message. In some embodiments, the session information message may comprise a data session transfer request. Next, in step 2550, the proxy 2170 receives the session information message from the target node. The proxy 2170 may store the session information message in a memory.

In steps 2560-2480, the proxy 2170 determines the address of the source node. In an embodiment, the proxy 2170 determines the address of the source node in a manner generally similar to that shown in FIG. 10. For example, in step 2560, the proxy 2170 may determine an access node type of the source access node based upon the first identifier. Possible node types may include macro nodes and femto nodes. The proxy 2170 may perform a lookup on the first identifier in order to determine whether the source node is a macro or femto node. In embodiments where the first identifier comprises the color code of the source node, one or more color codes may be reserved to identify the source node as a femto node. In embodiments where the first identifier comprises one or more bits of the upper UATI, the proxy 2170 may first map the first identifier to a subnet and/or BSC_ID_MSB and then compare the result with a list of known femto nodes.

Proceeding to step 2585, the proxy 2170 partitions the second identifier into a source access node code and an access terminal code. In an embodiment, the second identifier may be the lower UATI as shown in FIG. 22A and FIG. 22B. Thus, the source access node code may comprise the BSC_ID_LSB and the access terminal code may comprise the ATID. In an embodiment, the proxy 2170 may partition the second identifier as shown in 22A and 22B. For example, if the proxy 2170 determines the access node to be a femto node, the proxy 2170 may extract the BSC_ID_LSB and ATID in accordance with femto UATI assignment scheme 2200, shown in FIG. 22A. Alternatively, if the proxy 2170 determines the access node to be a macro node, the proxy 2170 may extract the BSC_ID_LSB and ATID in accordance with macro UATI assignment scheme 2250, shown in FIG. 22B. Thus, when the source access node is a femto node, the extracted BSC_ID_LSB may have more bits than when the source access node is a macro node. Similarly, when the source access node is a femto node, the extracted ATID may have fewer bits than when the source access node is a macro node. The proxy 2170 may store the BSC_ID_LSB and/or ATID in a memory.

Thereafter, in step 2580, the proxy 2170 obtains the address of the source access node. When the source access node is a femto node, the proxy 2170 may map the color code to an upper UATI and extract the BSC_ID_MSB as shown in FIG. 5. The proxy 2170 may concatenate the BSC_ID_MSB with the BSC_ID_LSB to form the BSC_ID. In some embodiments, the BSC_ID of the femto access node may be the IP address of the source access node. When the source access node is a macro node, the proxy 2170 may simply perform a lookup on the color code to determine the IP address of the source access node. In some embodiments, the proxy 2170 may map the color code to an upper UATI and extract the BSC_ID_MSB as shown in FIG. 5. The proxy 2170 may concatenate the BSC_ID_MSB with the BSC_ID_LSB to form the BSC_ID. In some embodiments, the BSC_ID of the macro access node may be the IP address of the source access node.

Subsequently, in step 2585, the proxy 2170 modifies the message such that responses will be intercepted by the proxy. In an embodiment, proxy 2170 replaces all occurrences of the address of the sender of the message with the address of the proxy 2170. For example, the proxy 2170 may receive a data session transfer request from macro node 2105. The proxy 2170 may replace all instances of the address of macro node 2105 with the address of proxy 2170.

Then, in step 2590, the proxy 2170 sends the modified message to the message destination, as determined in step 2530. For example, the proxy 2170 may transmit the modified message to the IP address of the femto node 2110.

Finally, in step 2595, the proxy 2170 records state information pertaining to the forwarded message. In an embodiment, the proxy 2170 may record information such as the message type, source address, destination address, actions taken, and the like. For example, after forwarding a data session transfer request from macro node 2105 to femto node 2110, proxy 2170 may record one or more of the address of the macro node 2105, the address of the femto node 2110, and the data session transfer request message type.

Figure 26:
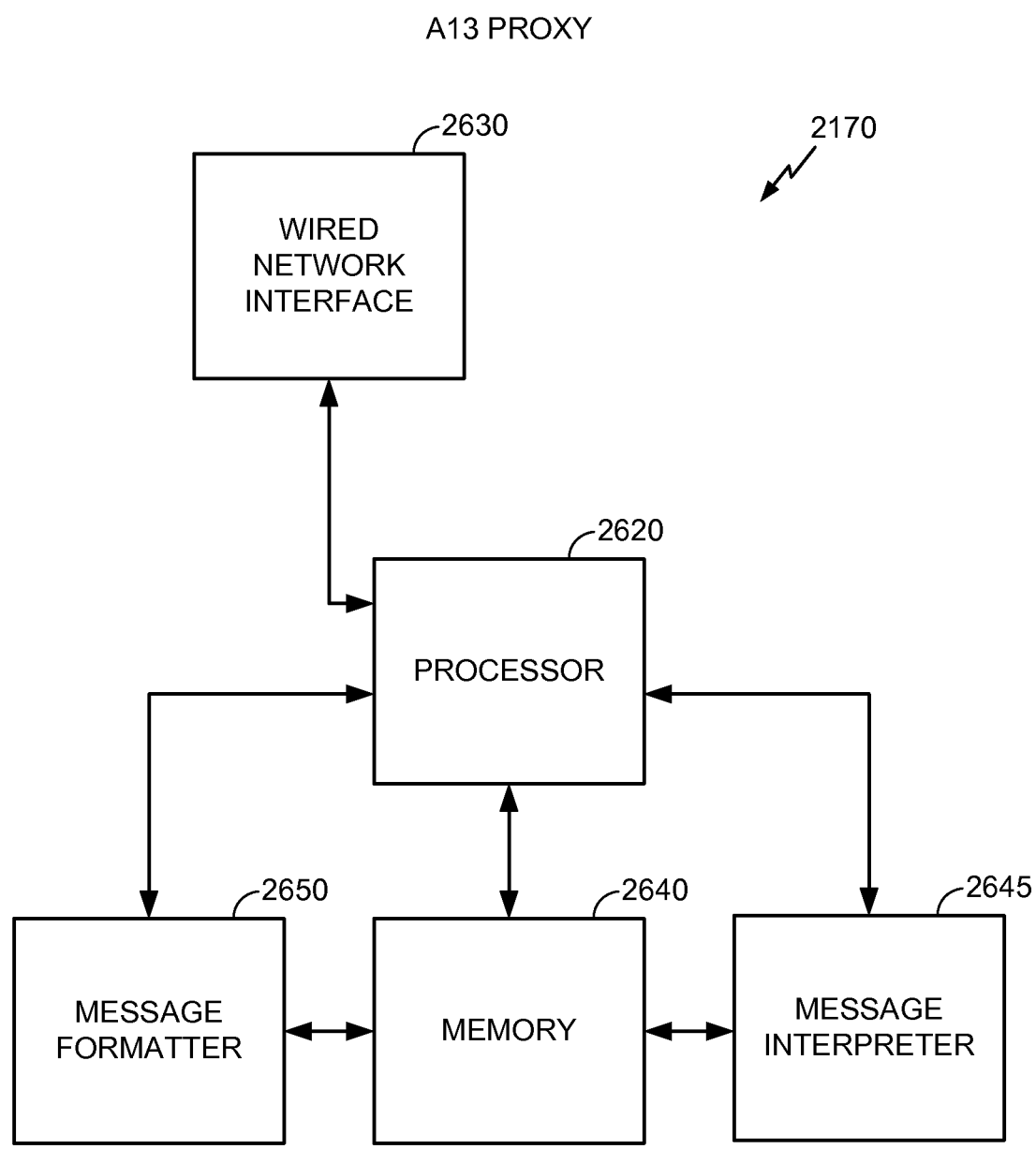
FIG. 26 is a functional block diagram of an exemplary proxy shown in FIG. 21.

FIG. 26 is a functional block diagram of an exemplary proxy 2170 shown in FIG. 21. As discussed above with respect to FIG. 21, the proxy 2170 may facilitate a hand out from the femto node 2110 to the macro node 2105 by performing address translation. The proxy 2170 may comprise a processor 2620 coupled to a wired network interface 2630. The wired network interface 2630 may be configured to receive an inbound wired message from and to transmit an outbound wired message to an address. The wired network interface 2630 may receive an inbound wired message and pass the inbound wired message to the processor 2620 for processing. The processor 2620 may process an outbound wired message and pass the outbound wired message to the wired network interface 2630 for transmission to an address. For example, during a handout procedure, the wired network interface 2630 may receive a data session transfer request from the macro node 2105 and pass the data session transfer request to the processor 2620 for processing. In another example, the wired network interface 2630 may receive a data session transfer response from the femto node 2110 and pass the data session transfer response to the processor 2620 for processing. The processor 2620 may pass formatted responses to the wired network interface 2630 for transmission to a source node and/or a target node. More specifically, in an embodiment, the processor 2620 may pass a modified or unmodified data session transfer request to the wired network interface 2630 for transmission to femto node 2110. In another embodiment, the processor 2620 may pass a modified or unmodified data session transfer response to the wired network interface 2630 for transmission to macro node 2105.

The processor 2620 may further be coupled, via one or more buses, to a memory 2640. The processor 2620 may read information from or write information to the memory 2640. The memory 2640 may be configured to store information for use in processing the inbound or outbound wired message. The memory 2640 may also be configured to store state information such as the message type, source address, destination address, actions taken, and the like. The processor 2620 may also be coupled to a message interpreter 2645. The processor may pass the inbound wired message to the message interpreter 2645 for processing. The message interpreter 2645 may be configured to extract information from the inbound wired message received at the wired network interface 2630. For example, the inbound data session transfer request received from macro node 2105 may comprise first and second identifiers, a source IP address, a destination IP address, and/or a message type. The message interpreter 2645 may extract the information from the inbound wired message provided by femto node 2110 and pass it to the processor 2620 for additional processing. The message interpreter 2645 may also be coupled directly to the memory 2640 in order to store or retrieve information for use in message interpretation.

The processor 2620 may also be coupled to a message formatter 2650. The message formatter 2650 may be configured to generate the outbound wired message. In some embodiments, the outbound wired message may comprise a modified message, as described above with respect to FIG. 21. The message formatter 2650 may be further configured to pass the generated outbound wired message to the processor 2620. The processor 2620 may pass the outbound wired message to the wired network interface 2630 for transmission. The wired network interface 2630 may transmit the outbound wired message to, for example, the femto node 2110 and/or the macro node 2105. For example, the outbound wired message may comprise a forwarded data session request or a forwarded data session response. In another example, the outbound wired message may comprise a modified data session request or a modified data session response. The message formatter 2650 may also be coupled directly to the memory 2640 in order to store or retrieve information for use in message formatting.

The wired network interface 2630 may comprise a modem. The modem may be configured to modulate/demodulate the outbound/inbound wired message going to or coming from a network address. The wired network interface 2630 may demodulate the data received according to one or more wired standards using methods known in the art. The demodulated data may be transmitted to the processor 2620. The wired network interface 2630 may modulate data to be sent from the macro node 2610 via the wired network interface 2630 according to one or more wired standards using methods known in the art. The processor 2620 may provide data to be transmitted.

The memory 2640 may comprise a processor cache, including a multi-level hierarchical cache in which different levels have different capacities and access speeds. The memory 2640 may also comprise random access memory (RAM), other volatile storage devices, or non-volatile storage devices. The storage may include hard drives, optical discs, such as compact discs (CDs) or digital video discs (DVDs), flash memory, floppy discs, magnetic tape, and Zip drives.

Although described separately, it is to be appreciated that functional blocks described with respect to the proxy 2170 need not be separate structural elements. For example, the processor 2620 and the memory 2640 may be embodied in a single chip. The processor 2620 may additionally, or in the alternative, contain memory, such as processor registers. Similarly, one or more of the functional blocks or portions of the functionality of various blocks may be embodied in a single chip. Alternatively, the functionality of a particular block may be implemented on two or more chips.

One or more of the functional blocks and/or one or more combinations of the functional blocks described with respect to the proxy 2170, such as processor 2620, message interpreter 2645, and message formatter 2650, may be embodied as a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. One or more of the functional blocks and/or one or more combinations of the functional blocks described with respect to the proxy 2170 may also be implemented as a combination of computing devices, e.g., a combination of a DSP and a microprocessor, a plurality of microprocessors, one or more microprocessors in conjunction with a DSP communication, or any other such configuration.

The functionality described herein (e.g., with regard to one or more of the accompanying figures) may correspond in some aspects to similarly designated "means for" functionality in the included claims. Referring to FIG. 27-31, apparatuses 2700, 2800, 2900, 3000, and 3100 are represented as a series of interrelated functional modules.

Figure 27:
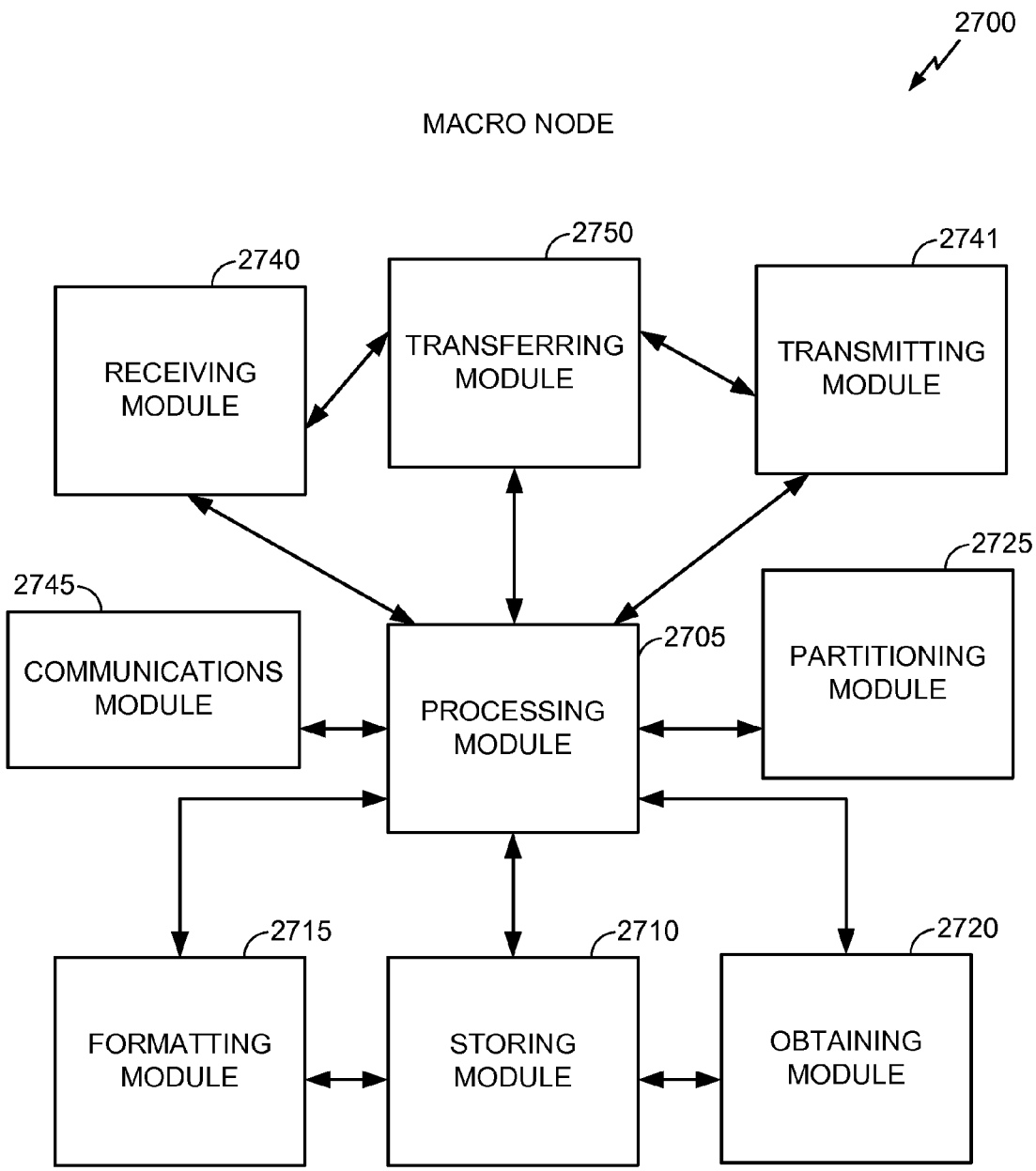
FIG. 27 is a functional block diagram of yet another exemplary macro node in FIG. 8.

FIG. 27 is a functional block diagram of yet another exemplary macro node, such as macro node 805 in FIG. 8. As shown, the 2700 may comprise a processing module 2705, a storing module 2710, a formatting module 2715, an obtaining module 2720, a partitioning module 2725, a receiving module 2740, a transmitting module 2741, a communications module 2745, and a transferring module 2750. The processing module 2705 may correspond at least in some aspects to, for example, a processor as discussed herein. The storing module 2710 may correspond at least in some aspects to, for example, a memory as discussed herein. The formatting module 2715 may correspond at least in some aspects to, for example, a message formatter as discussed herein. The obtaining module 2720 may correspond at least in some aspects to, for example, a message interpreter as discussed herein. In an aspect, the obtaining module 2720 may comprise one or more of a mapping module (not shown) and a combining module (not shown). The mapping and combining modules may correspond at least in some aspects to, for example, a processor as discussed herein. The partitioning module 2725 may correspond at least in some aspects to, for example, a message interpreter as discussed herein. In an aspect, the partitioning module 2725 may comprise an allocating module (not shown). The allocating module may correspond at least in some aspects to, for example, a processor as discussed herein. The receiving module 2740 may correspond at least in some aspects to, for example, a wired or wireless network interface as discussed herein. The transmitting module 2741 may correspond at least in some aspects to, for example, a wired or wireless network interface as discussed herein. The communications module 2745 may correspond at least in some aspects to, for example, a processor as discussed herein. The transferring module 2750 may correspond at least in some aspects to, for example, a wired or wireless network interface as discussed herein.

Figure 28:
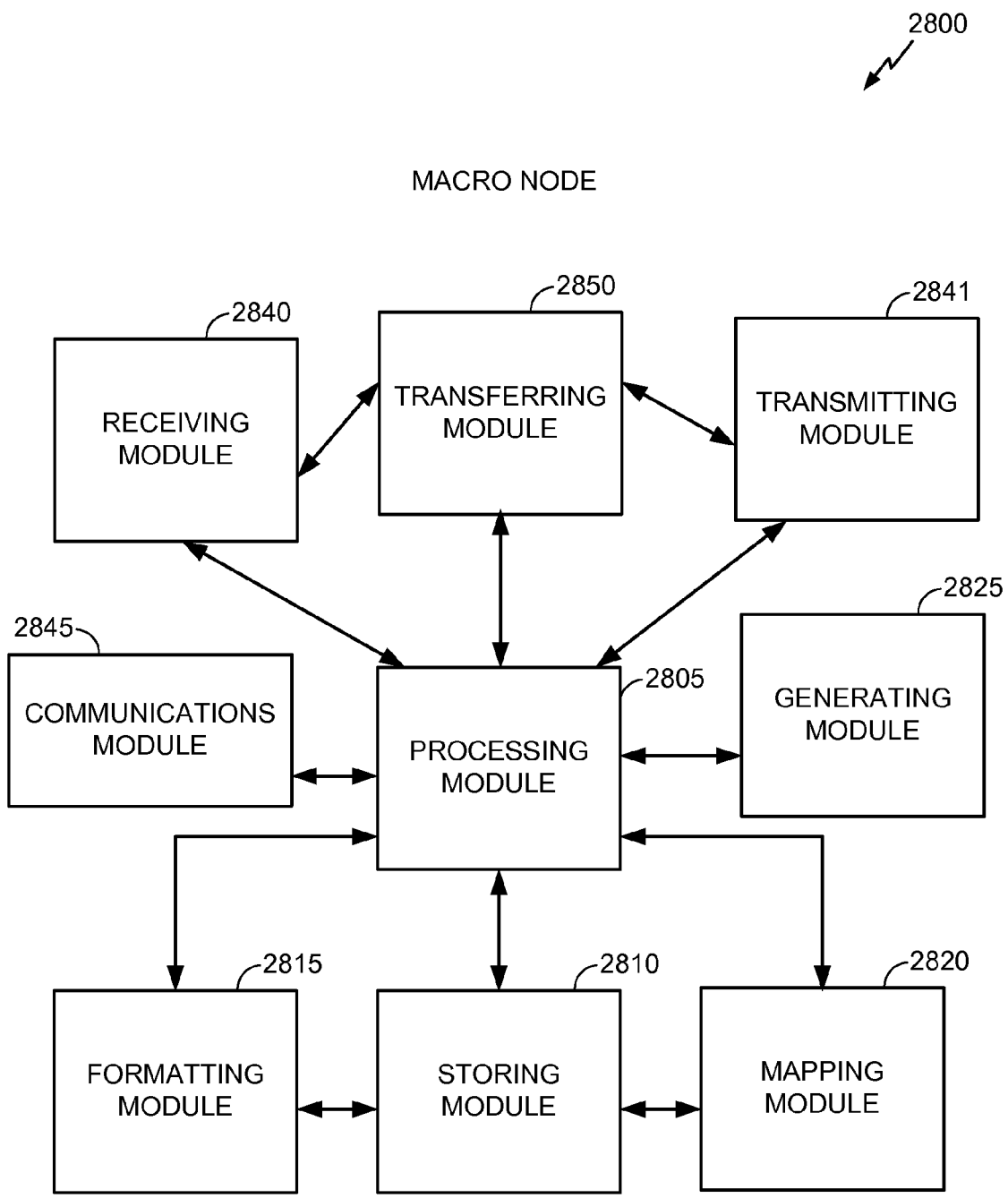
FIG. 28 is a functional block diagram of yet another exemplary macro node in FIG. 17.

FIG. 28 is a functional block diagram of yet another exemplary macro node, such as macro node 1805 in FIG. 17. As shown, the macro node 2800 may comprise a processing module 2805, a storing module 2810, a formatting module 2815, a mapping module 2820, a generating module 2825, a receiving module 2840, a transmitting module 2841, a communications module 2845, and a transferring module 2850. The processing module 2805 may correspond at least in some aspects to, for example, a processor as discussed herein. The storing module 2810 may correspond at least in some aspects to, for example, a memory as discussed herein. The formatting module 2815 may correspond at least in some aspects to, for example, a message formatter as discussed herein. The mapping module 2820 may correspond at least in some aspects to, for example, a processor as discussed herein. The generating module 2825 may correspond at least in some aspects to, for example, a processor as discussed herein. In an aspect, the generating module 2825 may comprise one or more of an obtaining module (not shown) and a creating module (not shown). The obtaining module may correspond at least in some aspects to, for example, a message interpreter as discussed herein. The creating module may correspond at least in some aspects to, for example, a message formatter as discussed herein. The receiving module 2840 may correspond at least in some aspects to, for example, a wired or wireless network interface as discussed herein. The transmitting module 2841 may correspond at least in some aspects to, for example, a wired or wireless network interface as discussed herein. The communications module 2845 may correspond at least in some aspects to, for example, a processor as discussed herein. The transferring module 2850 may correspond at least in some aspects to, for example, a wired or wireless network interface as discussed herein.

Figure 29:
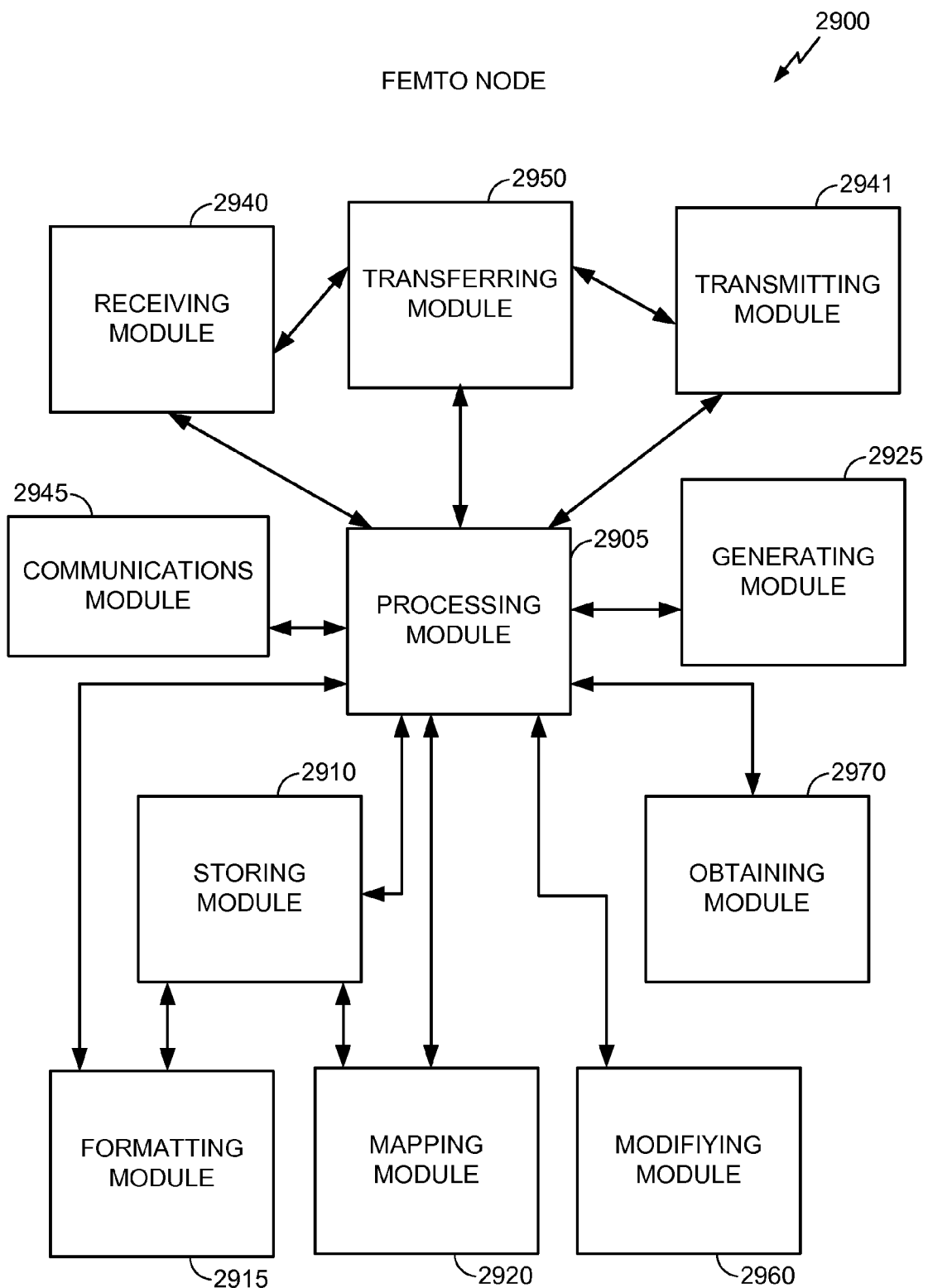
FIG. 29 is a functional block diagram of yet another exemplary femto node in FIG. 17.

FIG. 29 is a functional block diagram of yet another exemplary femto node, such as femto node 1710 in FIG. 17. As shown, the femto node 2900 may comprise a processing module 2905, a storing module 2910, a formatting module 2915, a mapping module 2920, a generating module 2925, a receiving module 2940, a transmitting module 2941, a communications module 2945, a transferring module 2950, an assigning module 2960, and an obtaining module 2970. The processing module 2905 may correspond at least in some aspects to, for example, a processor as discussed herein. The storing module 2910 may correspond at least in some aspects to, for example, a memory as discussed herein. The formatting module 2915 may correspond at least in some aspects to, for example, a message formatter as discussed herein. The mapping module 2920 may correspond at least in some aspects to, for example, a processor as discussed herein. The generating module 2925 may correspond at least in some aspects to, for example, a processor as discussed herein. In an aspect, the generating module 2925 may comprise one or more of an obtaining module (not shown) and a creating module (not shown). The obtaining module may correspond at least in some aspects to, for example, a message interpreter as discussed herein. The creating module may correspond at least in some aspects to, for example, a message formatter as discussed herein. The receiving module 2940 may correspond at least in some aspects to, for example, a wired or wireless network interface as discussed herein. The transmitting module 2941 may correspond at least in some aspects to, for example, a wired or wireless network interface as discussed herein. The communications module 2945 may correspond at least in some aspects to, for example, a processor as discussed herein. The transferring module 2950 may correspond at least in some aspects to, for example, a wired or wireless network interface as discussed herein. The assigning module 2960 may correspond at least in some aspects to, for example, a message formatter as discussed herein. The obtaining module 2970 may correspond at least in some aspects to, for example, a message interpreter as discussed herein.

Figure 30:
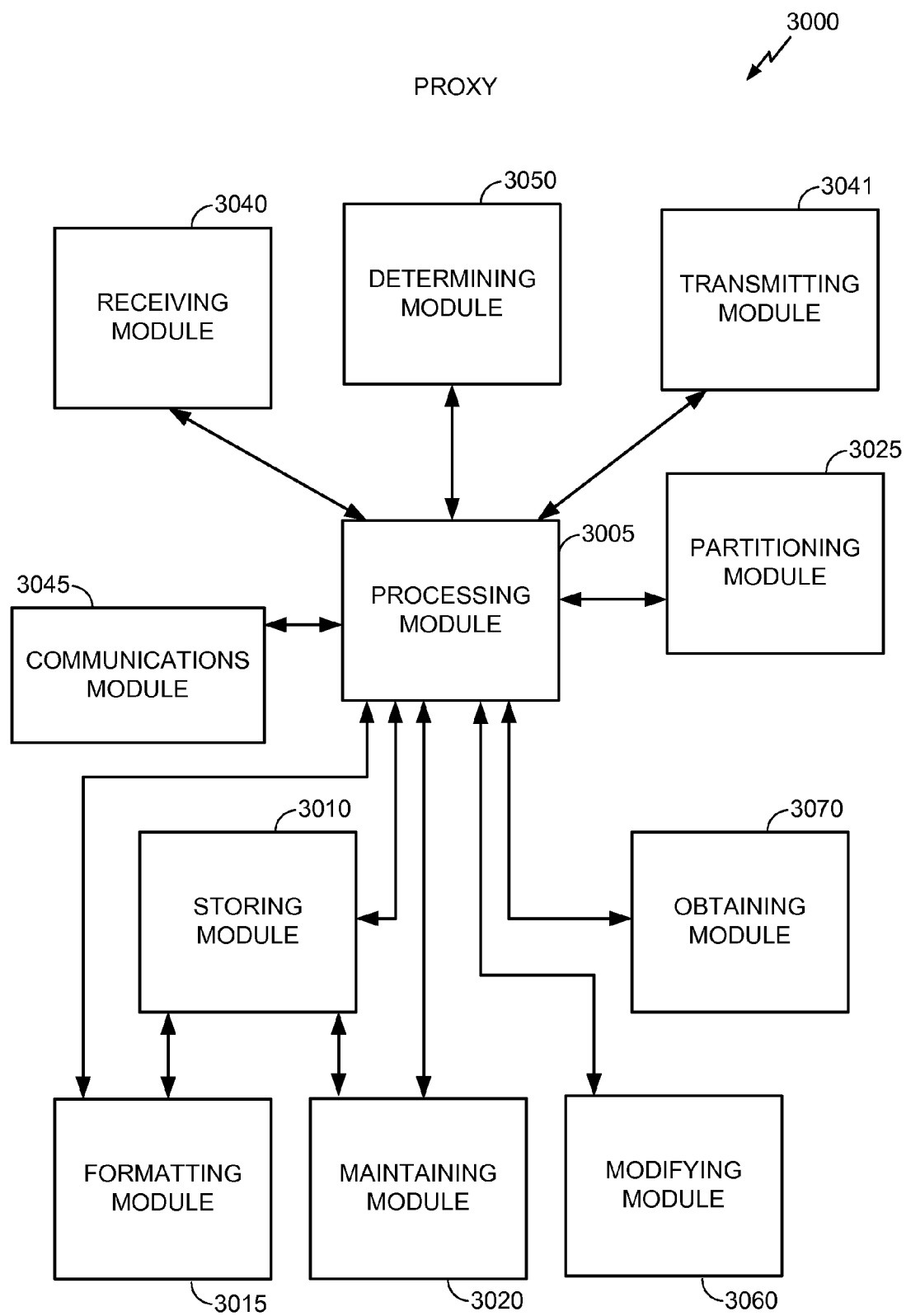
FIG. 30 is a functional block diagram of yet another exemplary proxy in FIG. 21.

FIG. 30 is a functional block diagram of yet another exemplary proxy, such as proxy 2170 in FIG. 21. As shown, the proxy 3000 may comprise a processing module 3005, a storing module 3010, a formatting module 3015, a maintaining module 3020, a partitioning module 3025, a receiving module 3040, a transmitting module 3041, a communications module 3045, a determining module 3050, a modifying module 3060, and an obtaining module 3070. The processing module 3005 may correspond at least in some aspects to, for example, a processor as discussed herein. The storing module 3010 may correspond at least in some aspects to, for example, a memory as discussed herein. The formatting module 3015 may correspond at least in some aspects to, for example, a message formatter as discussed herein. The maintaining module 3020 may correspond at least in some aspects to, for example, a processor as discussed herein. The partitioning module 3025 may correspond at least in some aspects to, for example, a processor as discussed herein. In an aspect, the partitioning module 3025 may comprise an allocating module (not shown). The allocating module may correspond at least in some aspects to, for example, a processor as discussed herein. The receiving module 3040 may correspond at least in some aspects to, for example, a wired or wireless network interface as discussed herein. The transmitting module 3041 may correspond at least in some aspects to, for example, a wired or wireless network interface as discussed herein. In an aspect, the transmitting module 3041 may comprise a spoofing module (not shown). The spoofing module may correspond at least in some aspects, for example, to a processor as discussed herein. The communications module 3045 may correspond at least in some aspects to, for example, a processor as discussed herein. The determining module 3050 may correspond at least in some aspects to, for example, a processor as discussed herein. The modifying module 3060 may correspond at least in some aspects to, for example, a message formatter as discussed herein. The obtaining module 3070 may correspond at least in some aspects to, for example, a message interpreter as discussed herein. In an aspect, the obtaining module 3070 may comprise one or more of a mapping module (not shown) and a combining module (not shown). The mapping module may correspond at least in some aspects to, for example, a processor as discussed herein. The combining module may correspond at least in some aspects to, for example, a processor as discussed herein.

Figure 31:
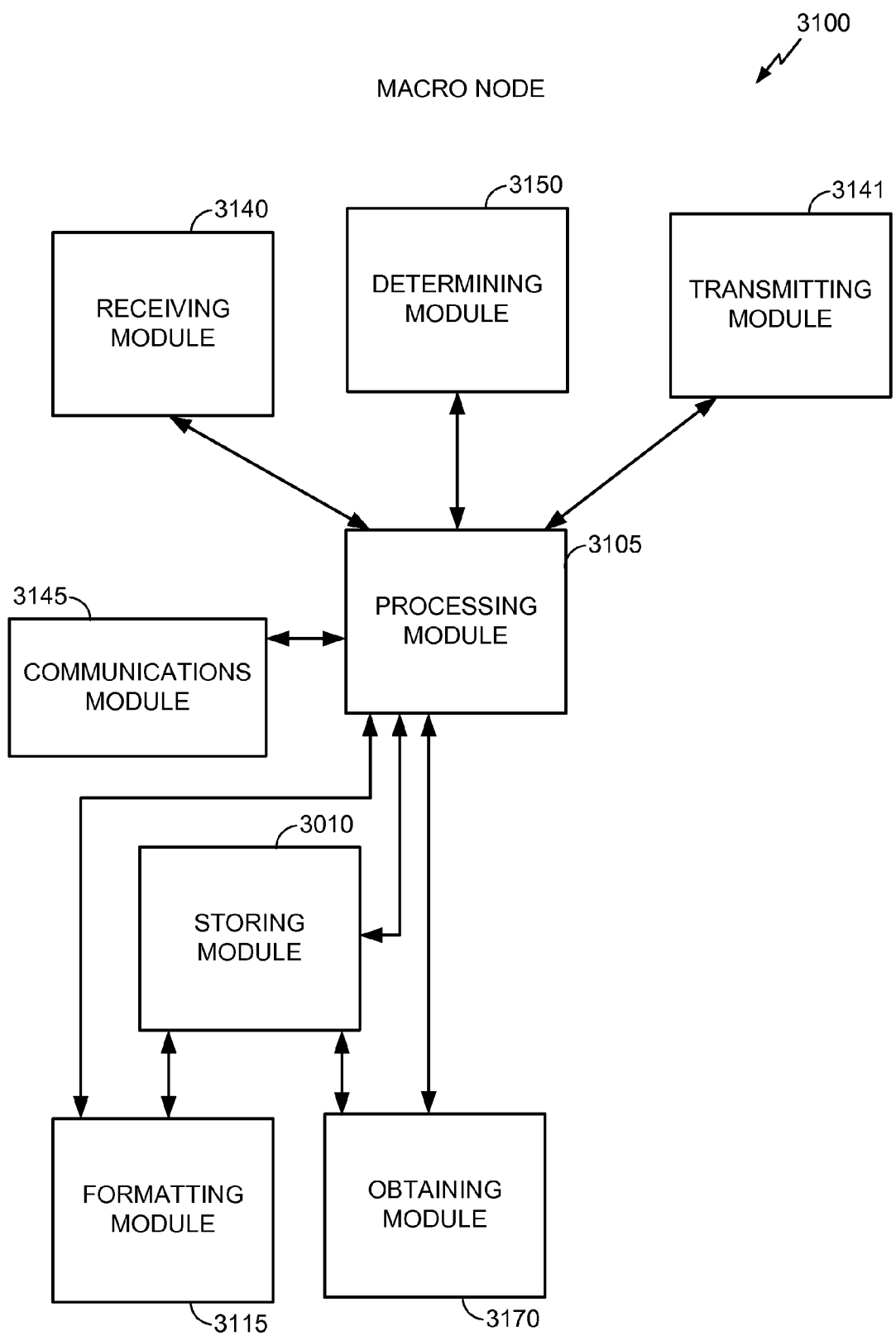
FIG. 31 is a functional block diagram of yet another exemplary macro node in FIG. 21.

FIG. 31 is a functional block diagram of yet another exemplary macro node, such as macro node 2110 in FIG. 21. As shown, the macro node 3100 may comprise a processing module 3105, a storing module 3110, a formatting module 3115, a receiving module 3140, a transmitting module 3141, a communications module 3145, a determining module 3150, and an obtaining module 3170. The processing module 3105 may correspond at least in some aspects to, for example, a processor as discussed herein. The storing module 3110 may correspond at least in some aspects to, for example, a memory as discussed herein. The formatting module 3115 may correspond at least in some aspects to, for example, a message formatter as discussed herein. The receiving module 3140 may correspond at least in some aspects to, for example, a wired or wireless network interface as discussed herein. The transmitting module 3141 may correspond at least in some aspects to, for example, a wired or wireless network interface as discussed herein. The communications module 3145 may correspond at least in some aspects to, for example, a processor as discussed herein. The determining module 3150 may correspond at least in some aspects to, for example, a processor as discussed herein. The obtaining module 3170 may correspond at least in some aspects to, for example, a message interpreter as discussed herein.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The embodiments presented herein and other embodiments are further described in greater detail in Provisional Application No. 61/152,589 entitled "High Rate Packet Data (HRPD) Idle State Handout From Femto to Macro Access Network" filed Feb. 13, 2009, expressly incorporated by reference herein. While the specification describes particular examples of the present invention, those of ordinary skill can devise variations of the present invention without departing from the inventive concept. For example, the teachings herein may refer to packet-switched domain network elements but are equally applicable to circuit-switched network elements.

Those skilled in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those skilled in the art will further appreciate that the various illustrative logical blocks, modules, circuits, methods and algorithms described in connection with the examples disclosed herein may be implemented as electronic hardware, computer software, or combinations of both. To clearly illustrate this interchangeability of hardware and software, various illustrative components, blocks, modules, circuits, methods and algorithms have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. by way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed examples is provided to enable any person skilled in the art to make or use the present invention. Various modifications to these examples will be readily apparent to those skilled in the art, and the generic principles defined herein may be applied to other examples without departing from the spirit or scope of the invention. Thus, the present invention is not intended to be limited to the examples shown herein but is to be accorded the widest scope consistent with the principles and novel features disclosed herein.

What is claimed is:

1. A method of relaying session information comprising:
   receiving session information;
   obtaining an address of a source based upon the session information and a type of a source access node; and
   transmitting the session information to the obtained address.

2. The method of claim 1, wherein session information comprises a first and second identifier, and wherein obtaining the address of the source comprises:
   determining an access node type of a source access node based upon the first identifier;
   partitioning the second identifier into a source access node code and an access terminal code, a partition location being determined based upon the access node type of the source access node;
   obtaining an address of the source access node based, at least in part, upon the source access node code and the first identifier.

3. The method of claim 2, wherein the first identifier comprises a color code.

4. The method of claim 3, wherein the color code is 8 bits long.

5. The method of claim 3, wherein obtaining the address of the source access node comprises:
   mapping the color code to one or more bits of an upper unicast access terminal identifier; and
   combining one or more of least significant bits of the upper unicast access terminal identifier with the source access node code.

6. The method of claim 2, wherein the first identifier comprises one or more bits from an upper unicast access terminal identifier.

7. The method of claim 6, wherein the first identifier comprises a portion of most significant bits from a combined unicast access terminal identifier.

8. The method of claim 2, wherein the second identifier comprises one or more bits from a lower unicast access terminal identifier.

9. The method of claim 8, wherein the second identifier comprises a portion of least significant bits from a combined unicast access terminal identifier.

10. The method of claim 2, wherein the access node type of the source access node comprises a femto access node.

11. The method of claim 10, wherein the access node type of a target access node comprises a macro access node.

12. The method of claim 2, wherein partitioning allocates more bits of the second identifier to the source access node code and fewer bits to the access terminal code when the access node type of the source access node is a femto access node compared to when the access node type of the source access node is a macro access node.

13. The method of claim 2, wherein transmitting the session information to the source access node comprises:
   spoofing a source address of the session information such that it appears to originate from a target access node.

14. The method of claim 2, further comprising:
   modifying the session information such that any subsequent response will be intercepted;
   receiving a response to the session information from the source access node;
   maintaining state information derived from the session information and/or the response;
   modifying the response to the session information such that any subsequent response will be intercepted; and
   transmitting the response to the session information to a target access node.

15. An apparatus capable of relaying session information comprising:
   a processor configured to:
   receive session information;
   obtain an address of a source based upon the session information and a type of a source access node; and
   transmit the session information to the obtained address.

16. The apparatus of claim 15, wherein session information comprises a first and second identifier, and wherein the processor is further configured to:
   determine an access node type of a source access node based upon the first identifier;
   partition the second identifier into a source access node code and an access terminal code, a partition location being determined based upon the access node type of the source access node;
   obtain an address of the source access node based, at least in part, upon the source access node code and the first identifier; and
   transmit the session information to the source access node.

17. The apparatus of claim 16, wherein the first identifier comprises a color code.

18. The apparatus of claim 17, wherein the color code is 8 bits long.

19. The apparatus of claim 17, wherein the processor is further configured to:
   map the color code to one or more bits of an upper unicast access terminal identifier; and
   combine one or more of least significant bits of the upper unicast access terminal identifier with the source access node code.

20. The apparatus of claim 16, wherein the first identifier comprises one or more bits from an upper unicast access terminal identifier.

21. The apparatus of claim 20, wherein the first identifier comprises a portion of most significant bits from a combined unicast access terminal identifier.

22. The apparatus of claim 16, wherein the second identifier comprises one or more bits from a lower unicast access terminal identifier.

23. The apparatus of claim 22, wherein the second identifier comprises a portion of least significant bits from a combined unicast access terminal identifier.

24. The apparatus of claim 16, wherein the access node type of the source access node comprises a femto access node.

25. The apparatus of claim 24, wherein the access node type of a target access node comprises a macro access node.

26. The apparatus of claim 16, wherein the processor is further configured to allocate more bits of the second identifier to the source access node code and fewer bits to the access terminal code when the access node type of the source access node is a femto access node compared to when the access node type of the source access node is a macro access node.

27. The apparatus of claim 16, wherein the processor is further configured to:
  spoof a source address of the session information such that it appears to originate from a target access node.

28. The apparatus of claim 16, wherein the processor is further configured to:
  modify the session information such that any subsequent response will be intercepted;
  receive a response to the session information from the source access node;
  maintain state information derived from the session information and/or the response;
  modify the response to the session information such that any subsequent response will be intercepted; and
  transmit the response to the session information to a target access node.

29. An apparatus capable of relaying a data session transfer request comprising:
  means for receiving session information;
  means for obtaining an address of a source based upon the session information and a type of a source access node; and
  means for transmitting the session information to the obtained address.

30. The apparatus of claim 29, wherein session information comprises a first and second identifier, and wherein the means for obtaining the address of the source comprises:
  means for determining an access node type of a source access node based upon the first identifier;
  means for partitioning the second identifier into a source access node code and an access terminal code, a partition location being determined based upon the access node type of the source access node;
  means for obtaining an address of the source access node based, at least in part, upon the source access node code and the first identifier; and
  means for transmitting the session information to the source access node.

31. The apparatus of claim 30, wherein the first identifier comprises a color code.

32. The apparatus of claim 31, wherein the color code is 8 bits long.

33. The apparatus of claim 31, wherein the means for obtaining the address of the source access node comprises:
  means for mapping the color code to one or more bits of an upper unicast access terminal identifier; and
  means for combining one or more of least significant bits of the upper unicast access terminal identifier with the source access node code.

34. The apparatus of claim 30, wherein the first identifier comprises one or more bits from an upper unicast access terminal identifier.

35. The apparatus of claim 34, wherein the first identifier comprises a portion of most significant bits from a combined unicast access terminal identifier.

36. The apparatus of claim 30, wherein the second identifier comprises one or more bits from a lower unicast access terminal identifier.

37. The apparatus of claim 36, wherein the second identifier comprises a portion of least significant bits from a combined unicast access terminal identifier.

38. The apparatus of claim 30, wherein the access node type of the source access node comprises a femto access node.

39. The apparatus of claim 38, wherein the access node type of a target access node comprises a macro access node.

40. The apparatus of claim 30, wherein the means for partitioning the second identifier comprises:
  means for allocating more bits of the second identifier to the source access node code and fewer bits to the access terminal code when the access node type of the source access node is a femto access node compared to when the access node type of the source access node is a macro access node.

41. The apparatus of claim 30, wherein the means for transmitting the session information to the source access node comprises:
  means for spoofing a source address of the session information such that it appears to originate from a target access node.

42. The apparatus of claim 30, further comprising:
  means for modifying the session information such that any subsequent response will be intercepted;
  means for receiving a response to the session information from the source access node;
  means for maintaining state information derived from the session information and/or the response;
  means for modifying the response to the session information such that any subsequent response will be intercepted; and
  means for transmitting the response to the session information to a target access node.

43. A computer program product comprising:
  a non-transitory computer readable medium comprising:
  code capable of causing at least one computer to receive session information;
  code capable of causing the at least one computer to obtain an address of a source based upon the session information and a type of a source access node; and
  code capable of causing the at least one computer to transmit the session information to the obtained address.

44. The computer program product of claim 43, wherein session information comprises a first and second identifier, and wherein code capable of causing the at least one computer to obtain an address of a source further comprises:
  code capable of causing the at least one computer to receive a session transfer request including a first and second identifier from a target access node;
  code capable of causing the at least one computer to determine an access node type of a source access node based upon the first identifier;
  code capable of causing the at least one computer to partition the second identifier into a source access node code and an access terminal code, a partition location being determined based upon the access node type of the source access node;

code capable of causing the at least one computer to obtain an address of the source access node based, at least in part, upon the source access node code and the first identifier; and code capable of causing the at least one computer to transmit the data session transfer request to the source access node.

45. The computer program product of claim 44, wherein the first identifier comprises a color code.

46. The computer program product of claim 45, wherein the color code is 8 bits long.

47. The computer program product of claim 45, wherein code capable of causing the at least one computer to obtain the address of the source access node comprises:

code capable of causing the at least one computer to map the color code to one or more bits of an upper unicast access terminal identifier; and code capable of causing the at least one computer to combine one or more of least significant bits of the upper unicast access terminal identifier with the source access node code.

48. The computer program product of claim 44, wherein the first identifier comprises one or more bits from an upper unicast access terminal identifier.

49. The computer program product of claim 48, wherein the first identifier comprises a portion of most significant bits from a combined unicast access terminal identifier.

50. The computer program product of claim 44, wherein the second identifier comprises one or more bits from a lower unicast access terminal identifier.

51. The computer program product of claim 50, wherein the second identifier comprises a portion of least significant bits from a combined unicast access terminal identifier.

52. The computer program product of claim 44, wherein the access node type of the source access node comprises a femto access node.

53. The computer program product of claim 52, wherein the access node type of a target access node comprises a macro access node.

54. The computer program product of claim 44, wherein code capable of causing the at least one computer to partition the second identifier comprises:

code capable of causing the at least one computer to allocate more bits of the second identifier to the source access node code and fewer bits to the access terminal code when the access node type of the source access node is a femto access node compared to when the access node type of the source access node is a macro access node.

55. The computer program product of claim 44, wherein code capable of causing the at least one computer to transmit the session information to the source access node comprises:

code capable of causing the at least one computer to spoof a source address of the session information such that it appears to originate from a target access node.

56. The computer program product of claim 44, wherein the non-transitory computer readable medium further comprises:

code capable of causing the at least one computer to modify the session information such that any subsequent response will be intercepted;

code capable of causing the at least one computer to receive a response to the session information from the source access node;

code capable of causing the at least one computer to maintain state information derived from the session information and/or the response;

code capable of causing the at least one computer to modify the response to the session information such that any subsequent response will be intercepted; and code capable of causing the at least one computer to transmit the response to the session information to a target access node.

* * * * *